(12) United States Patent
Chen et al.

(10) Patent No.: US 11,342,255 B2
(45) Date of Patent: May 24, 2022

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Shuo-Mao Chen, New Taipei (TW); Feng-Cheng Hsu, New Taipei (TW); Shin-Puu Jeng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 42 days.

(21) Appl. No.: 16/742,424

(22) Filed: Jan. 14, 2020

(65) Prior Publication Data
US 2020/0152563 A1 May 14, 2020

Related U.S. Application Data

(62) Division of application No. 15/851,174, filed on Dec. 21, 2017, now Pat. No. 10,535,597.
(Continued)

(51) Int. Cl.
*H01L 23/498* (2006.01)
*H01L 25/18* (2006.01)
(Continued)

(52) U.S. Cl.
CPC .... *H01L 23/49827* (2013.01); *H01L 21/4803* (2013.01); *H01L 21/486* (2013.01);
(Continued)

(58) Field of Classification Search
None
See application file for complete search history.

(56) References Cited

U.S. PATENT DOCUMENTS

| 9,478,504 | B1 | 10/2016 | Shen et al. | |
| 2017/0018510 | A1* | 1/2017 | Shen | H01L 21/561 |
| 2018/0174974 | A1* | 6/2018 | Kim | H01L 24/08 |

FOREIGN PATENT DOCUMENTS

| CN | 102110642 | 6/2011 |
| CN | 103515305 A | 1/2014 |

(Continued)

OTHER PUBLICATIONS

Office action and search report issued from CNIPA of China for corresponding application 201810031872.2 dated Sep. 2, 2020.
(Continued)

*Primary Examiner* — Long Pham
(74) *Attorney, Agent, or Firm* — WPAT, P.C., Intellectual Property Attorneys; Anthony King

(57) ABSTRACT

A semiconductor package device includes an interposer die having a semiconductor substrate and a plurality of through-silicon-vias (TSVs) extending through the semiconductor substrate. The semiconductor package device also includes a first semiconductor die spaced apart from the interposer die, a first redistribution layer disposed on a first side of the interposer die and electrically coupling the interposer die with the first semiconductor die, and a second redistribution layer on a second side of the interposer die opposite the first side. Each of the plurality of TSVs includes a sidewall tapering from a first end near the second redistribution layer to a second end near the first redistribution layer.

20 Claims, 55 Drawing Sheets

Related U.S. Application Data

(60) Provisional application No. 62/445,935, filed on Jan. 13, 2017.

(51) Int. Cl.
  *H01L 21/48* (2006.01)
  *H01L 21/56* (2006.01)
  *H01L 21/683* (2006.01)
  *H01L 23/31* (2006.01)
  *H01L 23/14* (2006.01)
  *H01L 23/538* (2006.01)

(52) U.S. Cl.
  CPC .......... *H01L 21/4853* (2013.01); *H01L 21/56* (2013.01); *H01L 21/561* (2013.01); *H01L 21/6835* (2013.01); *H01L 21/6836* (2013.01); *H01L 23/49811* (2013.01); *H01L 23/49894* (2013.01); *H01L 25/18* (2013.01); *H01L 21/4857* (2013.01); *H01L 23/147* (2013.01); *H01L 23/3128* (2013.01); *H01L 23/49816* (2013.01); *H01L 23/49822* (2013.01); *H01L 23/49833* (2013.01); *H01L 23/5385* (2013.01); *H01L 23/5389* (2013.01); *H01L 2221/68331* (2013.01); *H01L 2221/68345* (2013.01); *H01L 2221/68359* (2013.01); *H01L 2221/68381* (2013.01); *H01L 2224/73204* (2013.01)

(56) References Cited

FOREIGN PATENT DOCUMENTS

| CN | 104037153 | 9/2014 |
| CN | 106997869 | 8/2017 |

OTHER PUBLICATIONS

Office action and search report issued from CNIPA of China for corresponding application 201810031872.2 dated Feb. 10, 2021.

\* cited by examiner

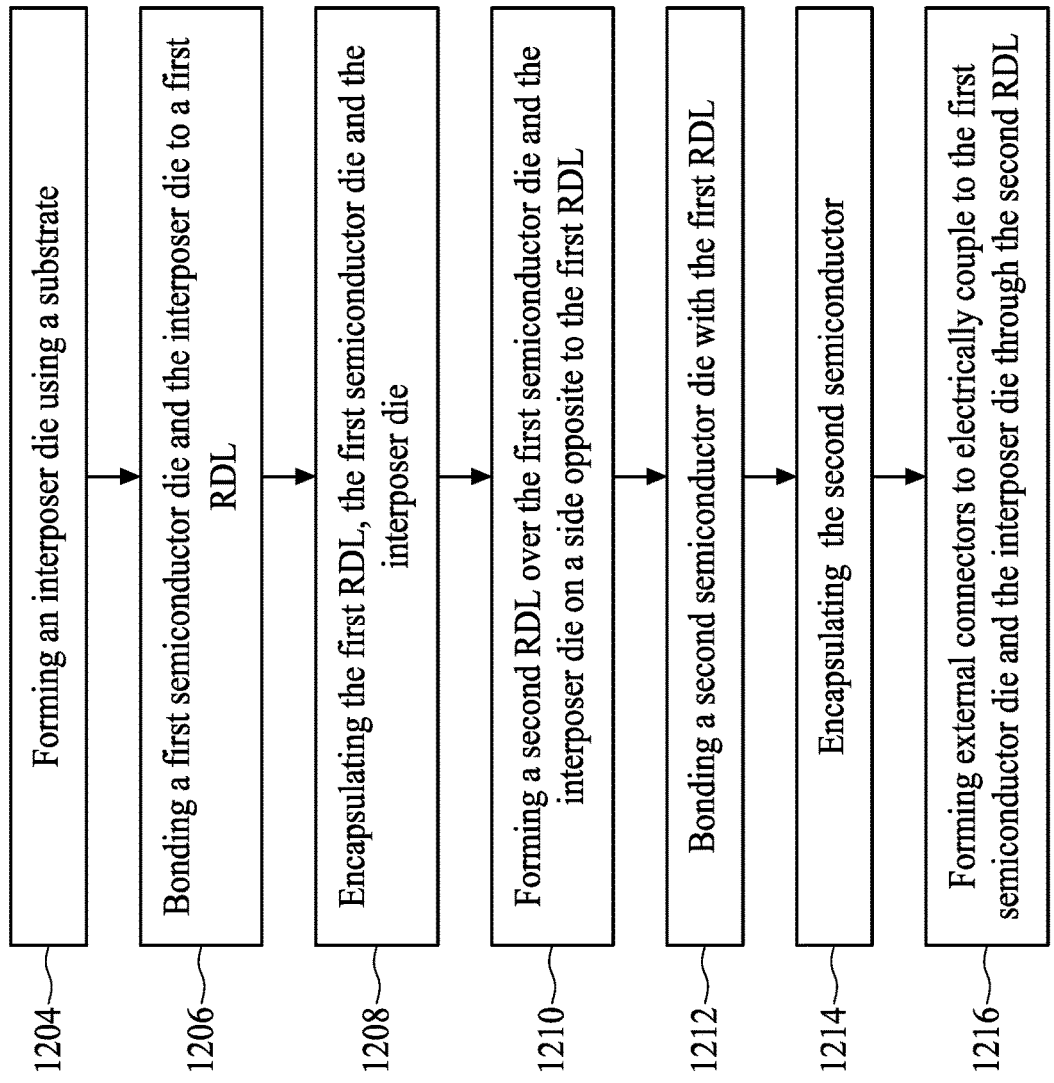

SEMICONDUCTOR STRUCTURE AND MANUFACTURING METHOD THEREOF

PRIORITY CLAIM AND CROSS-REFERENCE

This application is a divisional application of U.S. patent application Ser. No. 15/851,174 filed Dec. 21, 2017, and claims priority to U.S. patent application Ser. No. 62/445,935 filed Jan. 13, 2017, the disclosures of which are hereby incorporated by reference in their entirety.

BACKGROUND

Electronic equipment involving semiconductive devices is essential for many modern applications. Technological advances in materials and design have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices. In addition, the fabrication of semiconductor devices through packaging of semiconductor dies or chips continues to become increasingly complex.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12 is a schematic flow diagram of manufacturing a semiconductor package device, in accordance with some embodiments.

DETAILED DESCRIPTION

Figure 1A:
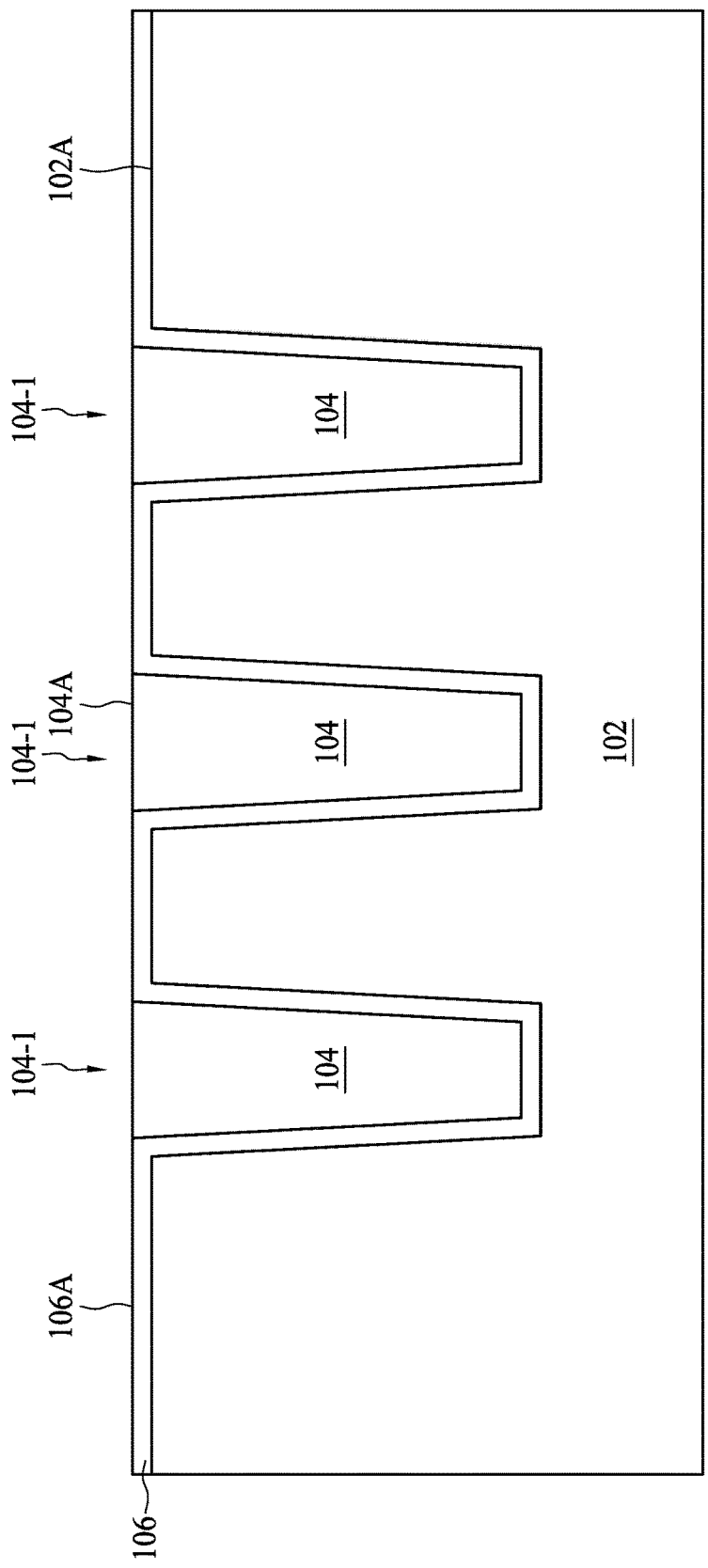
FIGS. 1A through 1D are cross-sectional views of intermediate structures for a method of manufacturing a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Throughout the present disclosure, one or more features may be introduced in limited embodiments for illustration, rather than distributed across all the embodiments exhaustively. However, unless stated otherwise, each of the features may exist and function of its own without the presence of other features even though they are introduced in a same embodiment. Furthermore, one feature introduced in one embodiment may also be employed in other embodiments without repeated descriptions for clarity and simplicity. Likewise, some features sharing similar functions but described in different embodiments may be replaced interchangeably.

The present disclosure provides structures and manufacturing operations of a fan-out wafer level package for providing enhanced electrical performance and reduced package footprint according to several embodiments. In a fan-out package device, one or more interconnect or redistribution layers (RDL) are incorporated to fan out the numerous chip contacts in order to accommodate ever-increasing quantities of input/output connections. In addition, conductive vias are formed to electrically couple the RDL with other conductive features, component dies and external connectors of the semiconductor package device. The conductive vias are referred to as through-silicon-vias (TSVs) in some scenarios. Specifically, the TSVs are manufactured on a wafer separate from the package device. The TSV wafer is sawed into individual dies, and the dies containing TSVs are sometimes called TSV dies or interposer dies. The interposer die is disposed within the semiconductor package device where the TSVs serve as electrical interconnections for the components in the semiconductor package device. The pitch of the TSVs can thus be significantly reduced as compared to those vias formed along with other features during the manufacturing process of the semiconductor package device. The electrical performance can be maintained and even improved. Additionally, the package size can be effectively reduced. In the following descriptions, intermediate stages of manufacturing various embodiments are illustrated. The variations of the embodiments are discussed. Throughout the various views and illustrative embodiments, like reference numbers are used to designate like elements.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A through 1D are cross-sectional views of intermediate structures for a method of manufacturing a semiconductor structure 100, in accordance with some embodiments. The semiconductor structure 100 may include one or more TSV dies or interposer dies. Referring to FIG. 1A, a substrate 102 is provided or received. The substrate 102 includes a semiconductor material such as bulk silicon. In some embodiments, the substrate 102 serves as an interposer substrate. In some embodiments, the substrate 102 may include other semiconductor materials, such as silicon germanium, silicon carbide, gallium arsenide, or the like. In some embodiments, the substrate 102 is a p-type semiconductive substrate (acceptor type) or an n-type semiconductive substrate (donor type). Alternatively, the substrate 102 includes another elementary semiconductor, such as germanium; a compound semiconductor including gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In yet another embodiment, the substrate 102 is a semiconductor-on-insulator (SOI). In other alternatives, the substrate 102 may include a doped epitaxial layer, a gradient semiconductor layer, and/or a semiconductor layer overlaying another semiconductor layer of a different type, such as a silicon layer on a silicon germanium layer.

Subsequently, several conductive vias 104 may be formed in the substrate 102. Initially, recesses 104 may be formed with respective openings 104-1 on an upper surface of the substrate 102. The recesses 104 may be formed by, for example, one or more etching processes, milling, laser techniques, or the like. The recesses 104 extend into the substrate 102. In some embodiments, the recesses 104 run through the substrate 102. In the present embodiment, a thickness of the substrate 102 beneath the bottom of the recess 104 remains at the current stage, and may be removed or thinned in subsequent operations to expose the bottom of the recess 104.

In some embodiments, the recesses 104 and the upper surface of the substrate 102 are then lined with a liner 106. The liner is conformally formed over the upper surface of the substrate 102 and sidewalls and bottoms of the recesses 104. In some embodiments, the liner 106 comprises one or more layers of dielectric materials, such as silicon oxide, silicon nitride, Tetraethoxy Silane (TEOS), polyimide, or combinations thereof.

Thereafter, a conductive material may be used to fill the recess 104, thereby forming the conductive via 104. In some embodiments, the conductive via 104 is referred to as a through-silicon via (TSV) 104. The TSV 104 comprises conductive materials, such as copper, tungsten, aluminum, silver, combinations thereof, or the like. In some embodiments, the TSV 104 may also include a diffusion barrier layer between the substrate 102 and the liner 106. The diffusion barrier layer may be made of TaN, Ta, TiN, Ti, CoW, or the like. The conductive via 104 may be formed by, for example, electroplating techniques. Other deposition techniques may also be considered, such as chemical vapor deposition (CVD), physical vapor deposition (PVD), atomic layer deposition (ALD) or the like. In some embodiments, a planarization operation, such as chemical mechanical polishing (CMP) or grinding, may be used to remove excess conductive materials. In some embodiments, a TSV may refer to a layered structure including the liner 106 in addition to the conductive material 104. In some embodiments, the conductive vias 104 comprise a sidewall tapered from their respective openings 104-1 to their bottoms. In some embodiments, an upper surface 104A of the TSV 104 is exposed from an upper surface 102A of the substrate 102. In some embodiments, the upper surface 104A of the TSV 104 is substantially coplanar with an upper surface 106A of the liner 106 over the substrate 102.

Figure 1B:
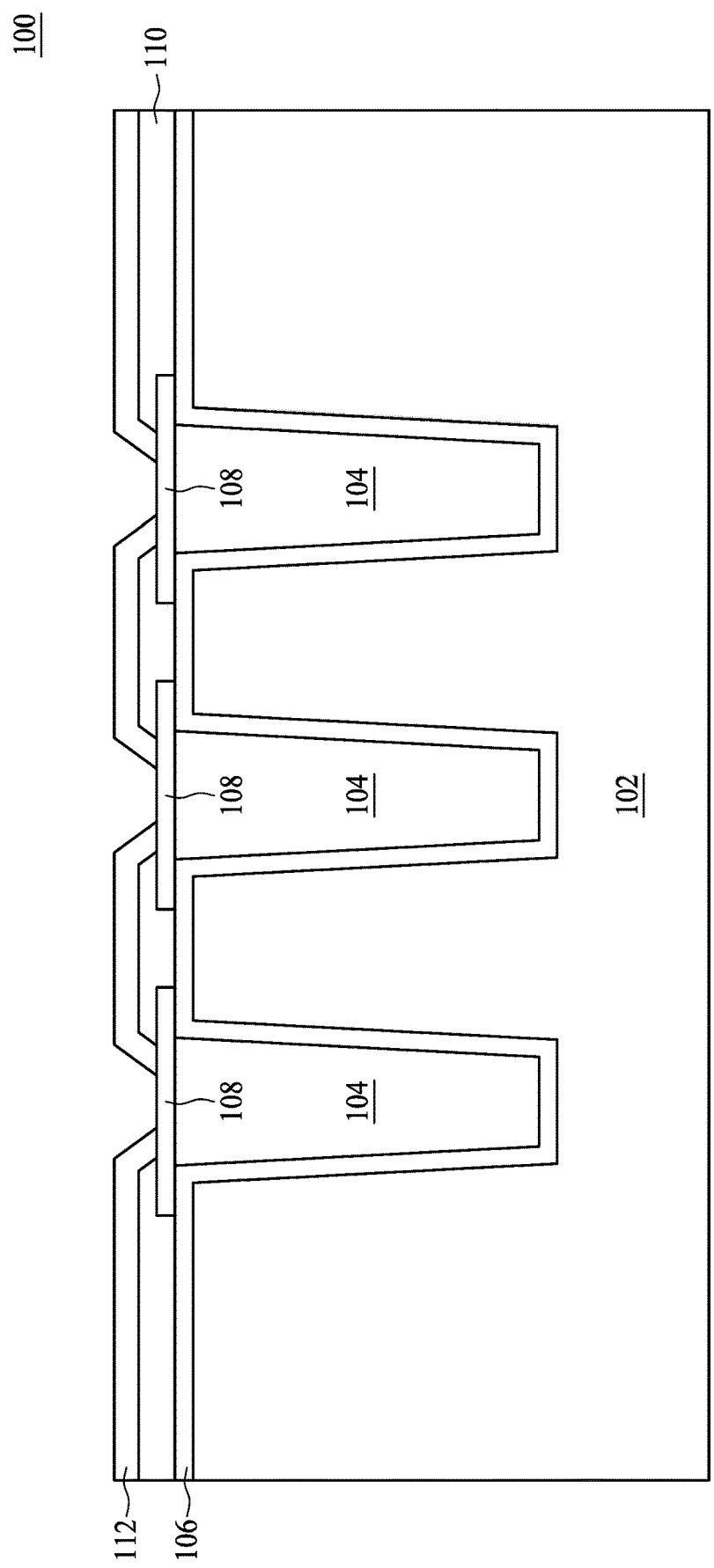

Referring to FIG. 1B, bond pads 108 are formed on the corresponding TSVs 104. The bond pads 108 can be used to electrically bond the TSVs 104 with conductive features or chips overlaying bond pads 108. In some embodiments, the bond pads 108 cover the corresponding TSVs 104. In some embodiments, the bond pads 108 partially cover the upper surface of the substrate 102. In some embodiments, the bond pad 108 covers a portion of the liner 106. The bond pad 108 includes a conductive material, such as copper, tungsten, aluminum, silver, combinations thereof, or the like. In some embodiments, the bond pad 108 includes materials similar to the TSV 104. The bond pad 108 may be formed by any suitable technique, such as CVD or PVD. In some embodiments, the bond pads 108 are configured as a top portion of the TSVs 104.

Next, a first protection layer 110 and a second protection layer 112 are sequentially deposited over the substrate 102. The first protection layer 110 and the second protection layer 112 may be collectively referred to as passivation layers. Each of the first protection layer 110 and the second protection layer 112 includes a dielectric material, such as silicon oxide, TEOS oxide, silicon nitride, combinations thereof, or the like. Alternatively, the first protection layer 110 and the second protection layer 112 may include the un-doped Silicate Glass (USG), Fluorinated Silicate Glass (FSG), or other suitable dielectric materials. In some embodiments, the first protection layer 110 is a USG layer and the second protection layer 112 includes silicon nitride. The first protection layer 110 and the second protection layer 112 are formed by initially depositing a dielectric material over the substrate 102, followed by lithographic process for patterning the dielectric material. A portion of each of the bond pads 108 is then exposed. The deposition of the first protection layer 110 or the second protection layer 112 can be carried out using any of a variety of techniques, including thermal oxidation, LPCVD (low-pressure CVD), PECVD (plasma-enhanced CVD) or the like.

In some embodiments, the first protection layer 110 may further include a layered structure with different dielectric materials. For example, the first protection layer 110 may be formed by forming a single layer of low-k dielectric material on the liner 106 and the bond pads 108, followed by a layer of USG or silicon nitride.

Figure 1C:
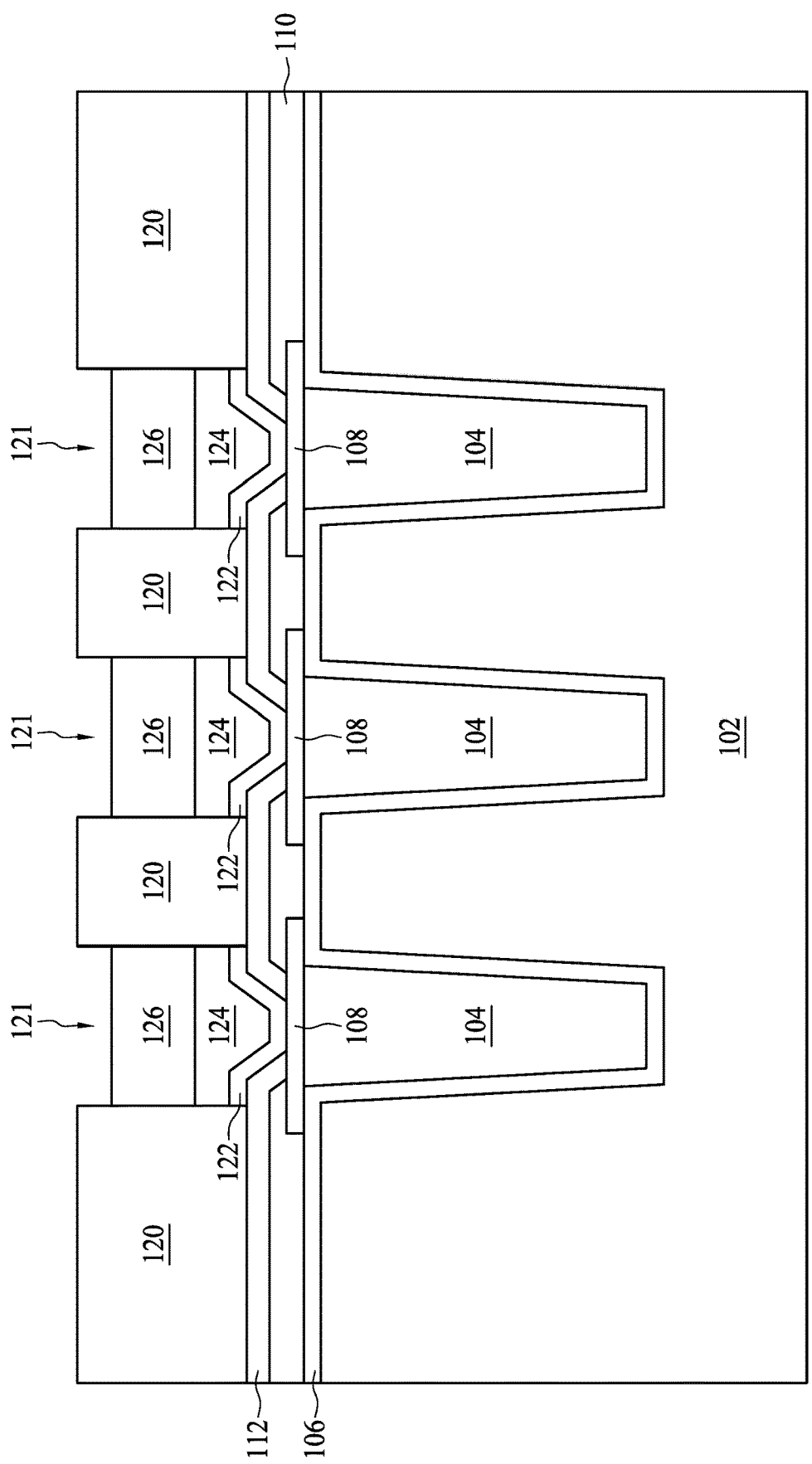

With reference to FIG. 1C, a mask layer 120 is formed over the second protection layer 112. The mask layer 120 may comprise a dry film or a photoresist film. Alternatively, other materials, such as nitride, oxide, or oxynitride, may be used. In addition, openings 121 are formed by, for example, lithographic processes, to expose a portion of the first protection layer 110 and the second protection layer 112 around the bond pads 108. Subsequently, an under bump metallization 122 and a metallization layer 124 are sequentially filled in the openings 121 over the bond pad 108. In an embodiment, the under bump metallization 122 may comprise a diffusion barrier layer and/or a seed layer over the diffusion barrier layer. The under bump metallization layer 122 and the metallization layer 124 may be formed by PVD, sputtering or other suitable methods. In some embodiments, the diffusion barrier layer may include titanium, titanium nitride, tantalum, tantalum nitride, or the like. In some embodiments, the seed layer may comprise copper or copper alloys. In some embodiments, the metallization layer 124 may comprise a single layer or a multilayer structure. For example, the metallization layer 124 comprises copper, copper alloy, tin, nickel, nickel alloy, combinations or the like. Next, a solder material 126 is formed in the opening 121 over the metallization layer 124. In some embodiments, the solder material 126 comprises Sn, lead (Pb), Ni, Au, Ag, Cu, bismuthinite (Bi), combinations thereof, or mixtures of other electrically conductive material. In some embodiments, the solder material 126 comprises lead-based materials, such as SnAg, SnPb, SnAgCu, or the like. In one embodiment, the solder material 126 is a lead-free material.

Figure 1D:
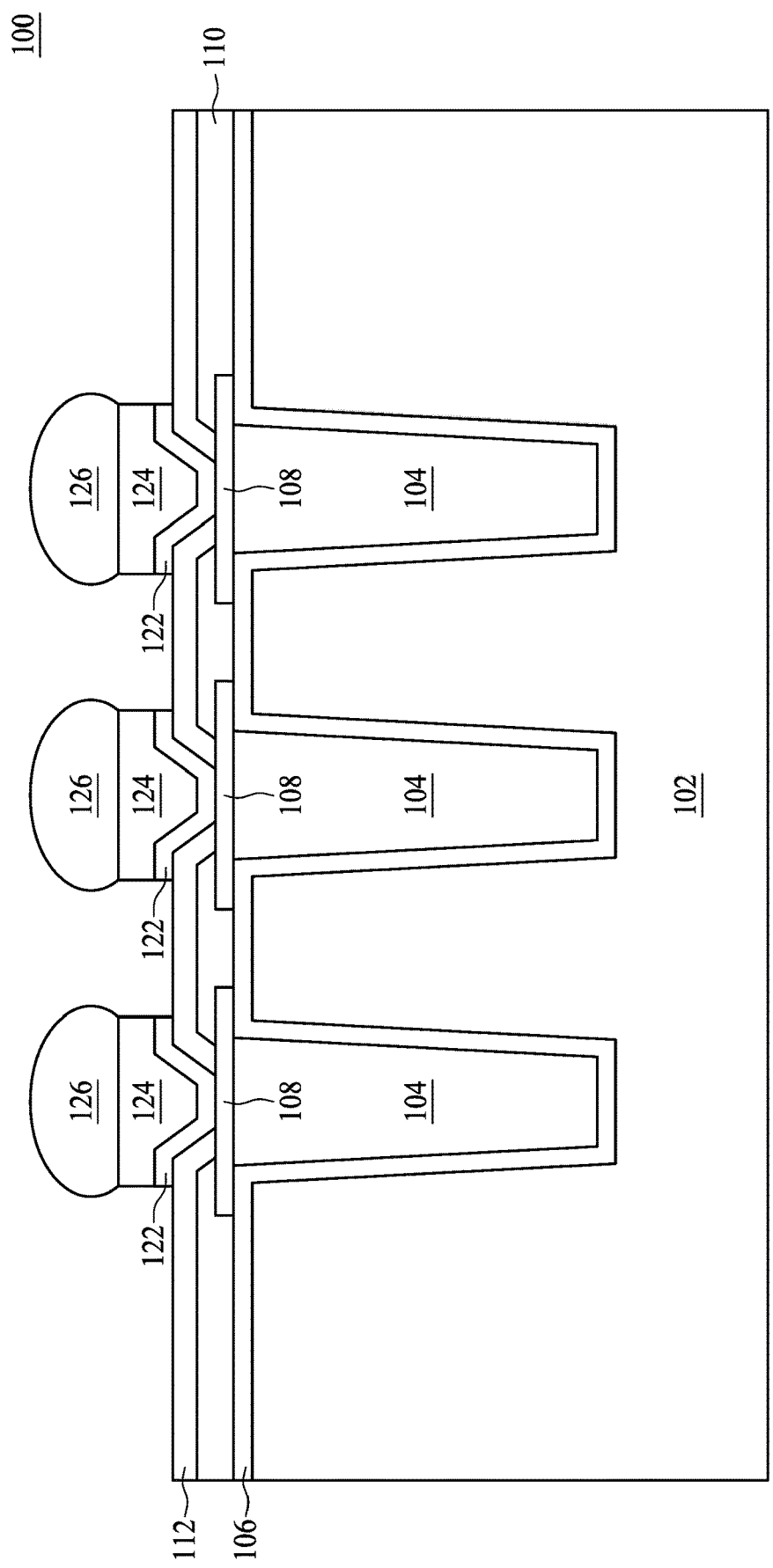

Referring to FIG. 1D, the mask layer 120 may be stripped after the formation of the solder material 126 is successfully completed. Subsequently, a thermal process may be performed on the solder material 126, forming an external connector 126. In some embodiments, the external connector 126 comprises a spherical shape. However, other shapes of the external connector 126 may be also possible. In some embodiments, the external connector 126 may be contact bumps such as controlled collapse chip connection (C4) bumps, ball grid array bumps or microbumps. In some embodiments, a thinning operation may be performed (not separately shown) on the substrate 102 to expose the bottom portion of the liner 106 on the TSV 104. In some embodiments, a portion of the liner 106 is removed thereby exposing the bottoms of the TSV 104. In some embodiments, a die saw or singulation process may be performed on the substrate 102 (not separately shown). Individual TSV dies (e.g., the semiconductor structure 100 in FIG. 1D illustrates a TSV die embedding three TSVs), each including one or more embedded TSVs 104, are obtained accordingly.

In the present embodiment, the TSV die 100 may include merely the TSVs 104. No electrical circuits or conductive features are formed on or in the substrate 102. In some embodiments, the TSV die structure 100 may further include passive circuits or devices (not separately shown) such as a capacitor, inductor, resistor, and the like.

FIGS. 2A through 2D are cross-sectional views of intermediate structures for a method of manufacturing a semiconductor structure 200, in accordance with some embodiments. The semiconductor structure 200 can include one or more TSV dies or interposer dies. Moreover, the structure and manufacturing operations for the TSV die 200 are similar to those of the TSV die 100, with the addition of a redistribution layer (RDL) 130. Thus, some descriptions of FIGS. 2A through 2D in which elements were discussed previously in FIGS. 1A through 1D may be simplified or omitted for the sake of clarity and simplicity.

Figure 2A:
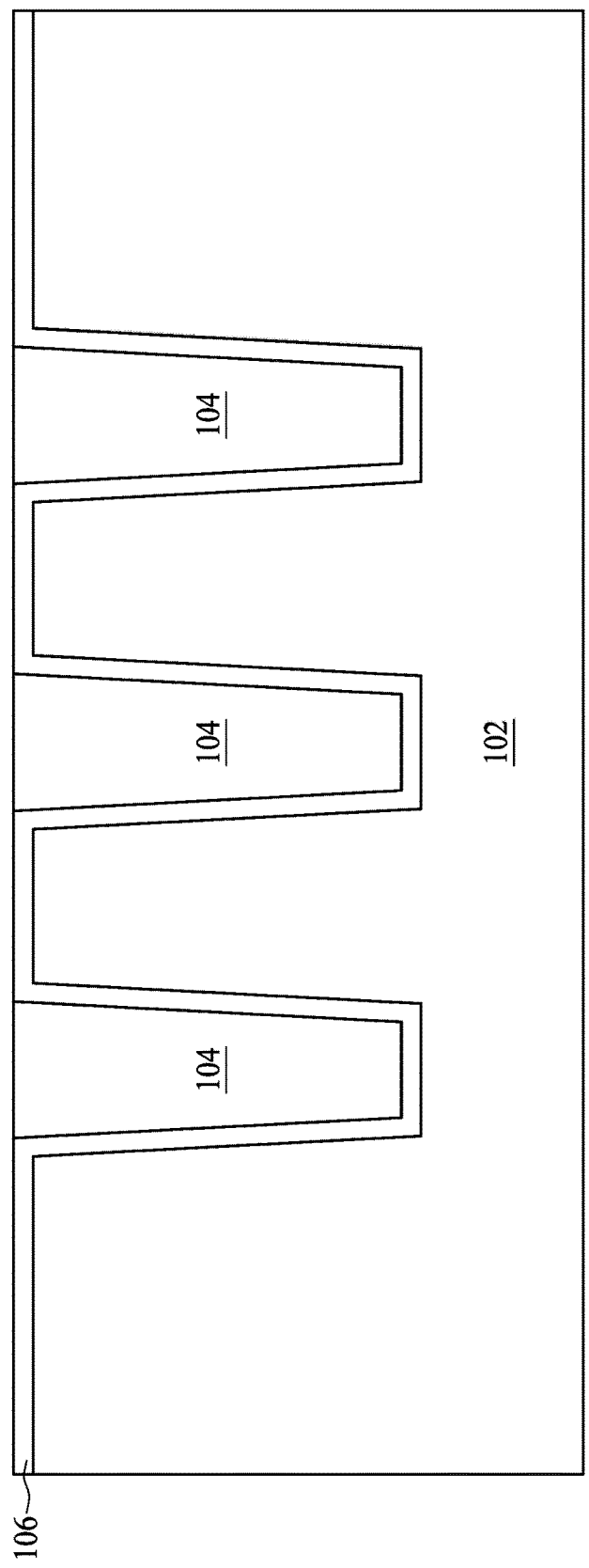
FIGS. 2A through 2D are cross-sectional views of intermediate structures for a method of manufacturing a semiconductor structure, in accordance with some embodiments.
Figure 2B:
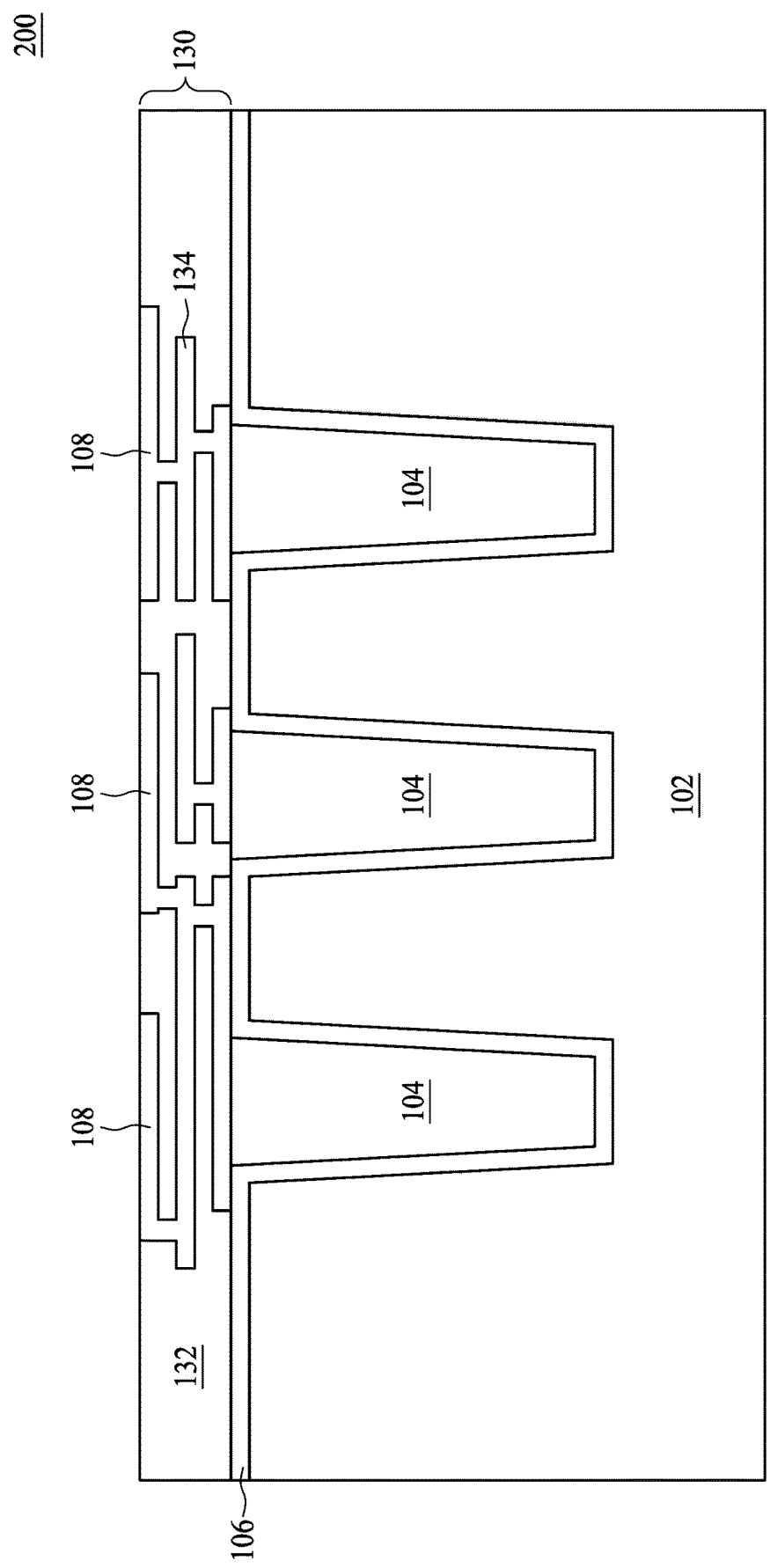

Referring to FIG. 2A, TSVs 104 and a liner 106 are sequentially formed on the substrate 102. Then, as shown in FIG. 2B, the RDL 130 is formed over the substrate 102 and the TSVs 104. The RDL 130 is configured to electrically couple the TSVs 104 with overlaying features. The RDL 130 may include multiple metal layers 134. Each of the metal layers 134 may include horizontal conductive wires and vertical metal vias where the horizontal metal lines are electrically coupled to adjacent overlaying or underlying horizontal metal lines through at least one vertical metal via. In the present embodiment, the numbers and patterns of the metal lines and vias are provided for illustration. Other numbers of metal layers and alternative wiring patterns are also within the contemplated scope of the present disclosure. In some embodiments, the bond pads 108 may be formed as an uppermost metal layer of the RDL 130. A portion of the bond pad 108 is exposed through the RDL 130.

Moreover, the aforesaid metal layers 134 are electrically insulated from other components. The insulation may be achieved by insulating materials. In some embodiments, the remaining portion of the RDL 130 may be filled with a dielectric 132. The dielectric 132 may be formed of oxides, such as un-doped Silicate Glass (USG), Fluorinated Silicate Glass (FSG), silicon oxide, silicon nitride, silicon oxynitride, low-k dielectric materials, or the like. The low-k dielectric materials may have k values lower than 3.8, although the dielectric materials of the dielectric 132 may also be close to 3.8. In some embodiments, the k values of the low-k dielectric materials are lower than about 3.0, and may be lower than about 2.5.

Figure 2C:
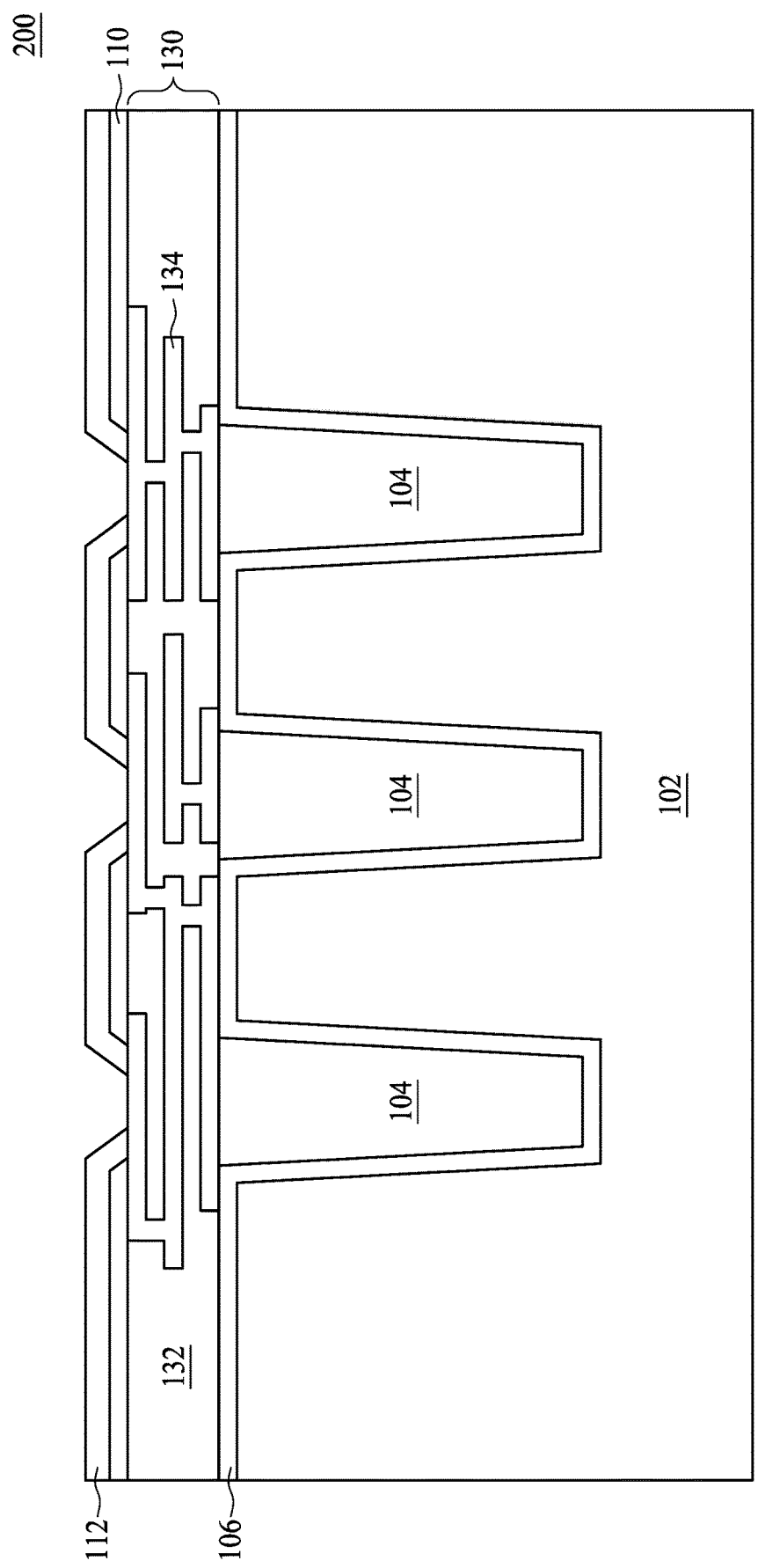

Subsequently, as illustrated in FIG. 2C, the protection layers 110 and 112 are formed over the RDL 130 with a portion of the bond pad 108 exposed. Next, the under bump metallization 122, metallization layer 124 and the external connector 126 are formed with reference to FIG. 2D. In some embodiments, a die singulation operation is performed on the structure 200. Individual TSV dies 200 are formed accordingly.

Figure 3A:
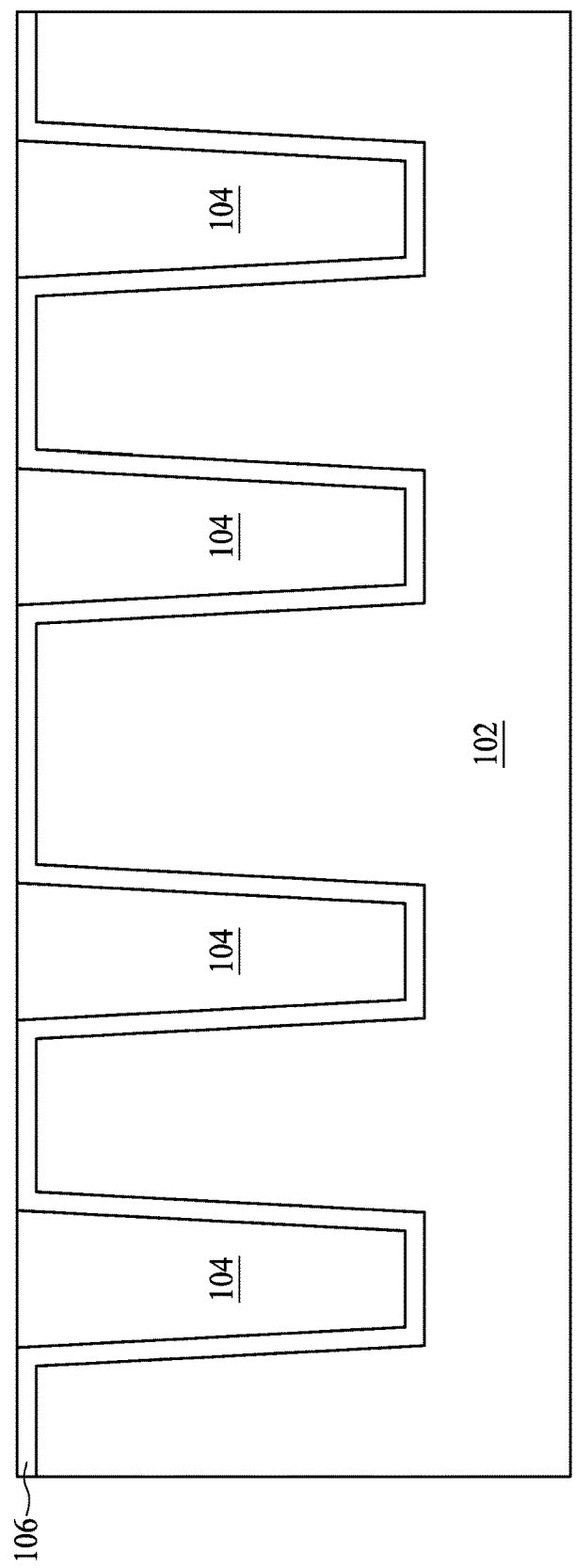
FIGS. 3A through 3H are cross-sectional views of intermediate structures for a method of manufacturing a semiconductor structure, in accordance with some embodiments.

FIGS. 3A through 3H are cross-sectional views of intermediate structures for a method of manufacturing an TSV die structure 300, in accordance with some embodiments. In FIG. 3A, TSVs 104 and a liner 106 are sequentially formed on the substrate 102.

Figure 3B:
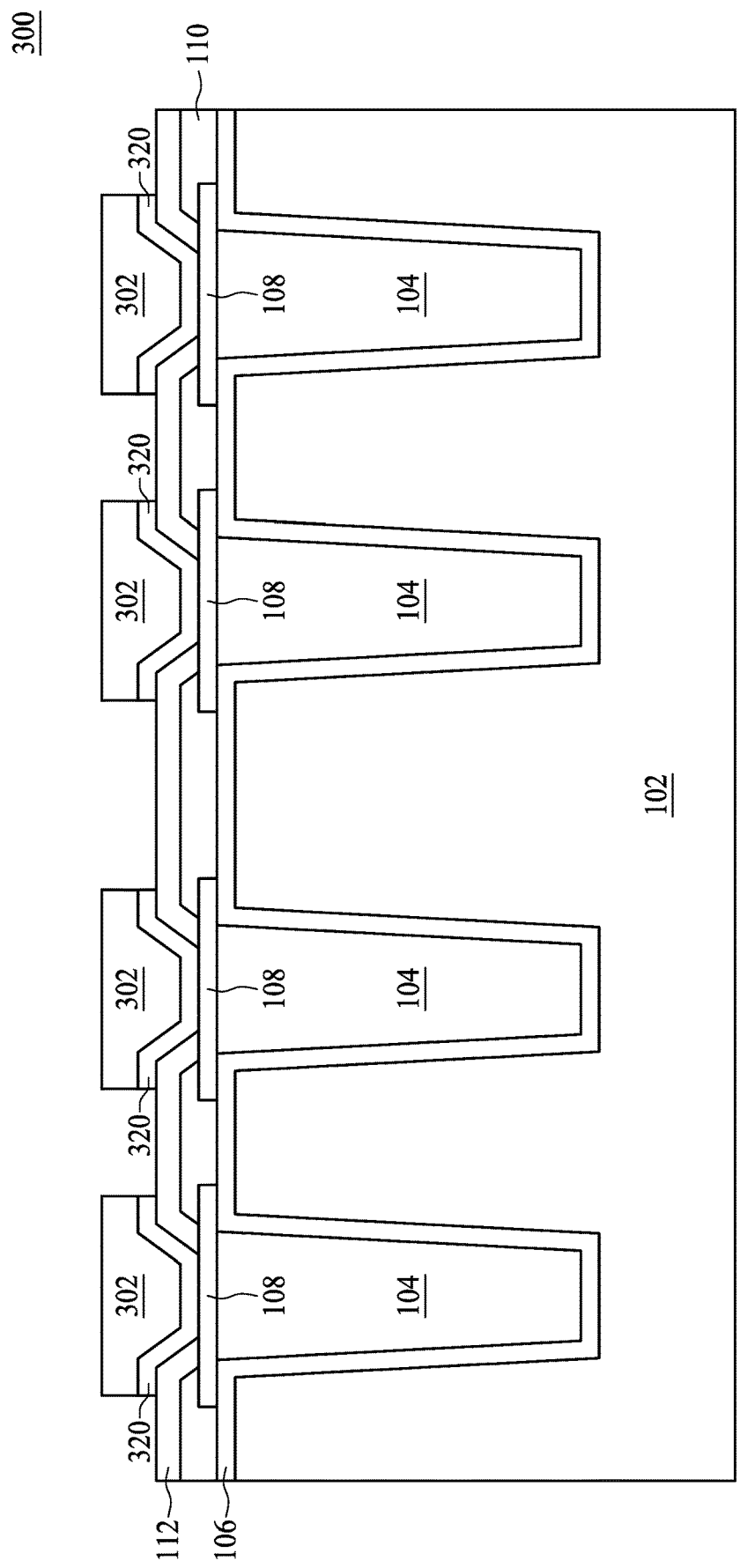

Referring to FIG. 3B, the bond pads 108 are initially formed and the protection layers 110 and 112 are deposited over the bond pad 108, the substrate 102 and the TSVs 104. Moreover, a portion of the bond pad 108 is exposed through the first protection layer 110 and the second protection layer 112. Next, a metallization layer 320 is deposited over the exposed portion of the bond pad 108. The metallization layer 320 includes a conductive material, such as aluminum, copper, tin, nickel, alloys thereof, or the like. In some embodiments, the metallization layer 320 is similar to the under bump metallization 122 or the metallization layer 124 in material. Subsequently, a cap 302 is formed over the corresponding metallization layer 320. In some embodiments, the cap 302 has sidewalls substantially aligned with sidewalls of the metallization layer 320.

In some embodiments, the cap 302 comprises conductive materials, such as tungsten, aluminum, silver, combinations thereof, or the like. In some embodiments, the cap 302 may comprise materials similar to those of the TSVs 104 or the metal layers 134 of the RDL 130. In other embodiments, the cap 302 comprises a dielectric material, such as nitride, oxide, oxynitride or the like. In some embodiments, the cap 302 comprises a polymeric material such as polymer, polyimide (PI), benzocyclobutene (BCB), polybenzoxazole (PBO) or the like. In some embodiments, the cap 302 may be formed by spin coating, sputtering or other deposition methods.

Figure 3C:
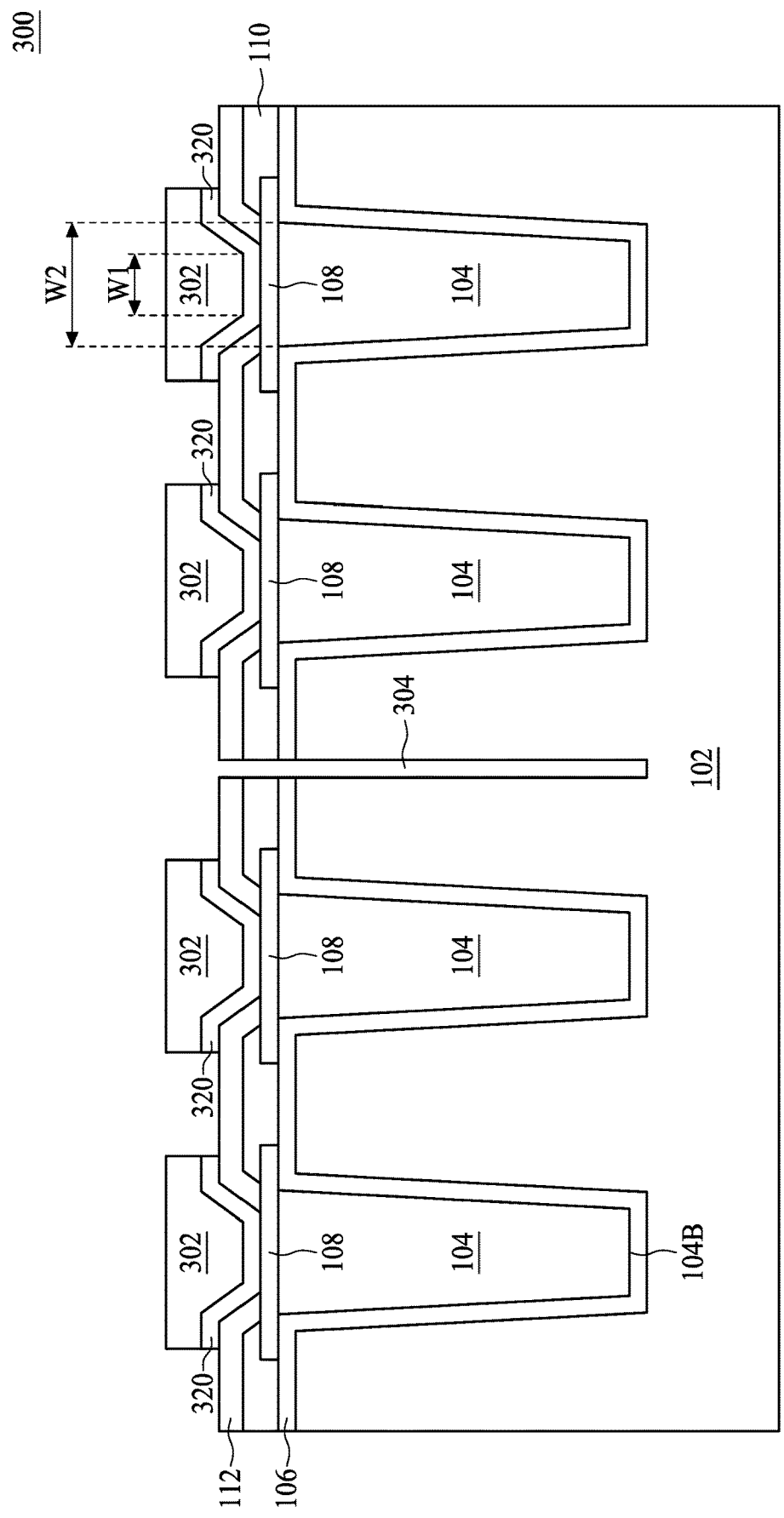

FIG. 3C illustrates the formation of a groove 304 that runs through the protection layers 112, 110 and the liner 106. In some embodiments, the groove 304 cuts through a depth of the substrate 102 while not cutting through the entire substrate 102. In an embodiment, the groove 304 extends below the bottom surface 104B of the TSVs 104. The groove 304 may be formed by laser cutting tools.

In some embodiments, the metallization layer 320 includes a bottom portion contacting the bond pad 108. In some embodiments, the bottom portion of the metallization layer 320 has a width W1. Furthermore, the TSV 104 has an upper surface with a width W2. In some embodiments, the width W2 is greater than the width W1.

Figure 3D:
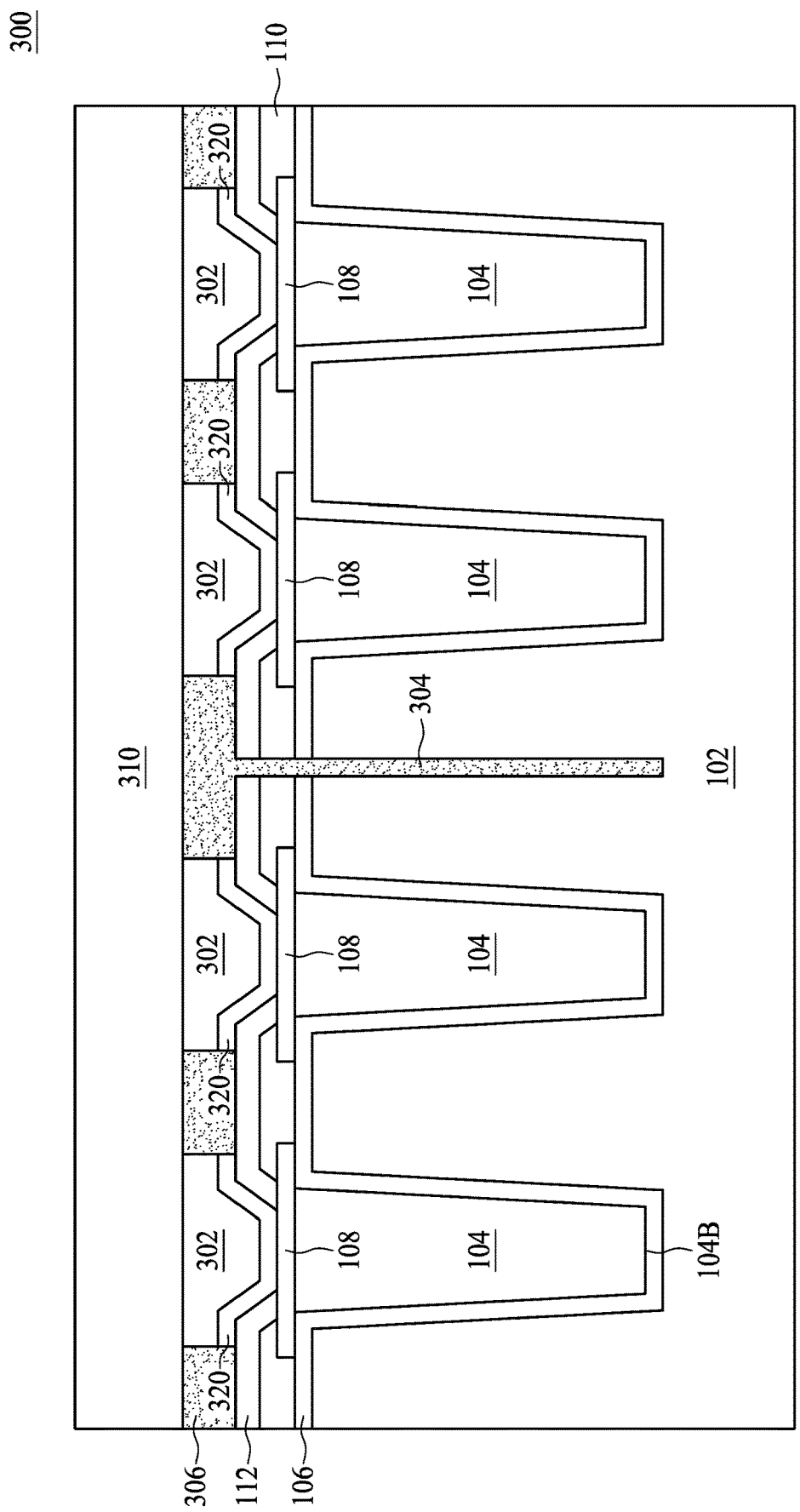

Next, in FIG. 3D, an adhesive layer 306 is formed over the substrate 102. The adhesive layer 306 fills the groove 304 and the gaps among the caps 302. In some embodiments, the adhesive layer 306 is leveled with the caps 302. In some embodiments, the adhesive layer 306 may be formed of an adhesive material such as ultra-violet (UV) glue or tape. Once the adhesive layer 306 is in place, a carrier 310 is attached to the adhesive layer 306. In some embodiments, the carrier 310 may be a glass carrier, a ceramic carrier, or the like.

Figure 3E:
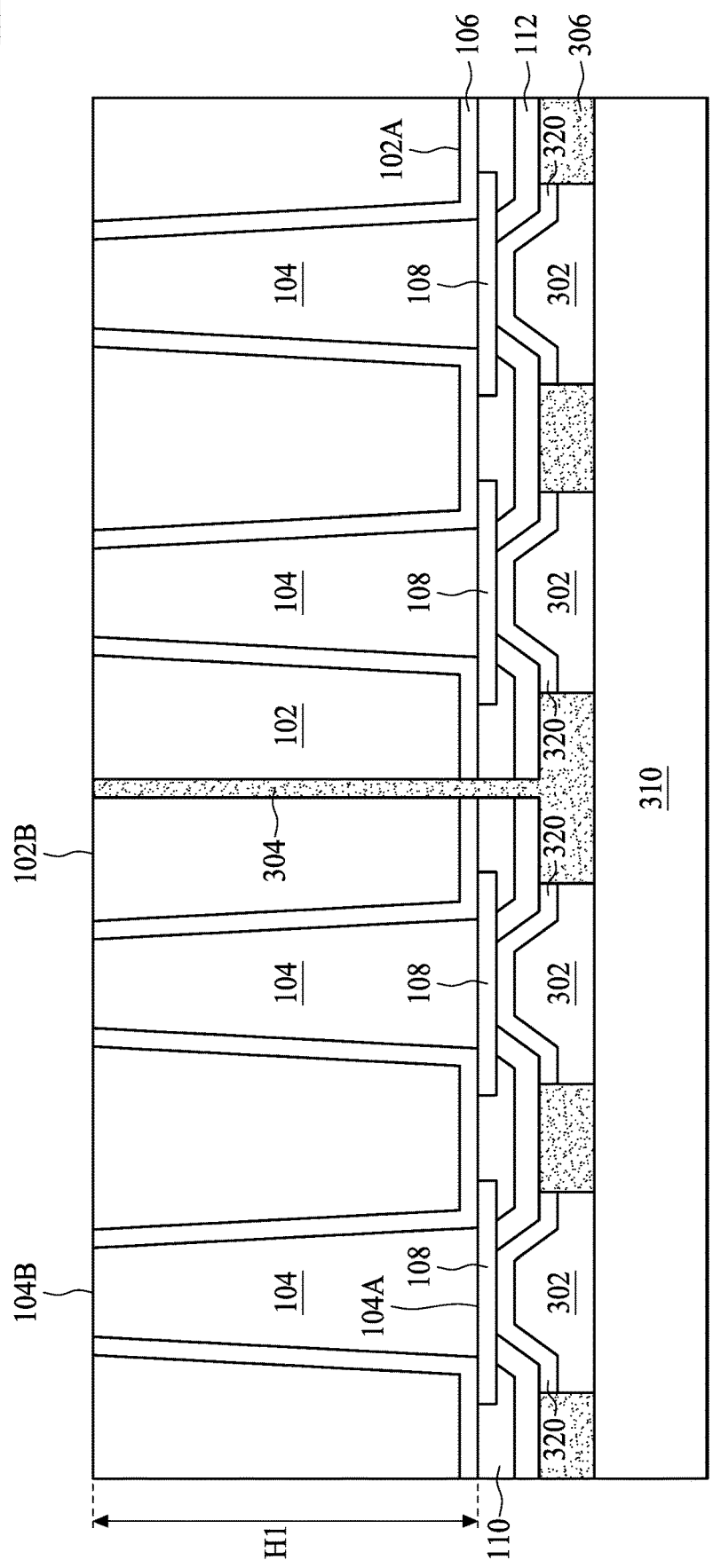

Next, the semiconductor structure 300 is flipped as illustrated in FIG. 3E. A depth of the substrate 102 is thinned or removed, thereby exposing the bottom surface 104B of the TSV 104. In some embodiments, the groove 304 is exposed through the substrate 102 during the thinning operation. In some embodiments, the TSV 104 is continuous from the upper surface 104A to the bottom surface 104B. The bottom surface 104B is substantially coplanar with a bottom surface 102B of the substrate 102 after the thinning operation is completed. In some embodiments, the TSV 104 has a height H1 substantially equal to a summation of the thickness of the substrate 102 and the thickness of the liner 106 over the substrate 102.

Figure 3F:
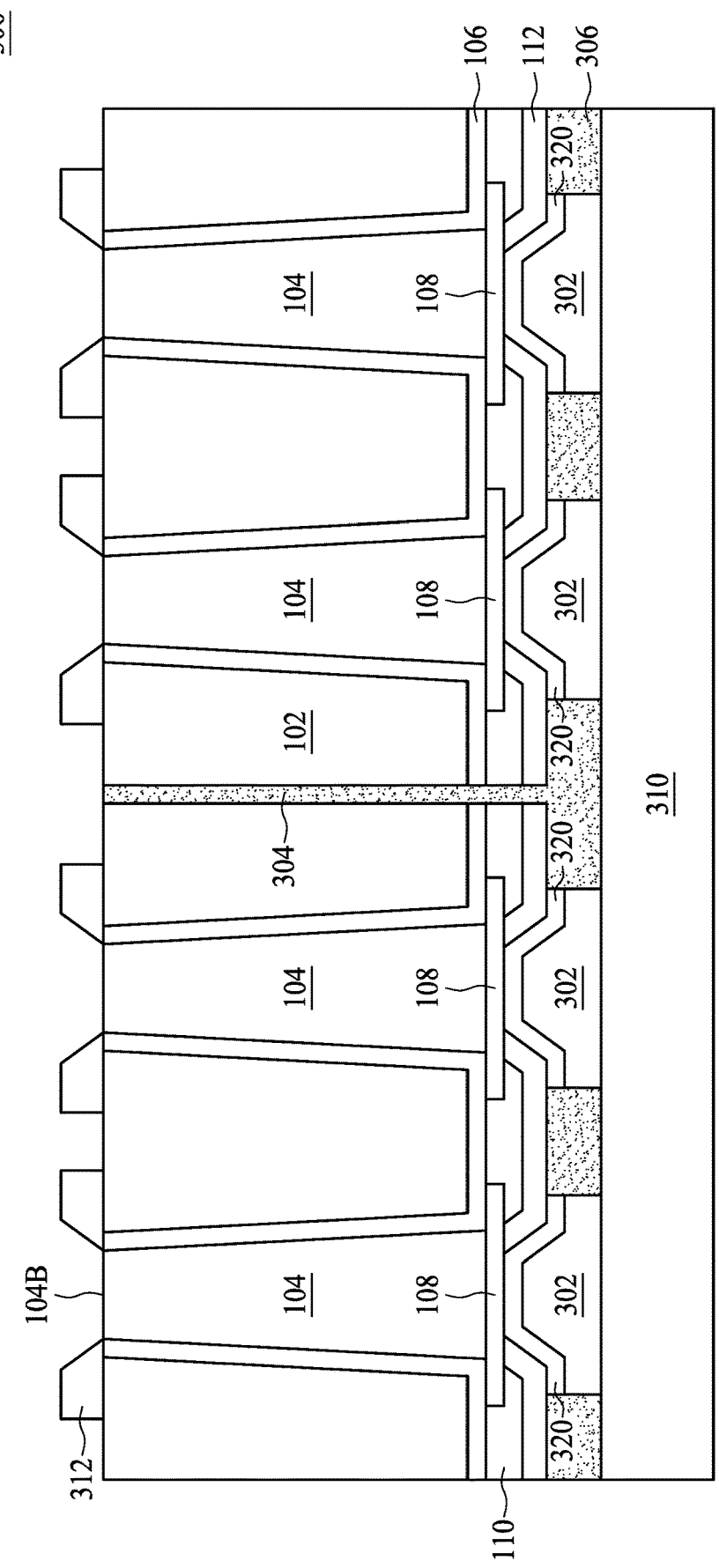

In FIG. 3F, a protective structure 312 is formed over the substrate 102 around the exposed bottom surface 104B of the TSV 104. In some embodiments, the protective structure 312 comprises a ring shape, viewed from above, which surrounds the perimeter of the bottom surface 104B with a portion of the TSV 104 exposed. In some embodiments, adjacent protective structures 312 may be configured as separated from one another. In some embodiments, the protective structure 312 is formed of a dielectric material, such as nitride, oxide, oxynitride or the like. In some embodiments, the protective structure 312 comprises a polymeric material such as polymer, polyimide (PI), benzocyclobutene (BCB), polybenzoxazole (PBO) or the like.

Figure 3G:
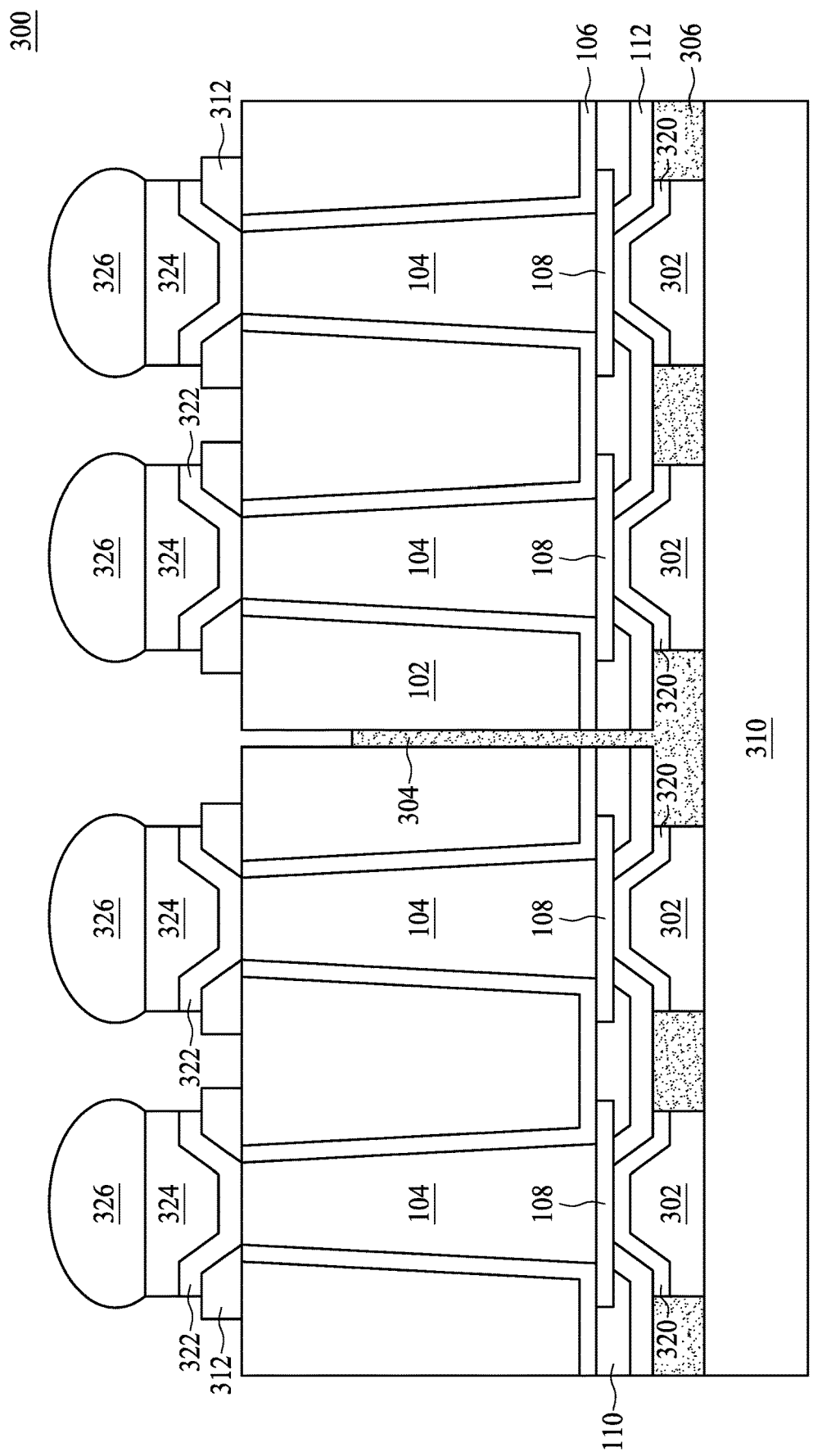

FIG. 3G illustrates the formation of an under bump metallization 322, a metallization layer 324 and an external connector 326. The materials and the manufacturing operations of the under bump metallization 322, the metallization layer 324 and the external connector 326 are similar to those of the under bump metallization 122, the metallization layer 124 and the external connector 126, respectively, as illustrated with reference to FIGS. 1C and 1D. Furthermore, a portion of the adhesive material is removed from the groove 304.

Figure 3H:
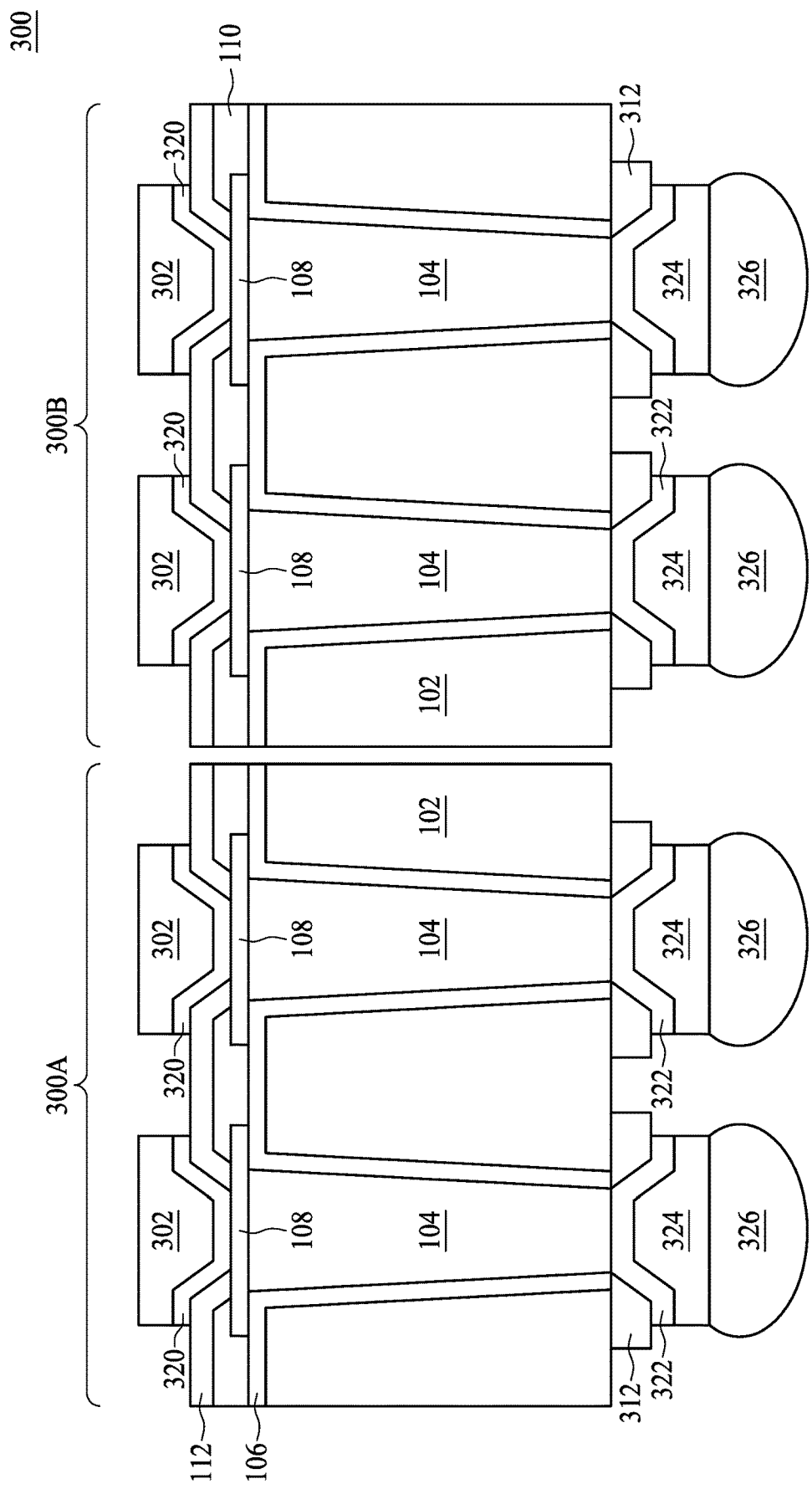

Referring to FIG. 3H, the carrier 310 is removed or detached from the semiconductor structure 300. In some embodiments, the adhesive layer 306 and the adhesive in the groove 304 are also cleaned. In some embodiments, the carrier 310 can be released by energy application on the adhesive layer 306, e.g., ultraviolet (UV) or near infra-red (NIR) laser, or thermal treatment. As a result, individual TSV dies or interposer dies 300A and 300B are formed accordingly.

FIGS. 4A through 4F are cross-sectional views of intermediate structures for a method of manufacturing a semiconductor structure 400, in accordance with some embodiments. The semiconductor structure 400 can include one or more TSV dies or interposer dies. Moreover, the manufacturing operations for the TSV die 400 are similar to those for the TSV die 300, with the addition of a redistribution layer (RDL) 430. In addition, the RDL 430 is similar to the RDL 130 illustrated with reference to FIG. 2B. Thus, some descriptions of materials, configurations or manufacturing operations for numerals that appeared in FIGS. 3A through 3H may be simplified or omitted for the sake of clarity and simplicity.

Figure 4A:
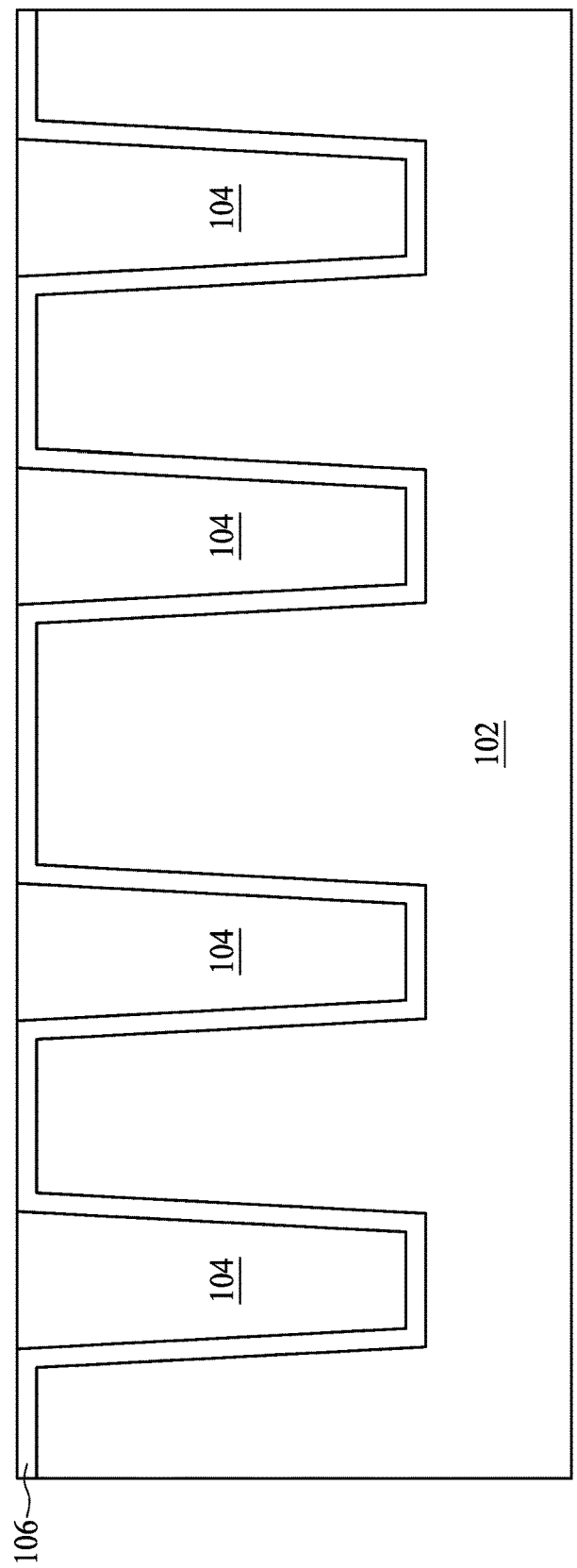
FIGS. 4A through 4F are cross-sectional views of intermediate structures for a method of manufacturing a semiconductor structure, in accordance with some embodiments.
Figure 4B:
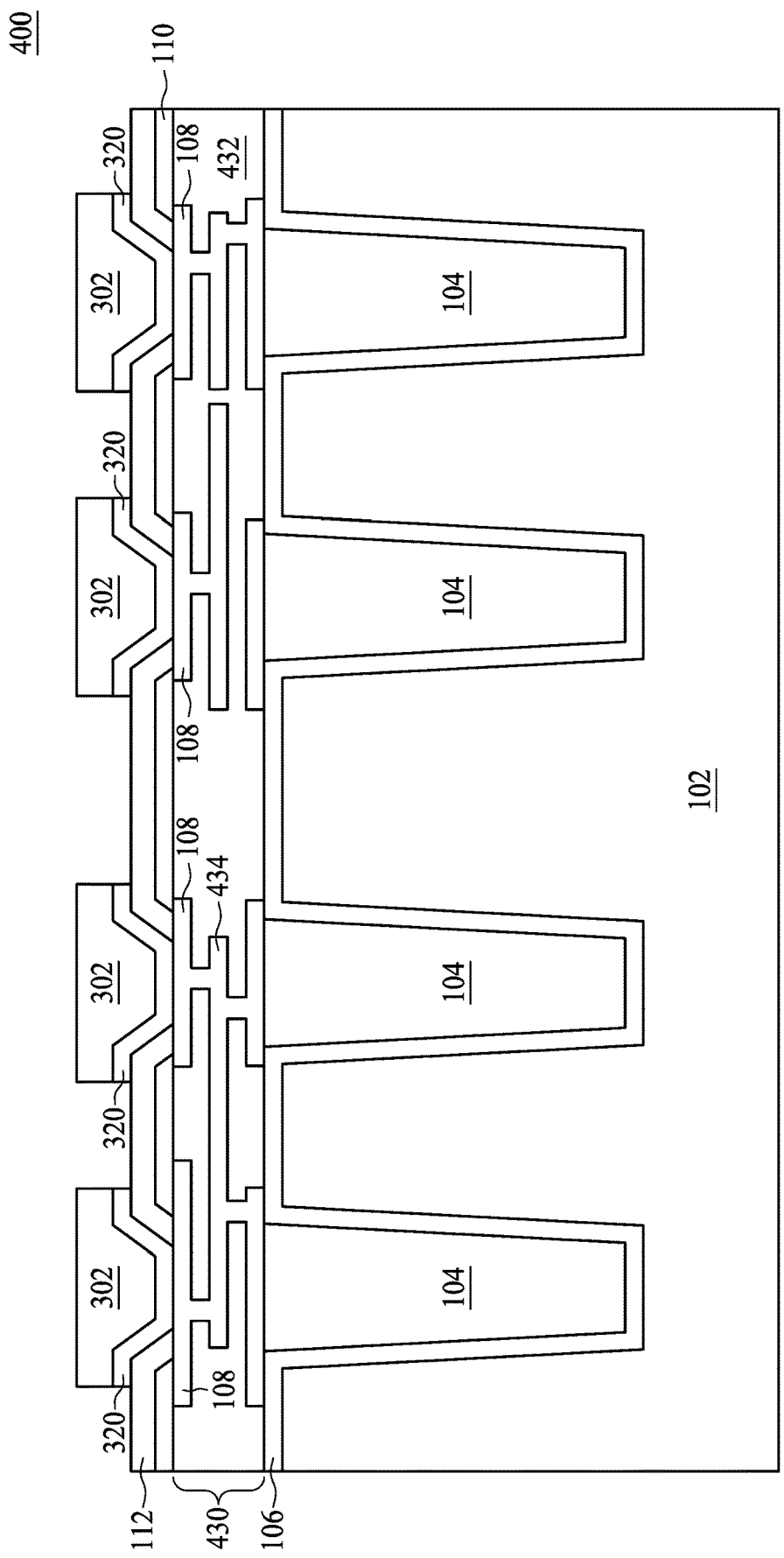

Referring to FIG. 4A, TSVs 104 and a liner 106 are sequentially formed over the substrate 102. Next, as shown in FIG. 4B, the RDL 430 is formed over the substrate 102 and the TSVs 104. The RDL 430 is configured to electrically couple TSVs 104 with overlaying features. The RDL 430 may include multiple metal layers 434. Moreover, the remaining portion of the RDL 430 may be filled with a dielectric 432. The dielectric material of the dielectric 432 may be formed of oxides, such as un-doped Silicate Glass (USG), Fluorinated Silicate Glass (FSG), low-k dielectric materials, or the like. The low-k dielectric materials may have k values lower than 3.8, although the dielectric materials of the dielectric 132 may also be close to 3.8. In some embodiments, the k values of the low-k dielectric materials are lower than about 3.0, and may be lower than about 2.5. In some embodiments, the dielectric 432 may include a dielectric material similar to the dielectric 132 of the RDL 130.

Figure 4C:
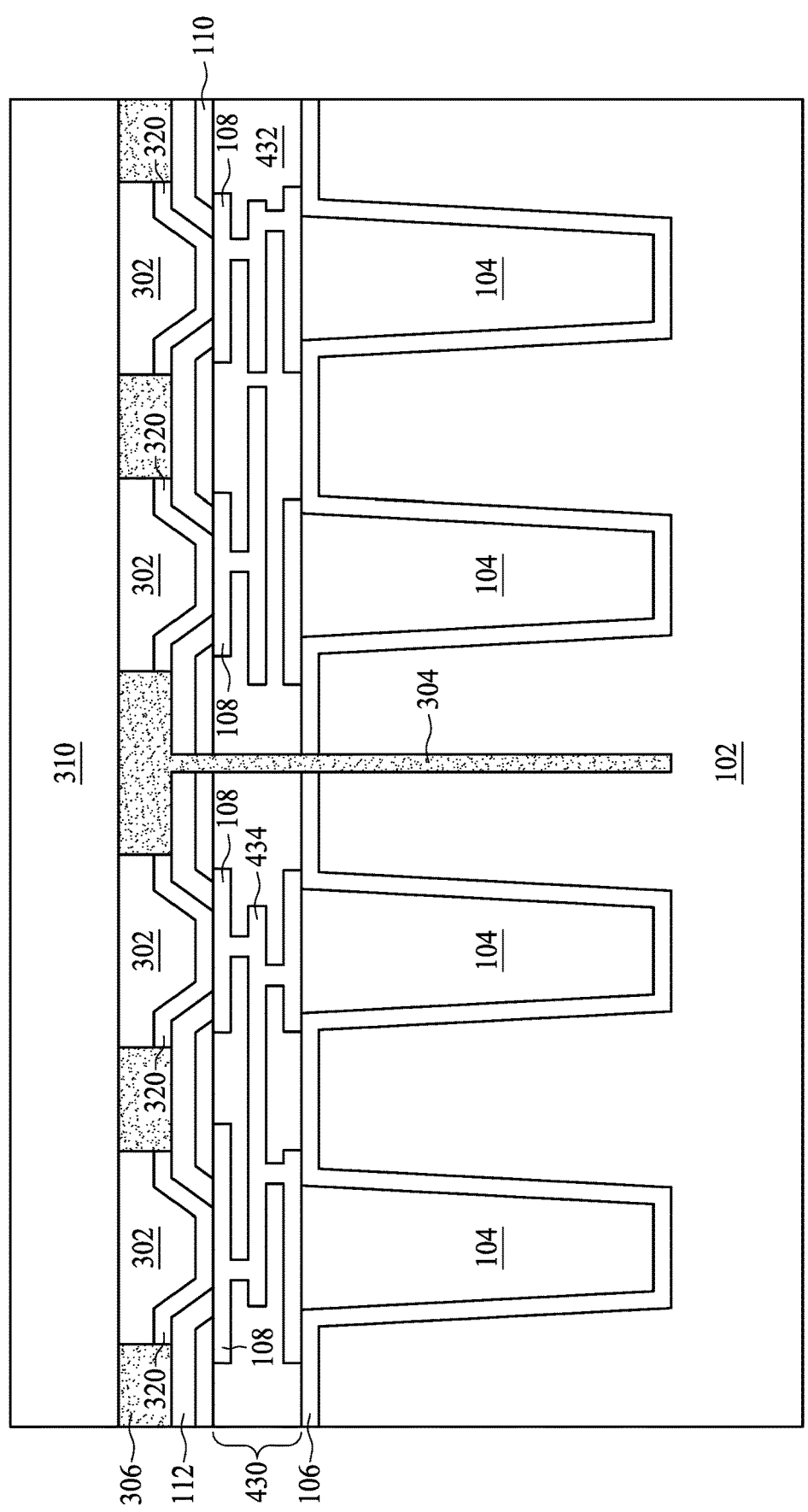

FIG. 4B also shows the formation of the protection layers 110 and 112 over the RDL 430, similar to those illustrated in FIG. 3B. Next, the metallization layer 320 and the cap 302 are formed sequentially. FIG. 4C illustrates the formation of a groove 304 that runs through the protection layers 112, 110 and the liner 106. Moreover, the adhesive layer 306 fills the groove 304 and the gaps among the caps 302. After the adhesive layer 306 is formed, a carrier 310 is attached to the adhesive layer 306.

Figure 4D:
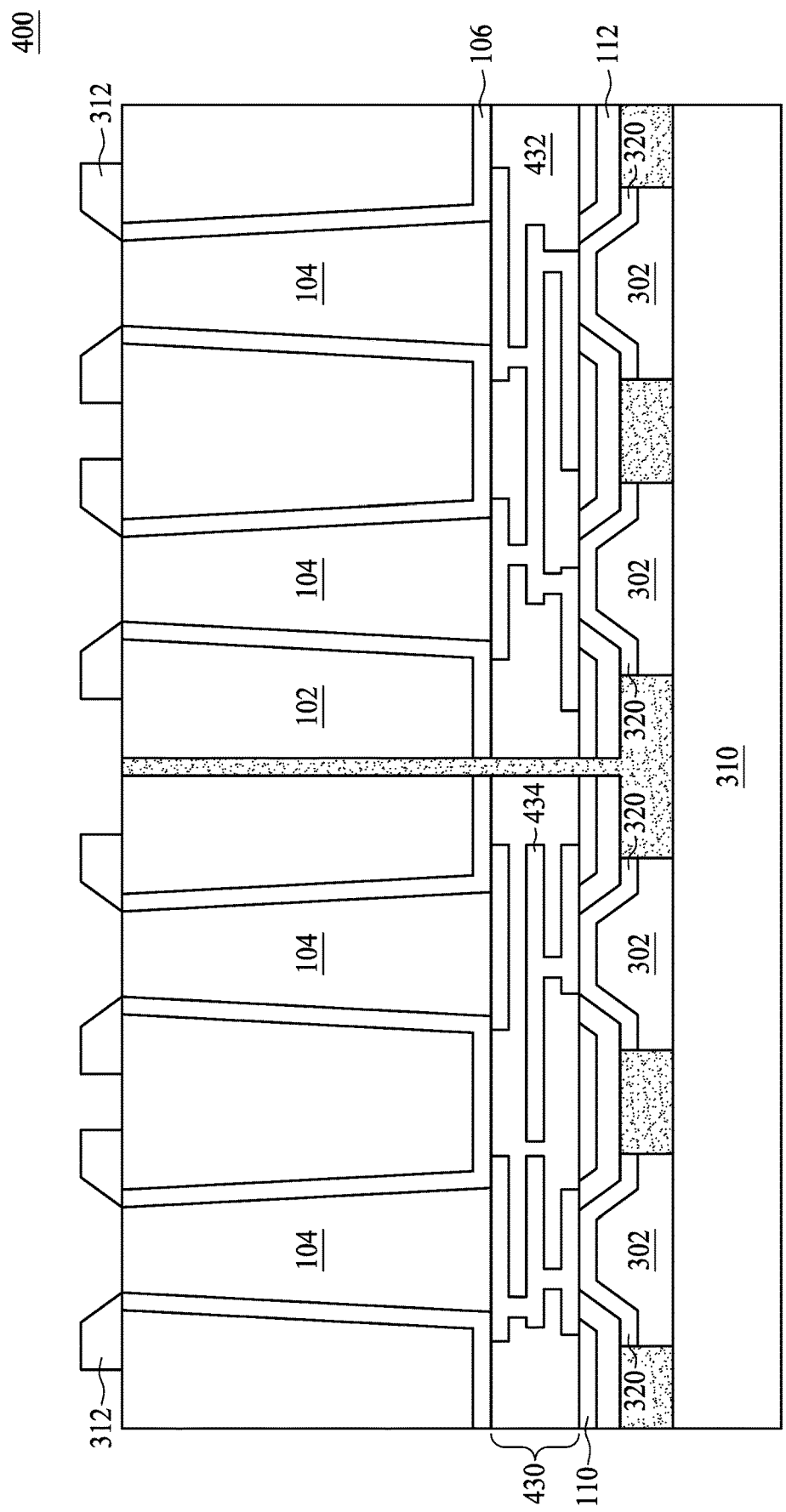
Figure 4E:
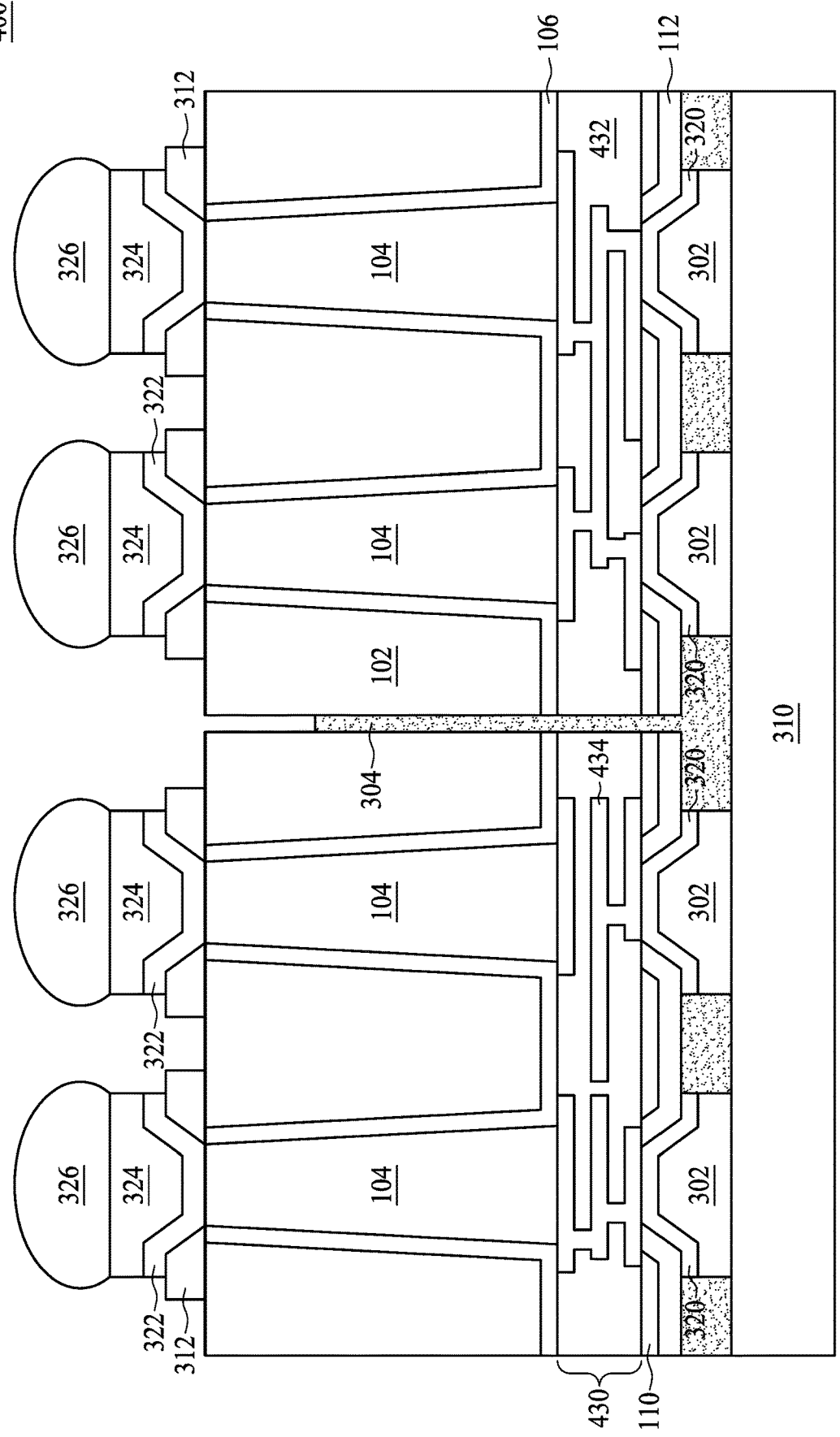

Next, the semiconductor structure 400 is flipped, as illustrated in FIG. 4D. Additionally, a depth of the substrate 102 is thinned or removed, thereby exposing the bottom of the TSV 104. A protective structure 312 is formed over the substrate 102 around the bottom surface 104B of the TSV 104. FIG. 4E illustrates the formation of the under bump metallization 322, the metallization layer 324 and the external connector 326. Next, a portion of adhesive material in the groove 304 is removed. Thus, an upper portion of the groove 304 is cleaned out. In an embodiment, the semiconductor structure 300 receives a die singulation operation to form an array of dies on the carrier 310.

Figure 4F:
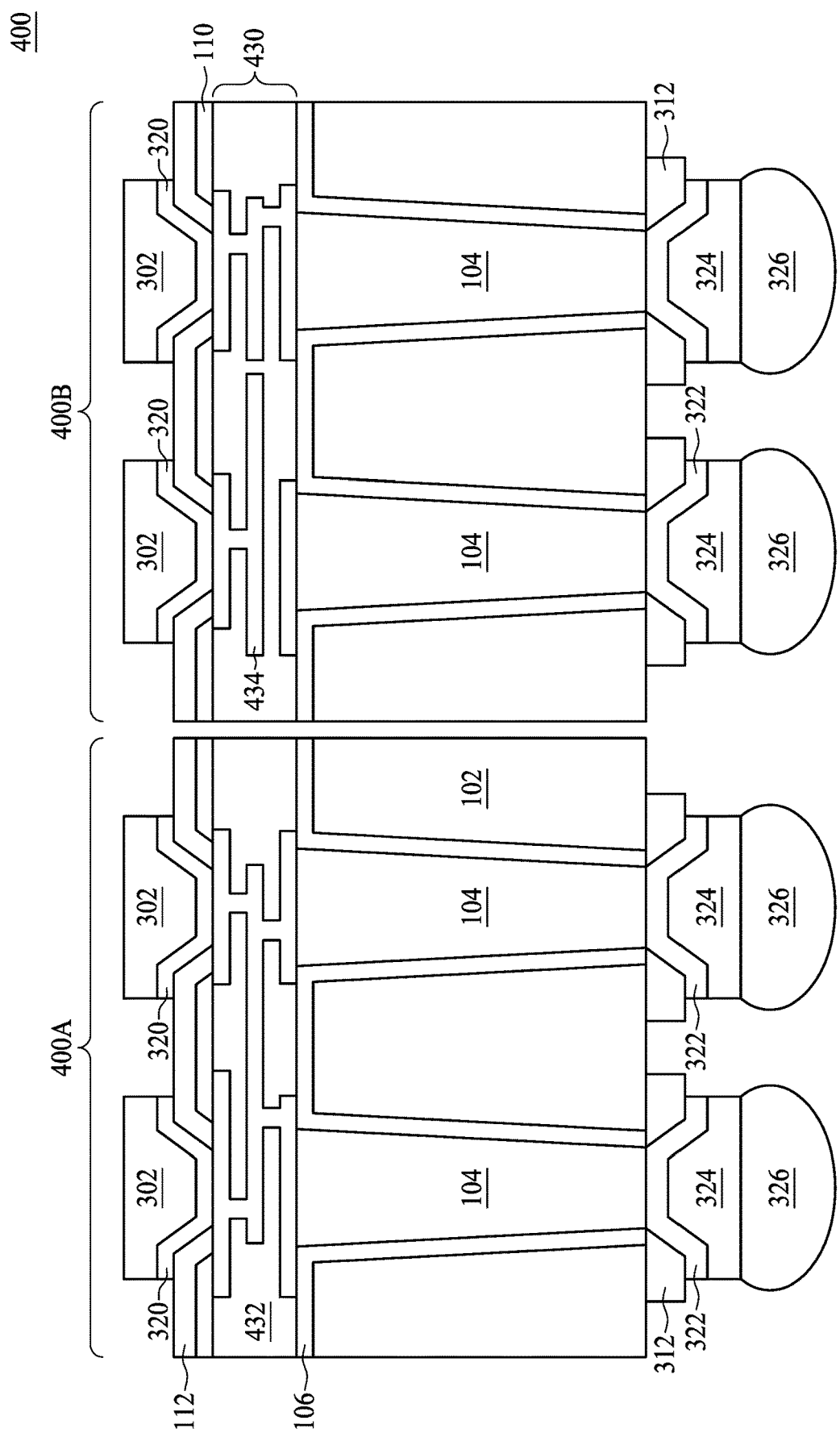

Referring to FIG. 4F, the carrier 310 is removed or detached from the semiconductor structure 400. As a result, individual TSV dies or interposer dies 400A and 400B are formed accordingly.

Figure 4G:
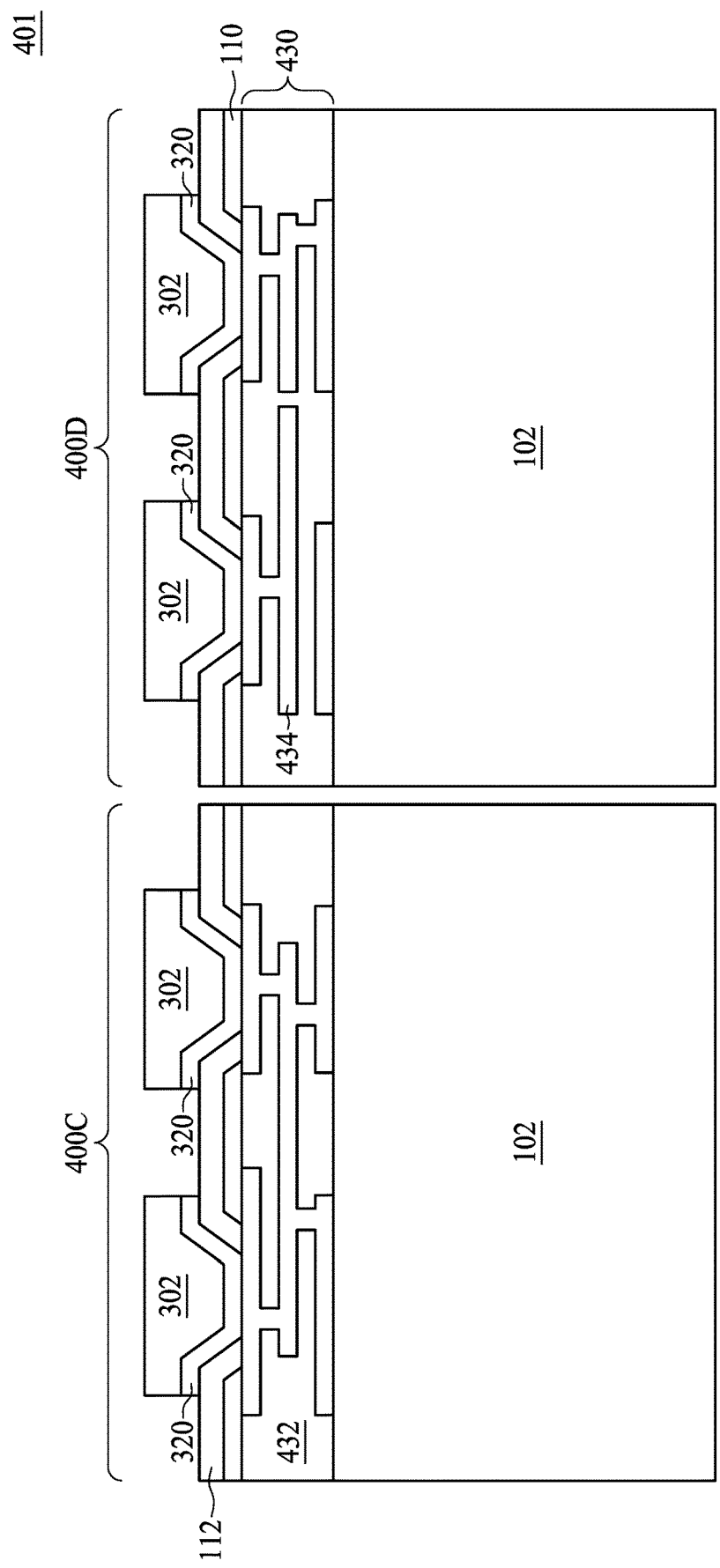
FIG. 4G is a cross-sectional view of intermediate structures for a method of manufacturing a semiconductor structure, in accordance with some embodiments.

In some embodiments, the interposer die may be formed with a more flexible geometry. FIG. 4G shows a cross-sectional view of intermediate structures for a method of manufacturing a semiconductor structure 401, in accordance with some embodiments. The semiconductor structure 401 includes at least two interposer dies 400C and 400D. Referring to FIGS. 4F and 4G, the interposer die 400C or 400D does not include any TSV in the substrate 102. In an embodiment, the substrate 102 is formed of a semiconductor material only, such as bulk silicon. In an embodiment, the substrate 102 is free of any TSV. In an embodiment, the substrate 102 is free of any active components (e.g., a transistor or a diode) or passive components (e.g., a resistor, a capacitor or an inductor). In an embodiment, the interposer die 400C or 400D is electrically coupled to other components through the RDL 430 only. The substrate 102 electrically disconnects the RDL 430 from the components below the substrate 102. The RDL 430 may be electrically coupled to the components below the substrate 102 through other electrical connections. In some embodiments, the interposer dies 400C and 400D do not include the protective structure 312, the under bump metallization 322, the metallization layer 324 and the external connector 326 that are present in the interposer die 400A or 400B. As will be illustrated in the following paragraphs, when the interposer die 400C or 400D is integrated into a semiconductor package device, the substrate 102 may be thinned or removed when it is coupled with other elements in the package device. The overall thickness of the package device is thus further reduced without impacting the device performance. As such, the proposed interposer die may be formed with different heights, e.g., interposer dies 400A through 400D, to adapt to different package specifications with varying package thicknesses.

In the following, various interposer dies as illustrated and described above are incorporated into the manufacturing of a semiconductor package device. Features and configurations of each of the standalone interposer dies as exemplified in the preceding paragraphs are applicable to the interposer dies described in the subsequent paragraphs. FIGS. 5A through 5K are cross-sectional views of intermediate structures for a method of manufacturing a semiconductor package device 500, in accordance with some embodiments.

Figure 5A:
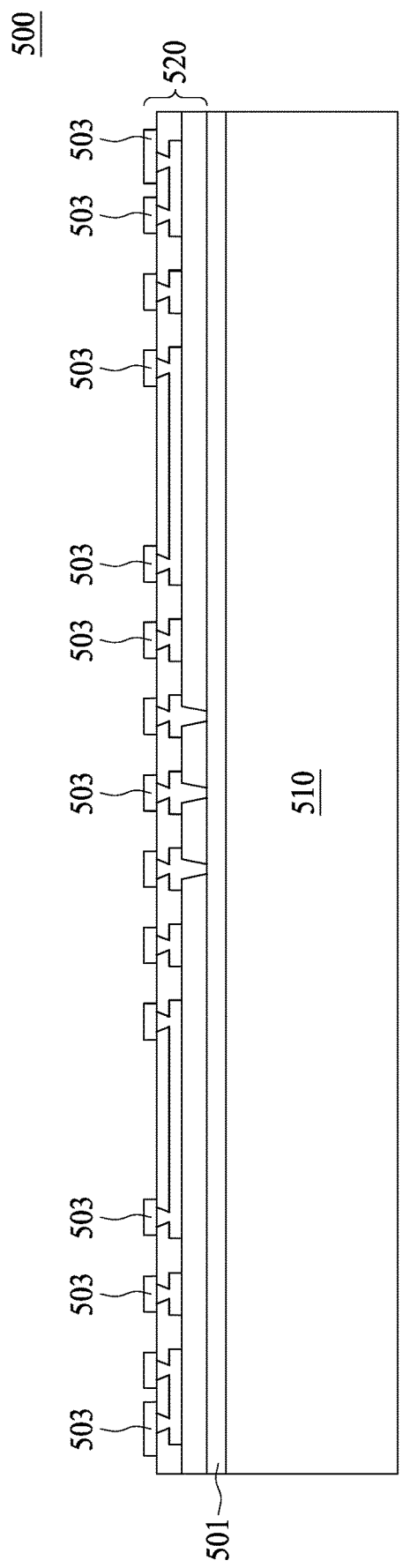
FIGS. 5A through 5K are cross-sectional views of intermediate structures for a method of manufacturing a semiconductor package device, in accordance with some embodiments.

In FIG. 5A, a carrier 510 is received or provided. The carrier 510 may comprise, for example, silicon based materials, such as glass, silicon oxide, aluminum oxide, ceramic materials, or combinations thereof. Next, an adhesive layer 501 is formed over the carrier 510. The adhesive layer 501 is configured to assist in the adherence between the carrier 510 and the overlying structures. In some embodiments, the adhesive layer 501 may comprise ultraviolet glue or other suitable materials.

An RDL 520 is formed over the adhesive layer 501. The RDL 520 layer may comprise alternating layers of dielectric materials and conductive metal lines and vias, in which the metal lines are interconnected by vertically extending metal vias. In some embodiments, the RDL 520 is similar to the RDLs 130 or 430 previously discussed. The RDL 520 may be formed by operations such as lithography operation, etching, deposition, or the like. Several contact pads 503 are formed in an uppermost metal layer of the RDL 520 and are exposed through the surface of the RDL 520.

Figure 5B:
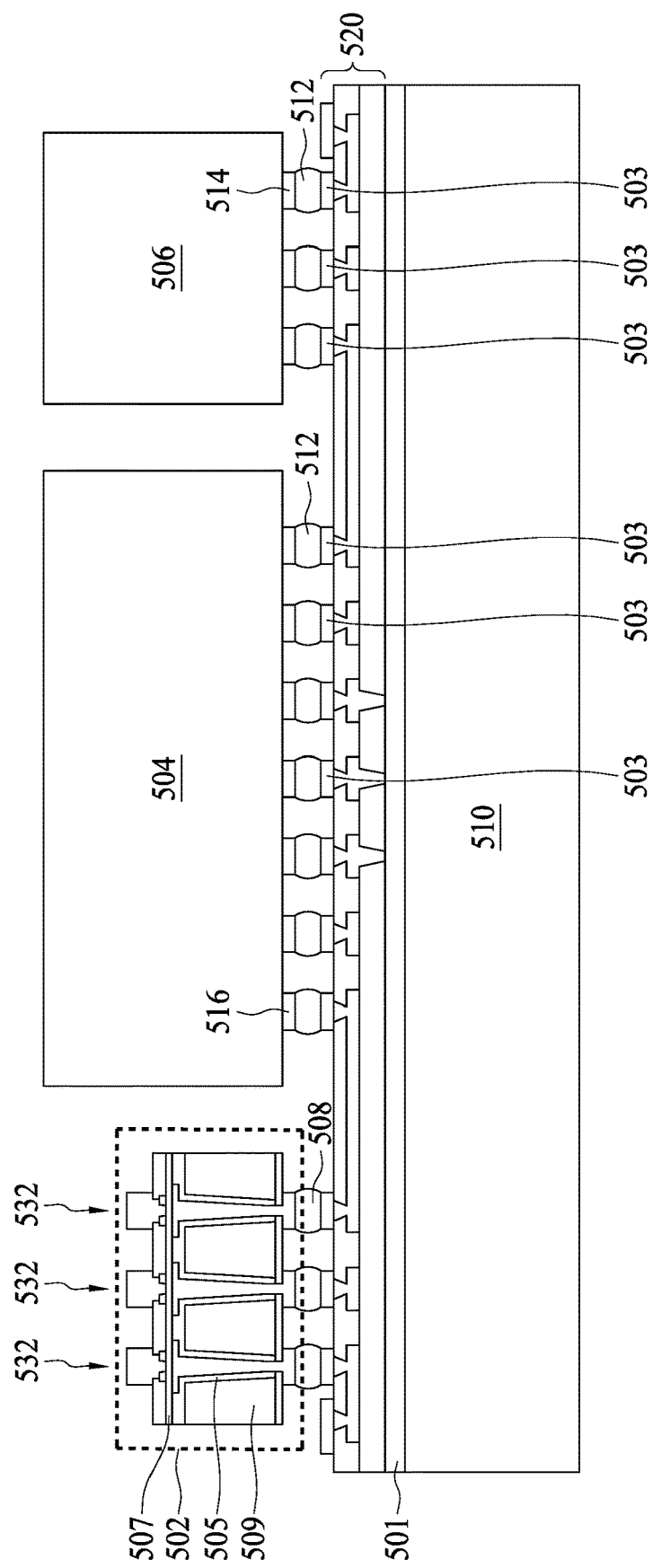

FIG. 5B shows the bonding of a semiconductor die 502 to the RDL 520. In some embodiments, the semiconductor die 502 may be a TSV die or an interposer die 100, 200, 300 or 400 as previously discussed. In some embodiments, the semiconductor die 502 may be an interposer die as illustrated in FIG. 1D, 2D, 3H, 4F or 4G. In some embodiments, the interposer die 502 may be an interposer die including TSVs 505 with corresponding caps 532 and external connectors 508. In some embodiments, neither passive electrical elements (e.g., capacitor, resistor, inductor, etc.) nor active electrical elements (e.g., field effect transistors, bi-polar junction transistors, etc.) are embedded in the semiconductor die 502. In some embodiments, the interposer die 502 is bonded to the RDL 520 through the external connectors 508 where the external connectors 508 can be compared to the external connectors 126 or 326 as illustrated in FIG. 1D, 2D, 3H, or 4F. In some embodiments, the interposer die 502 is bonded in such a manner that the caps 532 face away from the RDL 520. In some embodiments, the TSV 505 has a sidewall tapering from near the cap 302 to near the external connector 508. In an embodiment, the interposer die 502 includes an RDL 507 between the TSV 505 and the cap 532. The TSV 505 may taper from the RDL 507 to the external connector 508.

Additionally, a first semiconductor die 504 and a second semiconductor die 506 are bonded to the RDL 520. In some embodiments, the first semiconductor die 504 or the second semiconductor die 506 is a memory die, a logic die, an SOC (system on a chip) die, or other type of semiconductor die including an electrical circuit designed to perform a specific task. In some embodiments, the first semiconductor die 504 and the second semiconductor die 506 have contact pads 514 coupled to external connectors 512. Moreover, the first semiconductor die 504 and the second semiconductor die 506 are bonded to the bond pads 503 of RDL 520 through corresponding external connectors 512. The external connectors 512 share similar structures and manufacturing operations with the external connectors 126 and 326. In some embodiments, the external connector 512 may be contact bumps such as C4 bumps, ball grid array bumps or microbumps. In some embodiments, the first semiconductor die 504 and the second semiconductor die 506 are spaced apart from the interposer die 502 and are electrically coupled to the interposer die 502 through the RDL 520.

The connection configurations of the first semiconductor die 504 or the second semiconductor die 506 may vary dependent upon the gap between the RDL 520 and the semiconductor die 504 or 506. In an embodiment, when the gap between the RDL 520 and the semiconductor die 504 or 506 is too small to accommodate an external connector 512, the semiconductor die 504 or 506 is coupled to the RDL 520 through the respective contact pads 516 or 514 directly. In some embodiments, the semiconductor die 504 or 506 is coupled to the RDL 520 through a contact pad formed of a single material.

Figure 5C:
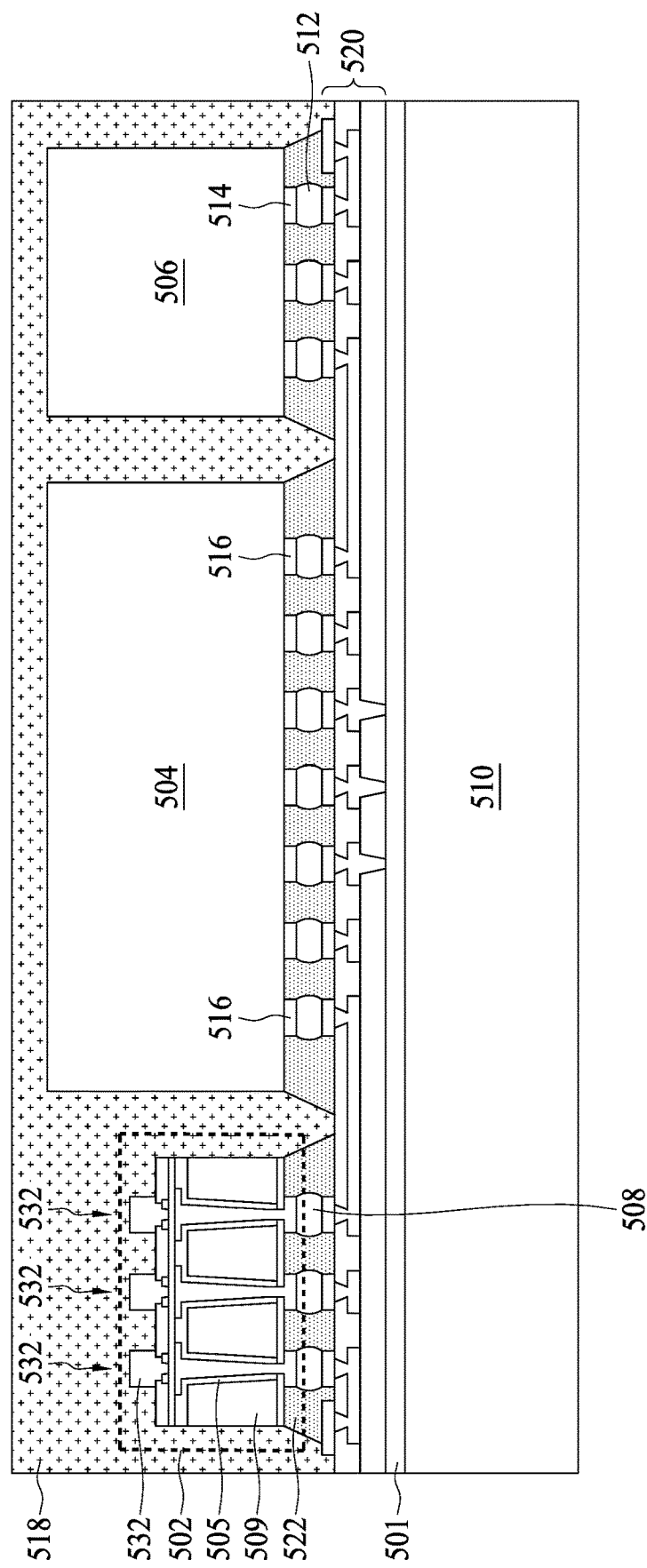

In FIG. 5C, an encapsulating material 522 encapsulates or surrounds the external connectors 508 of the semiconductor die 502 and the external connectors 512. In some embodiments, the encapsulating material 522 further fills the gaps between the RDL 520 and the dies 502, 504 and 506. In some embodiments, the encapsulating material 522 forms an inclined edge extending from the RDL 520 to the bottom of each of the dies 502, 504 and 506. The encapsulating material 522 may include a molded underfill material. The encapsulating material 522 may be formed of epoxy, deformable gel, silicon rubber, thermal plastic polymer, combinations thereof or the like. In other embodiments, the encapsulating material 522 may include a filler material. The encapsulating material 522 may be formed by dispensing, injecting, or spraying techniques.

Subsequently, an encapsulating material 518 surrounds the encapsulating material 522, the external connectors 508 and 512, the interposer die 502, the semiconductor dies 504 and 506, and the RDL 520. In some embodiments, the molding material 518 fills the gaps between the RDL 520 and the dies 502, 504 and 506. In some embodiments, the encapsulating material 518 forms an edge aligned with the edge of the RDL 520. The encapsulating material 518 may include a molded underfill material. In some embodiments, the encapsulating material 518 includes a molding compound such as polyimide, PPS, PEEK, PES, a molding underfill, an epoxy, a resin, or a combination thereof. The encapsulating material 518 may be formed by dispensing, injecting, or spraying techniques. In some embodiments, the encapsulation operation may be performed in a molding device with a cavity. The encapsulating material 518 may be dispensed within the cavity before the cavity is hermetically sealed, or alternatively may be injected into the sealed cavity through an injection port.

Figure 5D:
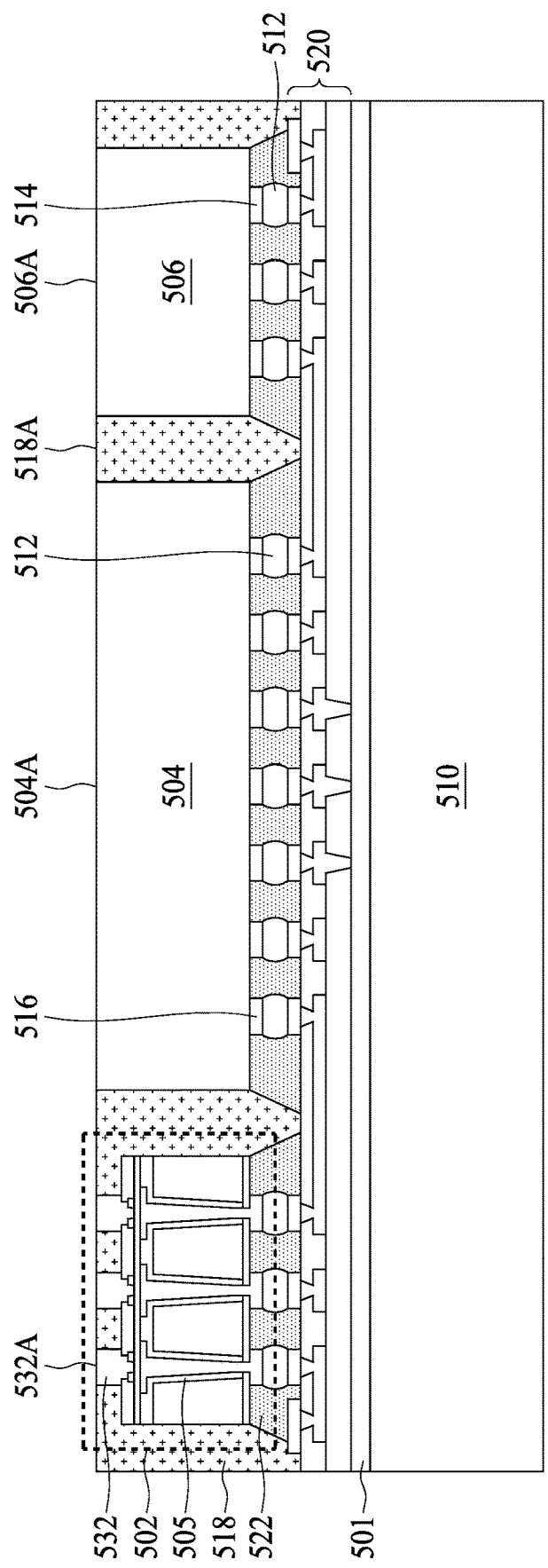

Once the molding material 518 has been formed, a thinning or planarization process may be performed for removing excess encapsulating materials 518 as illustrated in FIG. 5D. The thinning and planarization operation may be performed using a mechanical grinding or chemical mechanical polishing (CMP) method. In some embodiments, a top surface 532A of the cap 532 in the interposer die 502 is exposed through the encapsulating material 518. Furthermore, the semiconductor dies 504 and 506 are thinned. Thus, a top surface 518A of the encapsulating material 518 is leveled with the surfaces 504A and 506A of the semiconductor dies 504 and 506 respectively. As a result, the upper surfaces 532A, 518A, 504A and 506A are substantially level with one another.

Figure 5E:
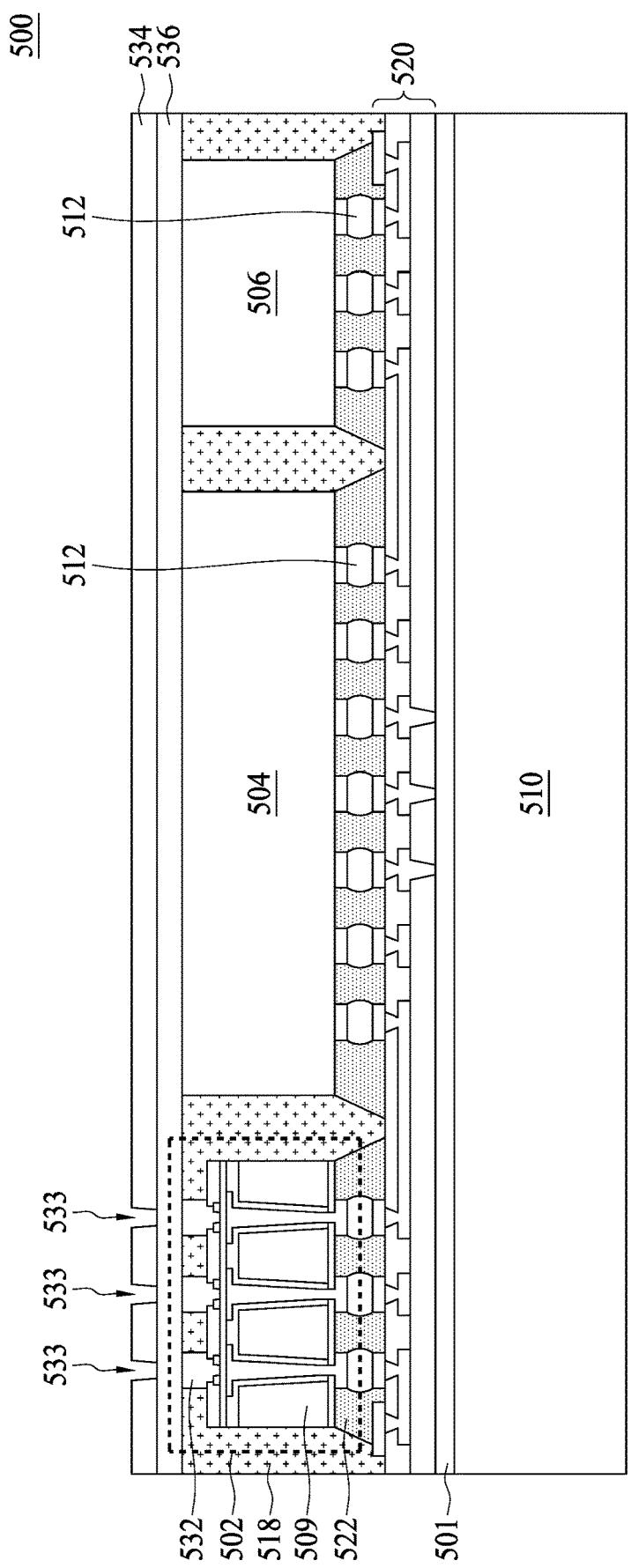
Figure 5F:
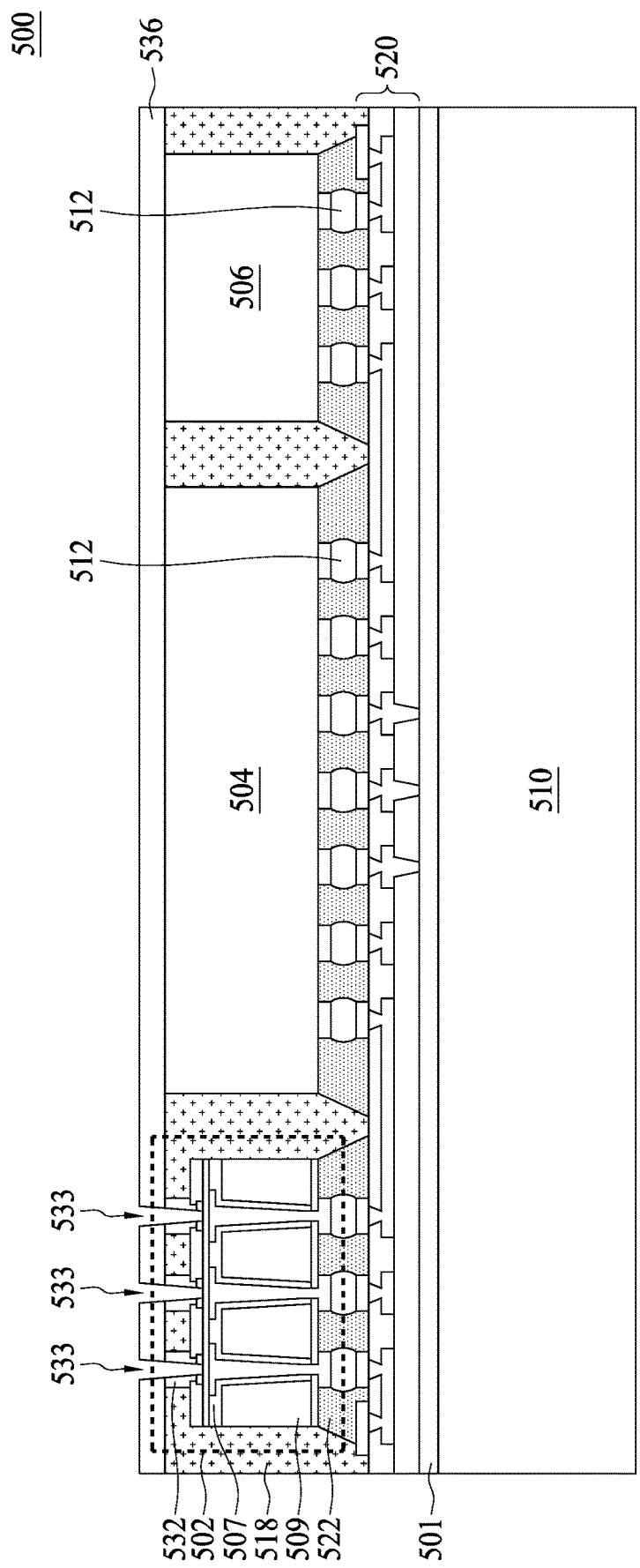
Figure 5G:
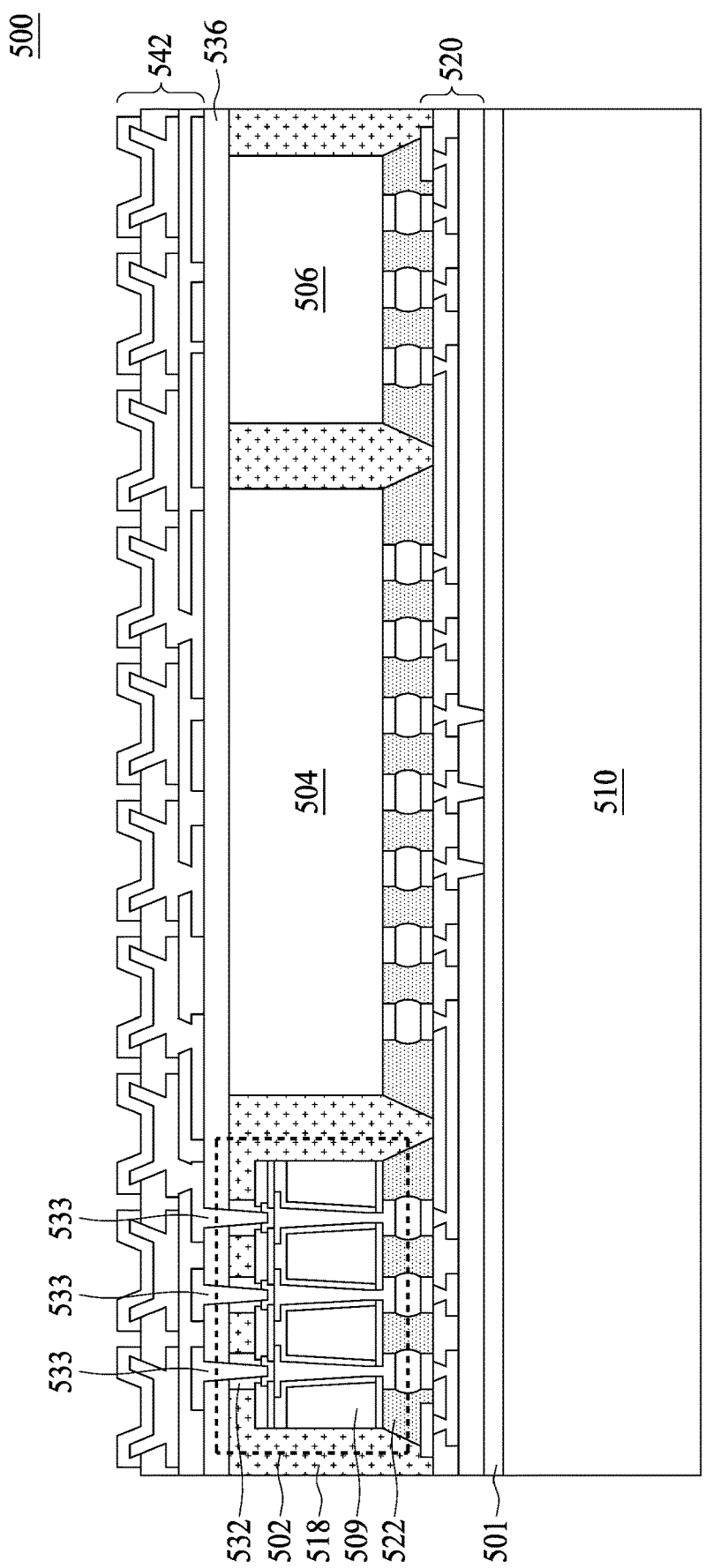

FIGS. 5E through 5G illustrate the formation of the conductive vias 533 coupling the interposer die 502. Referring to FIG. 5E, a protection layer 536 is deposited over the dies 502, 504, and 506, and the encapsulating material 518. In some embodiments, the protection layer 536 includes a dielectric material, such as silicon nitride, silicon oxide, silicon oxynitride, or the like. In some embodiments, the protection layer 536 includes a polymeric material, such as polyimide (PI), polybenzoxazole (PBO), benzocyclobuten (BCB), epoxy, silicone, acrylates, nano-filled phenolic resin, siloxane, a fluorinated polymer, polynorbornene, or the like. In some embodiments, the protection layer 536 is formed of a same material as the cap 532. Subsequently, a mask layer 534 is deposited over the protection layer 536. The mask layer 534 may be a photoresist layer, and is patterned to form vias 533 above the caps 532. In some embodiments, the mask layer 534 and the protection layer 532 are differentiable by an etching selectivity. In some embodiments, the etching selectivity between the protection layer protection layer 532 and the mask layer 534 is in a range of about 3 to 10. In some embodiments, the width of the via 533 is less than the width of the underlying cap 532.

Referring back to FIG. 3C, the bottom portion of the metallization layer 320 has a width W1 less than a width W2 of the upper surface of the TSV 104. In the present embodiment in FIG. 5E, a via 533 is disposed over an upper surface of a corresponding TSV 505 and the via 533 may be formed through the width W1 of the metallization layer 320. Thus, a width of the via 533 may be less than a width of the underlying TSV 505.

Next, in FIG. 5F, an etching operation is performed to remove a portion of the protection layer 532 such that the via 533 runs through the cap 532 and reaches the bond pad feature of the die 502. The etching operation may be performed by a dry etching or a wet etching operation. In some embodiments, the extended via 533 runs through the dielectric material of the cap 532. Once the via 533 is formed, the mask layer 534 is stripped or etched away.

Next, a conductive material is filled in the vias 533 for forming conductive vias 533, as shown in FIG. 5G. The conductive material may include copper, tungsten, aluminum, silver, combinations thereof, or the like. An RDL 542 is then formed over the protection layer 536. The conductive vias 533 couple the interposer die 502 with the RDL 542. In some embodiments, the conductive vias 533 are formed during the formation of the RDL 542 and may be regarded as one conductive layer of the RDL 542.

In some embodiments, the TSVs 505 as formed in the semiconductor die 502 has an aspect ratio between about 8 to 12. In some embodiments, the TSVs 505 formed in the semiconductor die 502 have an aspect ratio smaller than existing methods in which conductive through-interposer-vias are formed in conjunction with other features of a fan-out packaged devices. Thus, the TSVs 505 may be formed with a relatively smaller pitch. In some embodiments, the TSVs 505 have a pitch less than about 80 μm. In some embodiments, the TSVs 505 have a pitch from about 60 μm to about 80 μm. In some embodiments, the TSVs 505 have a pitch from about 40 μm to about 60 μm. In some embodiments, the TSVs 505 have a pitch from about 30 μm to about 40 μm. Moreover, the TSV 505 formed in the interposer die 502 has a width (e.g., as depicted as a width W2 in FIG. 3C) relatively less than the existing methods. In some embodiments, the TSV 505 has a width less than about 30 μm. In some embodiments, the TSV 505 has a width from about 10 μm to about 30 μm. In some embodiments, the TSV 505 has a width from about 10 μm to about 15 μm.

In existing package devices, the TSVs 505 may be incorporated into the semiconductor dies 504 and 506. As the semiconductor dies 504 and 506 are usually designed and manufactured with more advanced techniques, separating peripheral circuits (e.g., conductive vias 505) in the semiconductor dies 504 and 506 from core circuits and implementing those peripheral circuits in another die would reduce the die size and manufacturing cost in manufacturing the semiconductor dies 504 and 506. In addition, a better production yield for the semiconductor die 504 or 506 may be achieved.

Figure 5H:
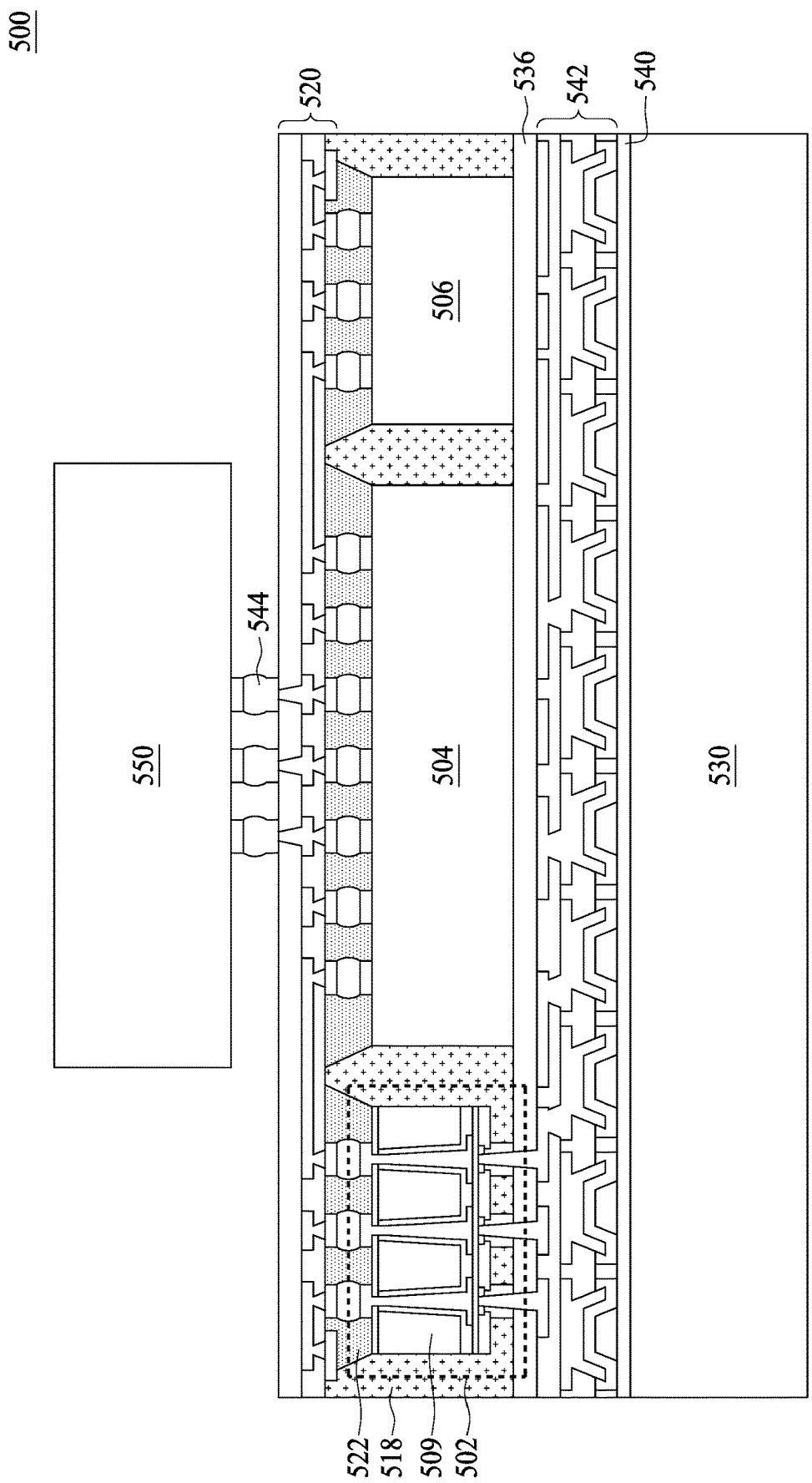

In FIG. 5H, an adhesive layer 540 is formed over the RDL 542. Next, a carrier 530 is attached to the adhesive layer 540. In some embodiments, the carrier 530 may be a glass carrier, a ceramic carrier, or the like. Next, the semiconductor structure 500 is flipped. The carrier 510 is removed or detached from the semiconductor structure 500. In some embodiments, the adhesive layer 501 is also removed or cleaned. The RDL 520 is exposed accordingly. A semiconductor die 550 is bonded to the RDL 520 through external connectors 544. In some embodiments, the semiconductor die 550 has several contact pads electrically coupled to the external connectors 544. The semiconductor die 550 may be a memory die, a logic die, or an SOC die. In some embodiments, the external connectors 544 may be C4 bumps, ball grid array bumps or microbumps. In the depicted embodiment, the interposer die 502 is vertically offset from the semiconductor die 550. In an embodiment, the interposer die 502 may be fully covered by the semiconductor die 550 or partially overlap the semiconductor die 550.

The interconnection of the semiconductor die 550 with the semiconductor dies 504 and 506 enables a front side of the semiconductor die 550 connected with front sides of the underlying dies 504 and 506 in a face-to-face fashion. Such arrangement may reduce the effective length of connection routes of the interconnections and mitigate or decrease undesired effects such as signal delay or power consumption.

Figure 5I:
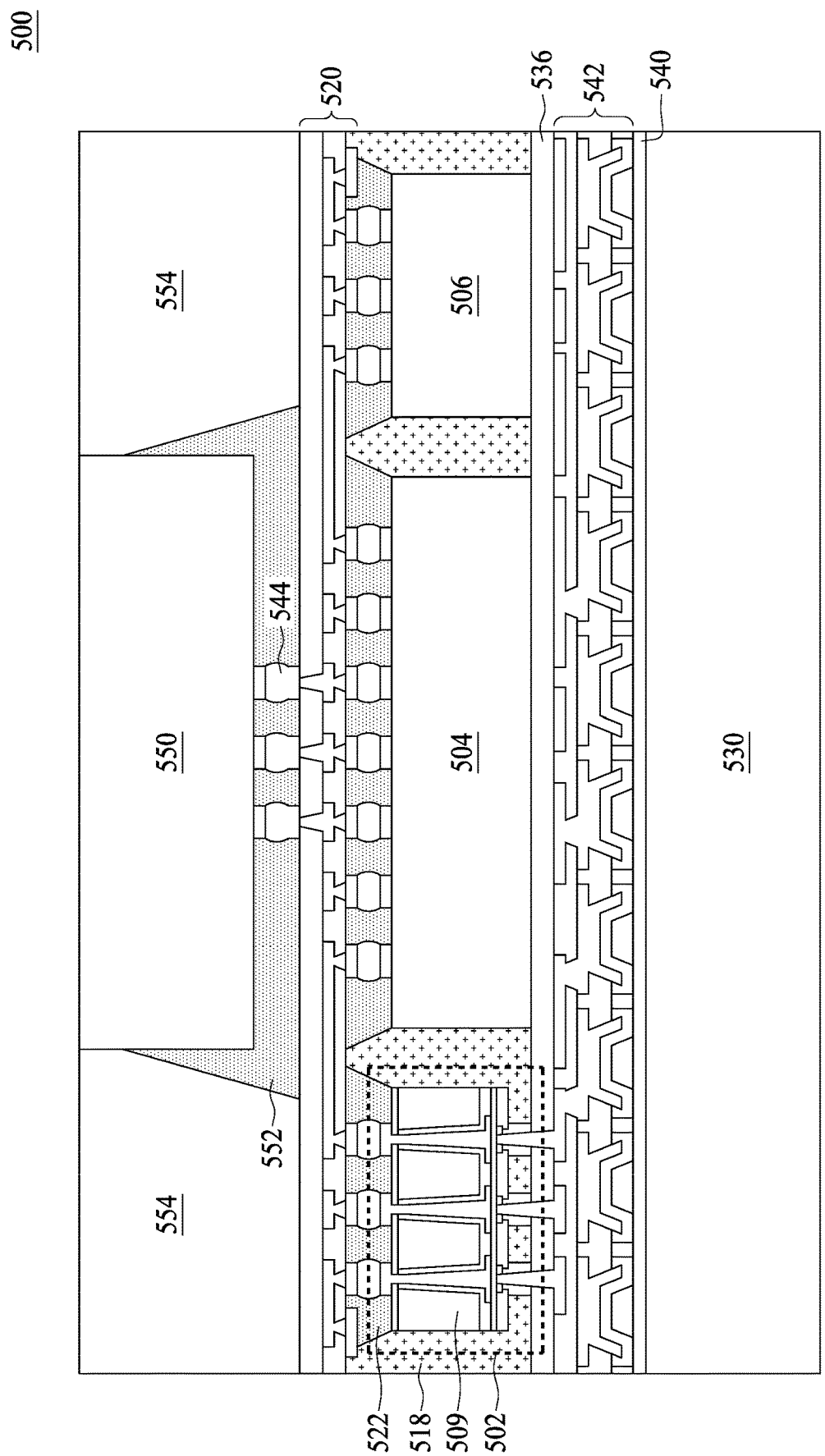

FIG. 5I shows the formation of encapsulating materials 552 and 554. The encapsulating material 552 surrounds the external connectors 544. In some embodiments, the encapsulating material 552 fills the gaps between the RDL 520 and the die 550. In some embodiments, the encapsulating material 552 extends upward from a bottom of the semiconductor die 550 and covers a portion of the edge of the semiconductor die 550. In some embodiments, the encapsulating material 552 forms an inclined edge extending from the semiconductor die 550 to the upper surface of the RDL 520. The encapsulating material 552 may include a molded underfill material. The molded underfill material may be formed of epoxy, deformable gel, silicon rubber, thermal plastic polymer, combinations thereof, or the like. In other embodiments, the encapsulating material 552 may include a filler material.

The encapsulating material 554 encapsulates the encapsulating material 552, the external connectors 544, the semiconductor die 550, and the RDL 520. In some embodiments, the encapsulating material 554 is aligned with the edge of the RDL 520. The encapsulating material 554 may include a molded underfill material. In some embodiments, the encapsulating material 554 includes a molding compound such as polyimide, PPS, PEEK, PES, a molding underfill, an epoxy, a resin, or a combination thereof. In some embodiments, a thinning or planarization process may be performed for removing excess encapsulating materials 554 or thinning the semiconductor die 550. Accordingly, respective upper surfaces of the semiconductor die 550 and the encapsulating material 554 are substantially level with each other.

Figure 5J:
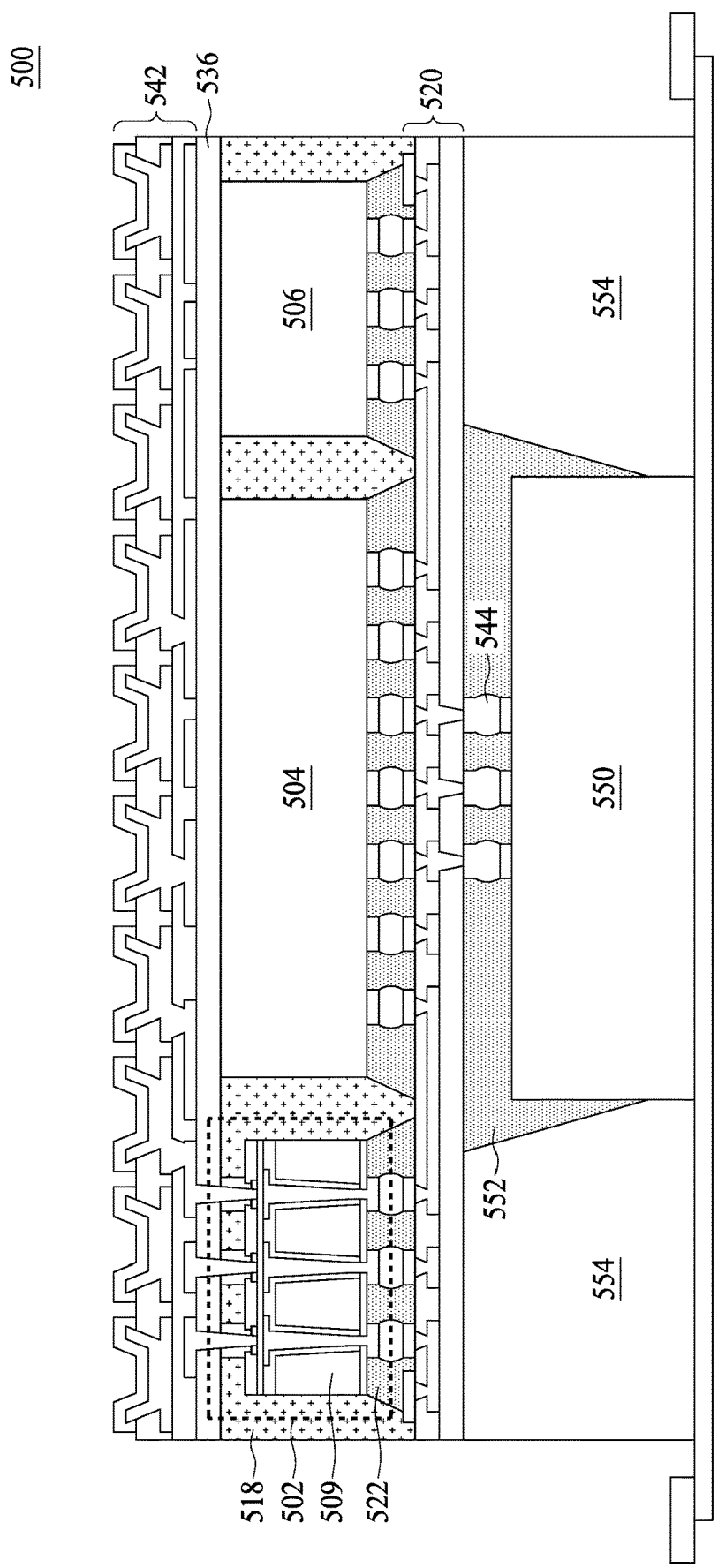
Figure 5K:
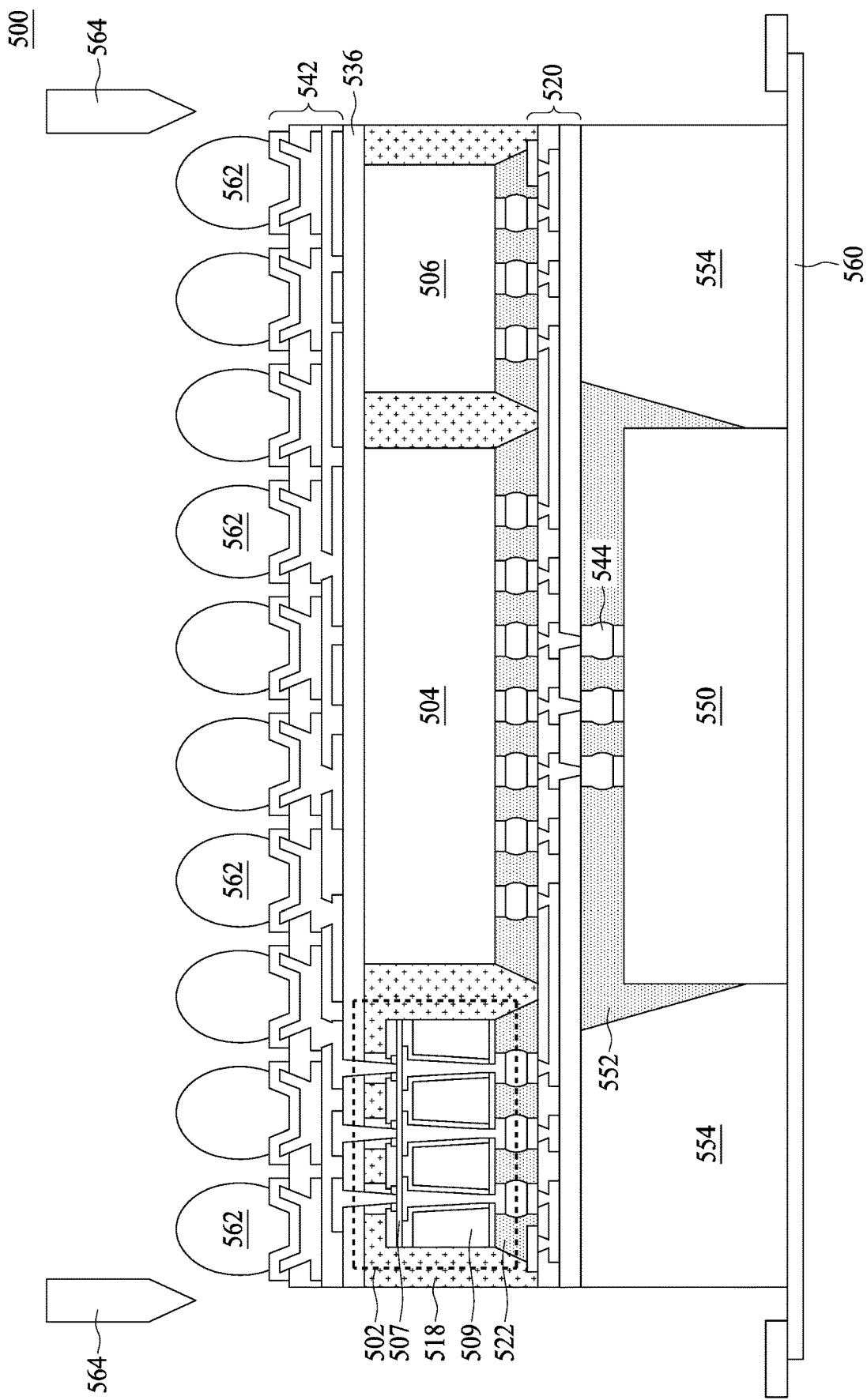

Referring to FIG. 5J, the semiconductor structure 500 is flipped and placed on a tape 560. The carrier 530 is removed or detached from the semiconductor structure 500. In some embodiments, the adhesive layer 540 is also cleaned. The RDL 542 is exposed accordingly. In FIG. 5K, external connectors 562 are formed on the RDL 542. In some embodiments, the external connectors 562 may be contact bumps such as C4 bumps, ball grid array bumps or microbumps. A singulation operation is performed to divide the semiconductor structure 500 into individual package devices 500. In some embodiments, a laser or a die saw 564 is employed to perform the singulation operation.

Figure 2D:
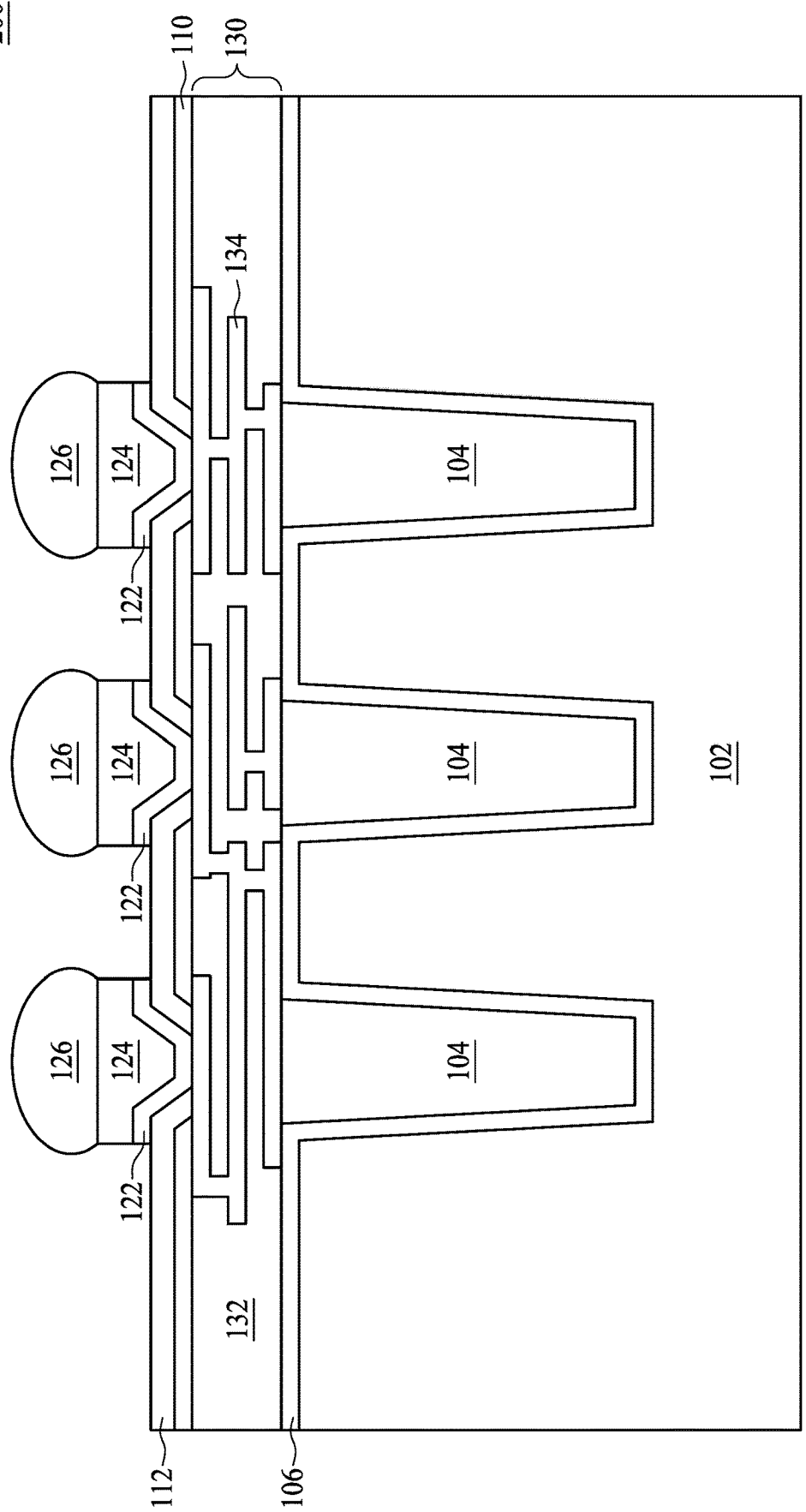
Figure 6:
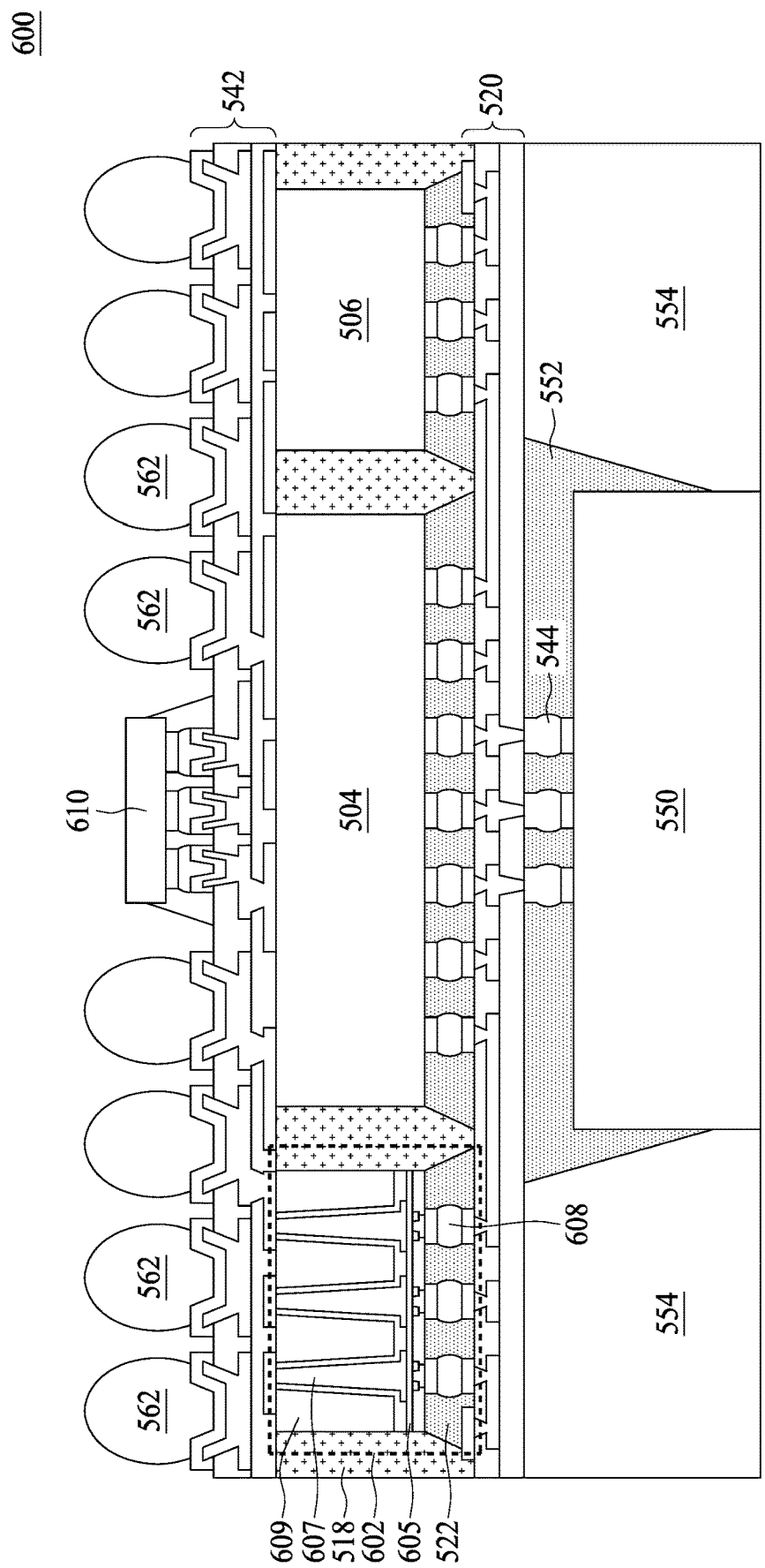
FIG. 6 is a schematic cross-sectional view of a semiconductor package device, in accordance with some embodiments.

FIG. 6 is a schematic view of a semiconductor package device 600, in accordance with some embodiments. The semiconductor package device 600 is similar to the semiconductor package device 500 in many aspects. In addition, comparing FIG. 6 with FIG. 5K, the semiconductor package device 600 includes a semiconductor die 602 which is similar to the semiconductor die 502 and may be an interposer die. Specifically, the semiconductor die 602 is bonded to the RDL 520 through the external connectors 508. Moreover, the semiconductor die 602 may be an interposer die 100 or 200 as illustrated in FIGS. 1D and 2D, respectively, in which external connectors 608 may correspond to the external connectors 126. The semiconductor die 602 has several TSVs 607 contacting and electrically coupling to the RDL 542. In some embodiments, in comparison to the cap 532 of the interposer die 502, a substrate 609 of the interposer die 602 is in contact with the RDL 542 without any intermediate structures or caps. Referring back to FIGS. 1D and 2D, it may be observed that if the interposer die 100 or 200 is applied to the semiconductor die 602, a depth of the substrate 102 (or 609) beneath the bottom of the TSV 104 (or above the TSVs 607) has been removed. In operation, the excess depth of the substrate 609 between the TSV 607 and the upper surface of the substrate 605 can be thinned or etched in a thinning operation similar to those described with reference to FIG. 5D.

In some embodiments, the semiconductor die 602 includes an internal RDL 605 between the TSVs 607 and the external connectors 508. The internal RDL 605 is similar to the RDL 130 as illustrated in FIG. 2D. In some embodiments, the TSV 607 has a sidewall tapered from a lower end near the internal RDL 605 or the external connectors 508 to an upper end near the RDL 542.

In some embodiments, the semiconductor package device 600 further includes an integrated passive device (IPD) 610 disposed on the RDL 542. The IPD 610 may include passive components such as a capacitor, an inductor, a resistor, or the like. The disposition of the IPD 610 above the RDL 542 which is external to the semiconductor dies 504 and 506 and external to the encapsulated space within the encapsulating material 518 can further reduce the package size and improve the circuit layout performance.

Figure 7A:
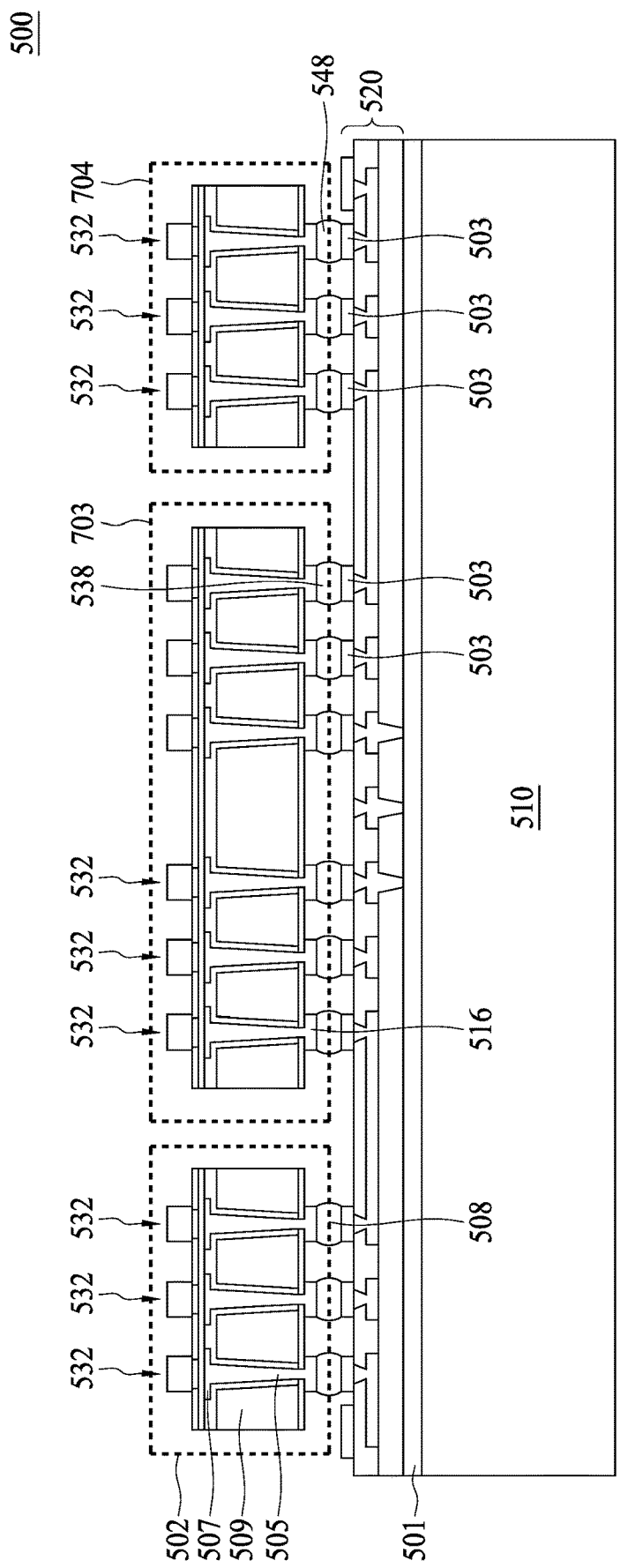
FIGS. 7A through 7F are cross-sectional views of intermediate structures for a method of manufacturing a semiconductor package device, in accordance with some embodiments.

FIGS. 7A through 7F are cross-sectional views of intermediate structures for a method of manufacturing a semiconductor package device 700, in accordance with some embodiments. Referring to FIG. 7A, the forming operations of the adhesive layer 501, the RDL 520 and the interposer die 502 are similar to the operations with reference to FIG. 5B. Further, in the present embodiment, the semiconductor dies 504 and 506 are replaced with other interposer dies 703 and 704, respectively. The interposer dies 703 and 704 may be any of the interposer dies 100, 200, 300 and 400 previously discussed. The interposer dies 703 and 704 are bonded with the RDL 520 through respective external connectors 538 and 548. In some embodiments, the interposer dies 703 and 704 comprise caps 532 on a side opposite the RDL 520.

Figure 7B:
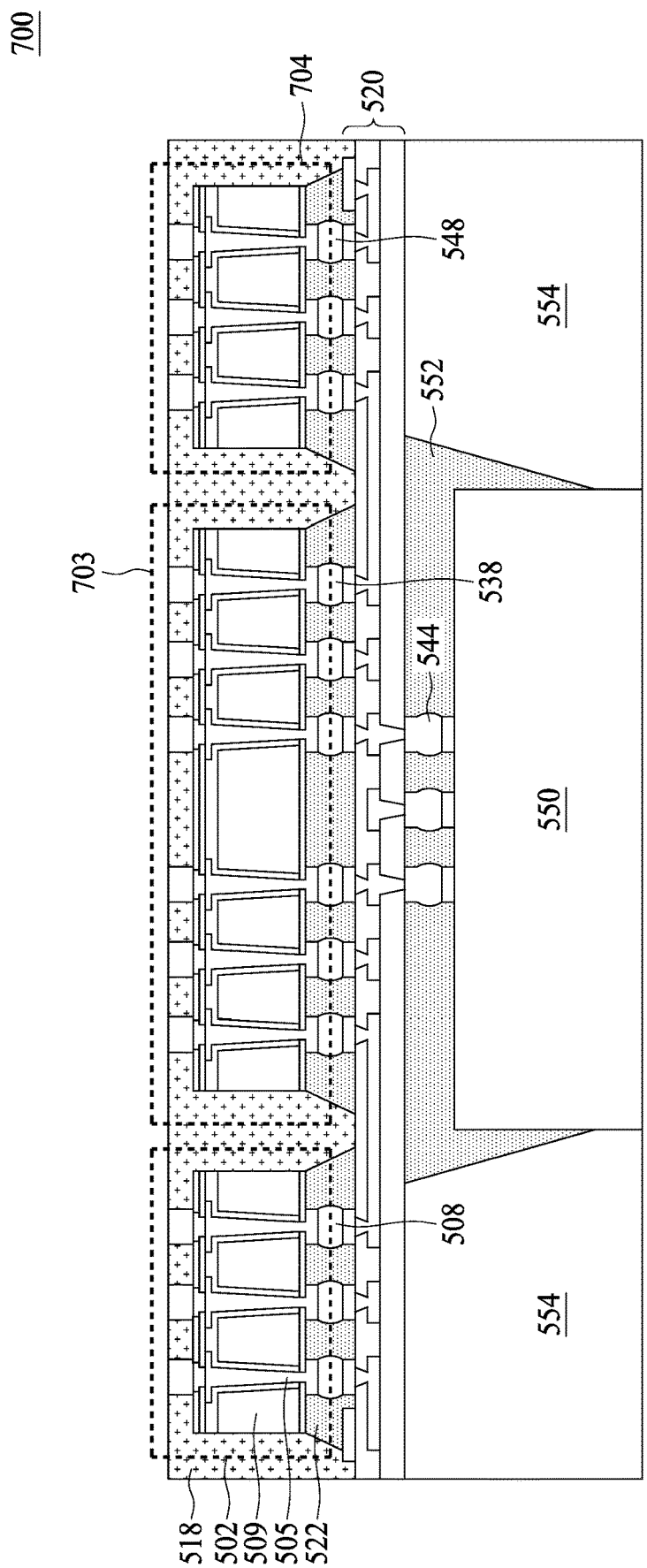

Next, as illustrated in FIG. 7B, the encapsulating materials 522 and 518 are formed to encapsulate the semiconductor device 700 in a fashion similar to that illustrated with reference to FIG. 5C. The encapsulating material 522 encapsulates or surrounds the external connectors 508, 538 and 548. In some embodiments, the encapsulating material 522 further fills the gaps between the RDL 520 and the interposer dies 502, 703 and 704. In some embodiments, the encapsulating material 522 forms an inclined edge extending from the RDL 520 to the bottom of each of the dies 502, 703 and 704. Subsequently, the encapsulating material 518 surrounds the encapsulating material 522, the external connectors 508, 538 and 548, the interposer dies 502, 703 and 704, and the RDL 520. In some embodiments, the molding material 518 fills the gaps between the RDL 520 and the dies 502, 703 and 704. In some embodiments, the interposer dies 502, 703 and 704 are spaced apart and separated from each other by the encapsulating material 518. A planarization operation is performed to level the upper surface of the encapsulating material 518 by a planarization operation in a manner similar to that illustrated in FIG. 5D.

Subsequently, the semiconductor package device 700 is flipped. The semiconductor package device 700 is bonded and electrically coupled with the semiconductor die 550 through the RDL 520 and external connectors 544. Further, encapsulating materials 552 and 554 are applied to encapsulate the semiconductor die 550 and the external connectors 544. The above-mentioned operations and structures are similar to the step illustrated in FIG. 5H.

Figure 7C:
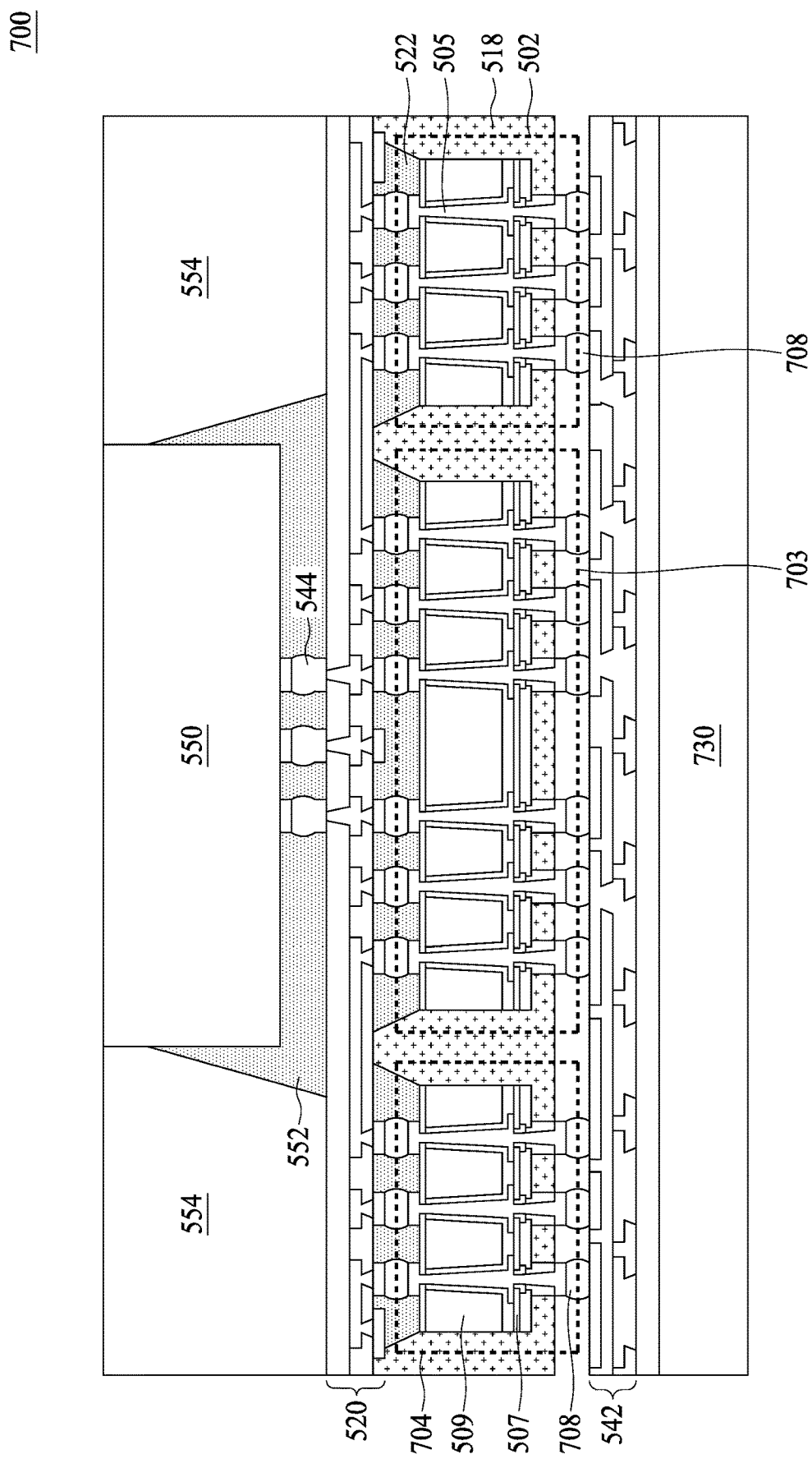
Figure 7D:
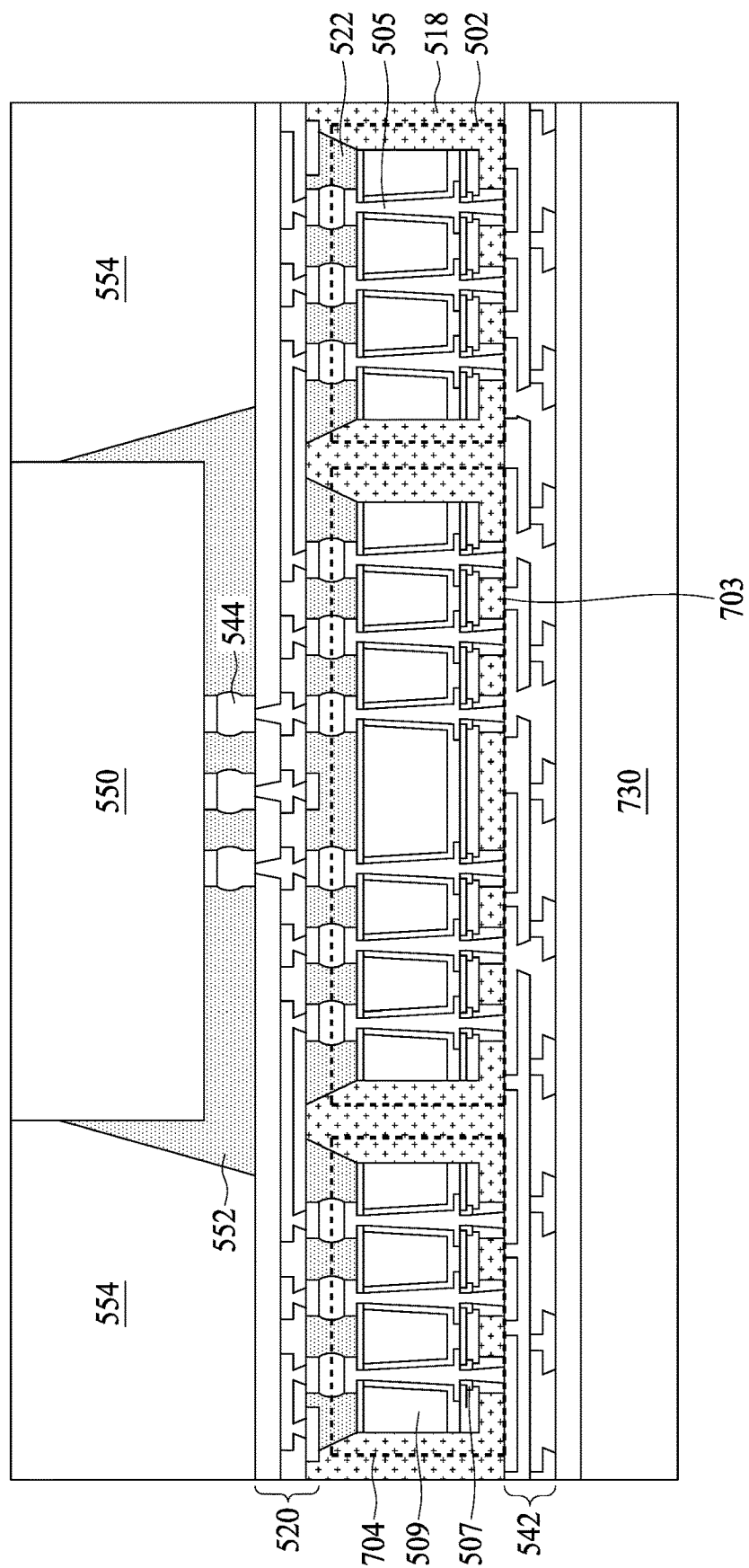

Referring to FIG. 7C, the RDL 542 is formed on a separate carrier 730. Additionally, the semiconductor package device 700 in FIG. 7B is bonded with the RDL 542 through external connectors 708. In some embodiments, the external connectors 708 are initially formed on the interposer dies 502, 703 and 704 and then bonded with the RDL 542. The forming of the electrical connections including the bond pads and conductors through the caps 532 can be referred to, for example, the operations illustrated with reference to FIGS. 5E through 5G. FIG. 7D illustrates an alternative arrangement of bonding the RDL 542 with the semiconductor package device 700 in FIG. 7B. The RDL 542 is directly bonded with the interposer dies 502, 703 and 704 in the absence of the external connectors 708.

Figure 7E:
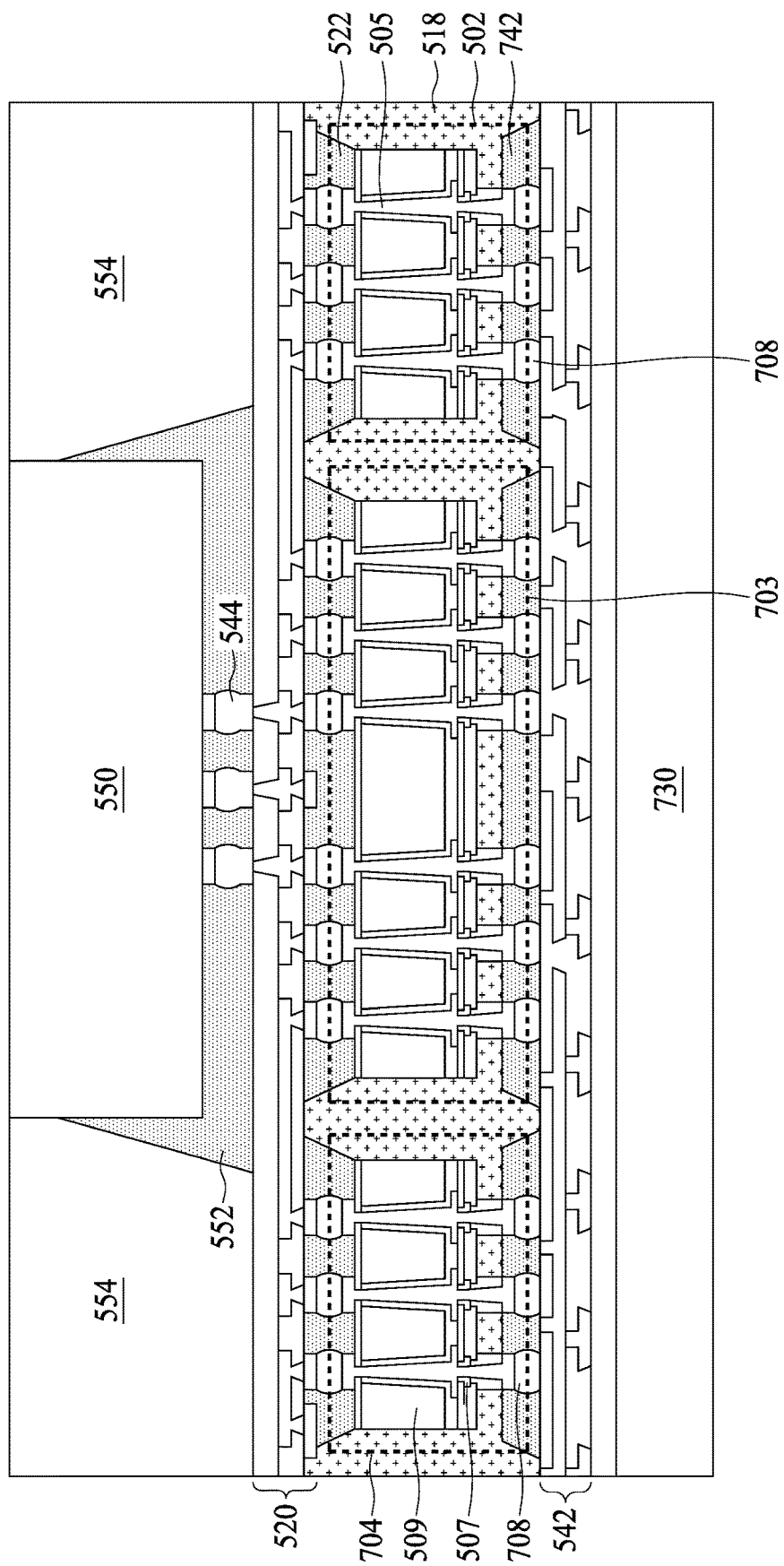
Figure 7F:
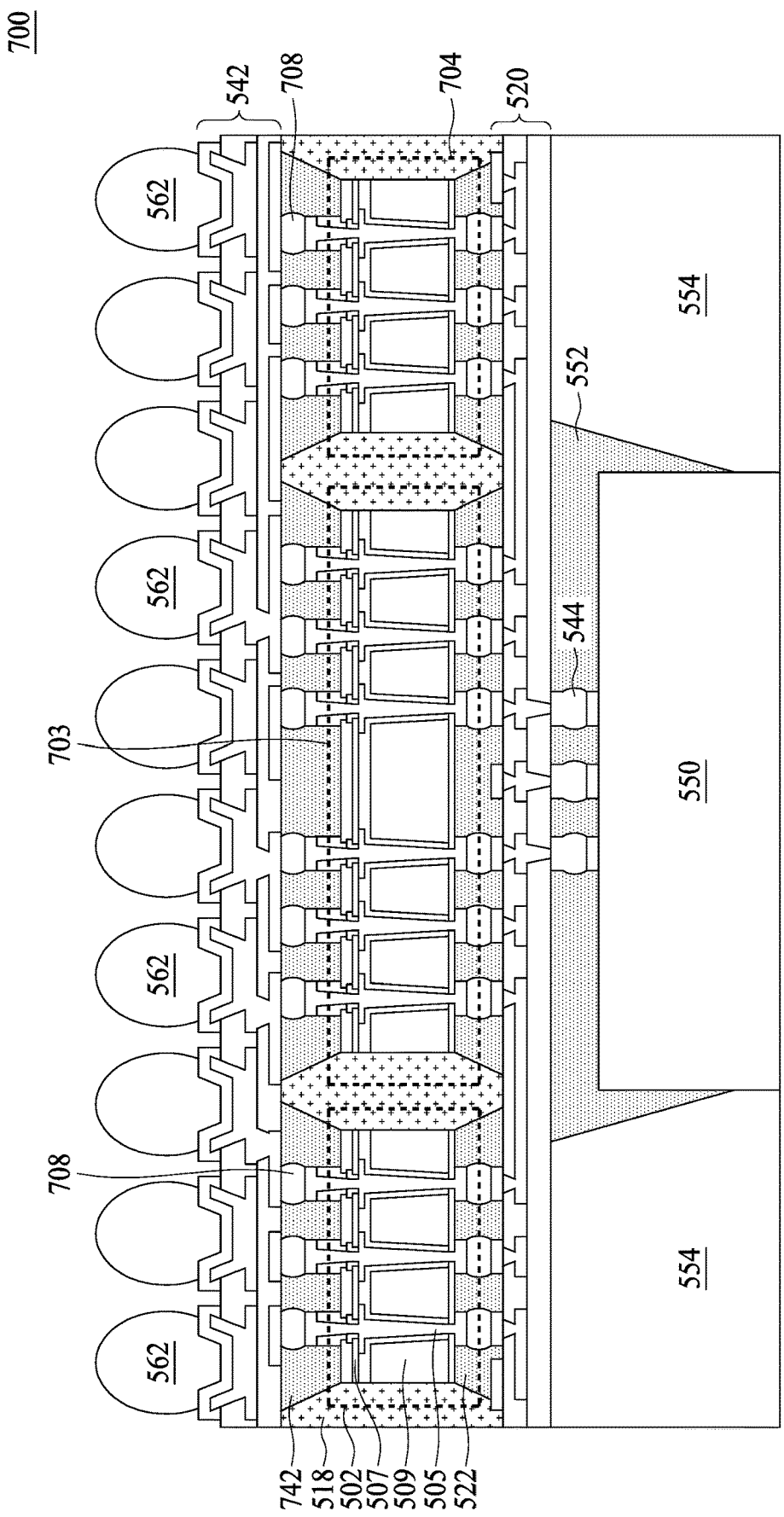

In FIG. 7E, following the operation illustrated in FIG. 7C in which the external connectors 708 are present, a molded encapsulating material 742 encapsulates or surrounds the external connectors 708 of the interposer dies 502, 703 and 704. In some embodiments, the encapsulating material 742 is not employed in the absence of the external connectors 708. Further, an encapsulating material, such as the encapsulating material 518, is applied between the gap between the RDL 542 and the interposer dies 502, 703 and 704 and fills the gaps between separate molded encapsulating materials 742. The encapsulating material 518 is applied following the operation either in FIG. 7C or FIG. 7D, i.e., regardless of whether the external connectors 708 are used. Next, the semiconductor package device 700 is flipped and the carrier 730 is stripped such that the RDL 542 is exposed, as illustrated in FIG. 7F. The external connectors 562 are formed over the RDL 542 in a manner similar to the operation with reference to FIGS. 5J and 5K. In an embodiment, the external connectors 562 are replaced by another semiconductor device.

Referring back to FIGS. 7A and 7B, the RDL 520 may be optional or may include alternative configurations. In some embodiments, the RDL 520 is absent from the semiconductor package device 700. The interposer dies 502, 703 and 704 may be coupled to the semiconductor die 550 through the external connectors directly, e.g., the external connectors 508, 538, 548 or 544. In some embodiments, a multi-layer structure composed of more layers of RDL 520 may be employed. Referring back to FIG. 7F, in some embodiments, the RDL 542 is absent from the semiconductor package device 700. The interposer dies 502, 703 and 704 may be coupled to the external connectors 562 through the intermediate external connectors 708 directly. In some embodiments, a multi-layer structure composed of more layers of RDL 542 may be employed.

Figure 7G:
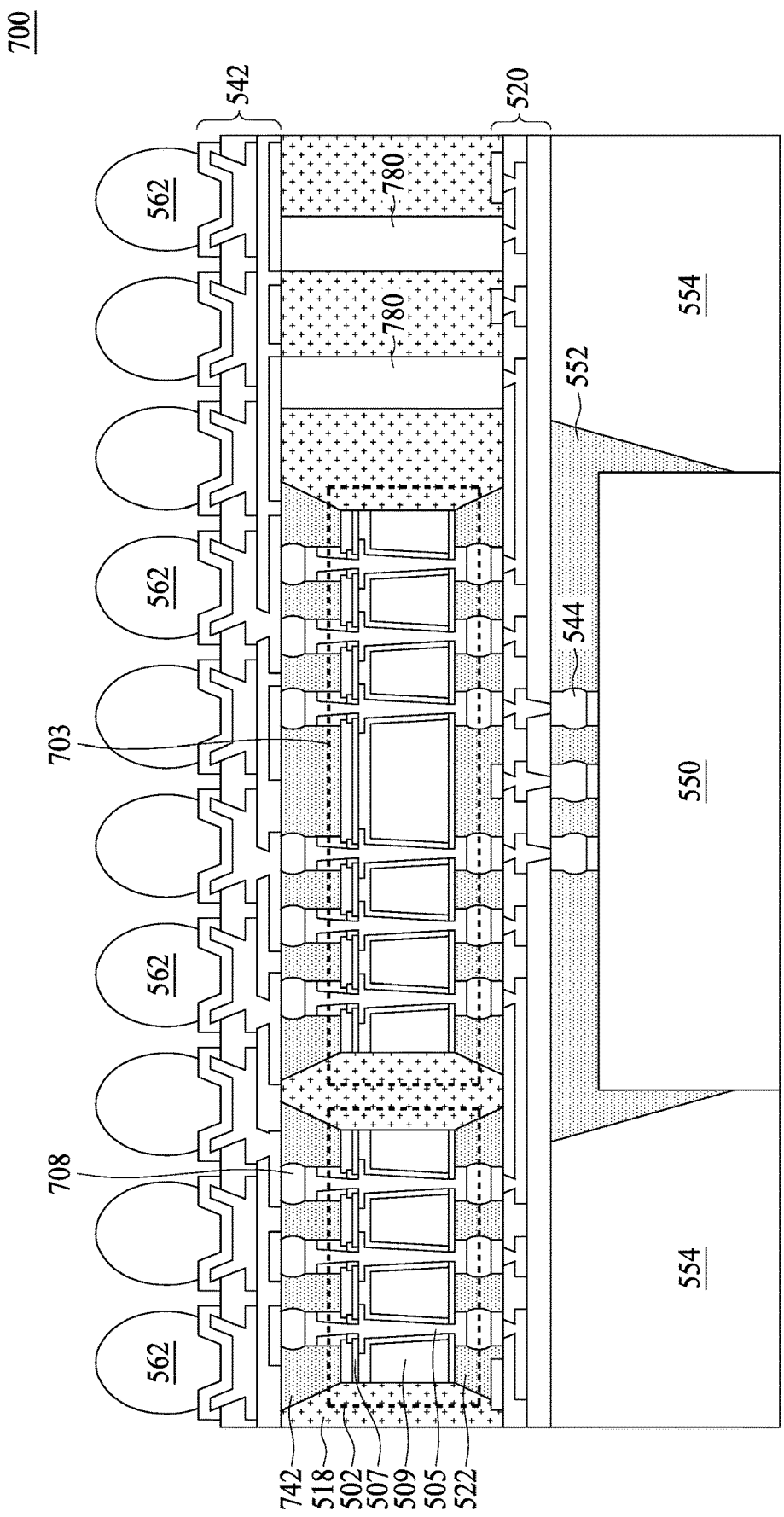
FIG. 7G is a schematic cross-sectional view of a semiconductor package device, in accordance with some embodiments.

FIG. 7G is a schematic cross-sectional view of a semiconductor package device 700, in accordance with some embodiments. The embodiment illustrated in FIG. 7G includes conductive pillars 780 in place of the interposer die 704. The conductive pillars 780 electrically couple the RDL 520 with the RDL 542. In some embodiments, the conductive pillars 780 may have a height substantially equal to the height of the encapsulating material 518. In some embodiments, the conductive pillars 780 include a conductive material, such as copper, tungsten, aluminum, gold, or the like. In an embodiment, the conductive pillar 780 may be formed in conjunction with the disposition of the interposer dies 502, 703, and 704 on the RDL 520 as illustrated with reference to FIG. 7B. The conductive pillar 780 may be directly coupled to the RDL 520 without the external connectors 548 therebetween. Similarly, the conductive pillar 780 may be directly coupled to the RDL 542 without the external connectors 708 therebetween.

Figure 7H:
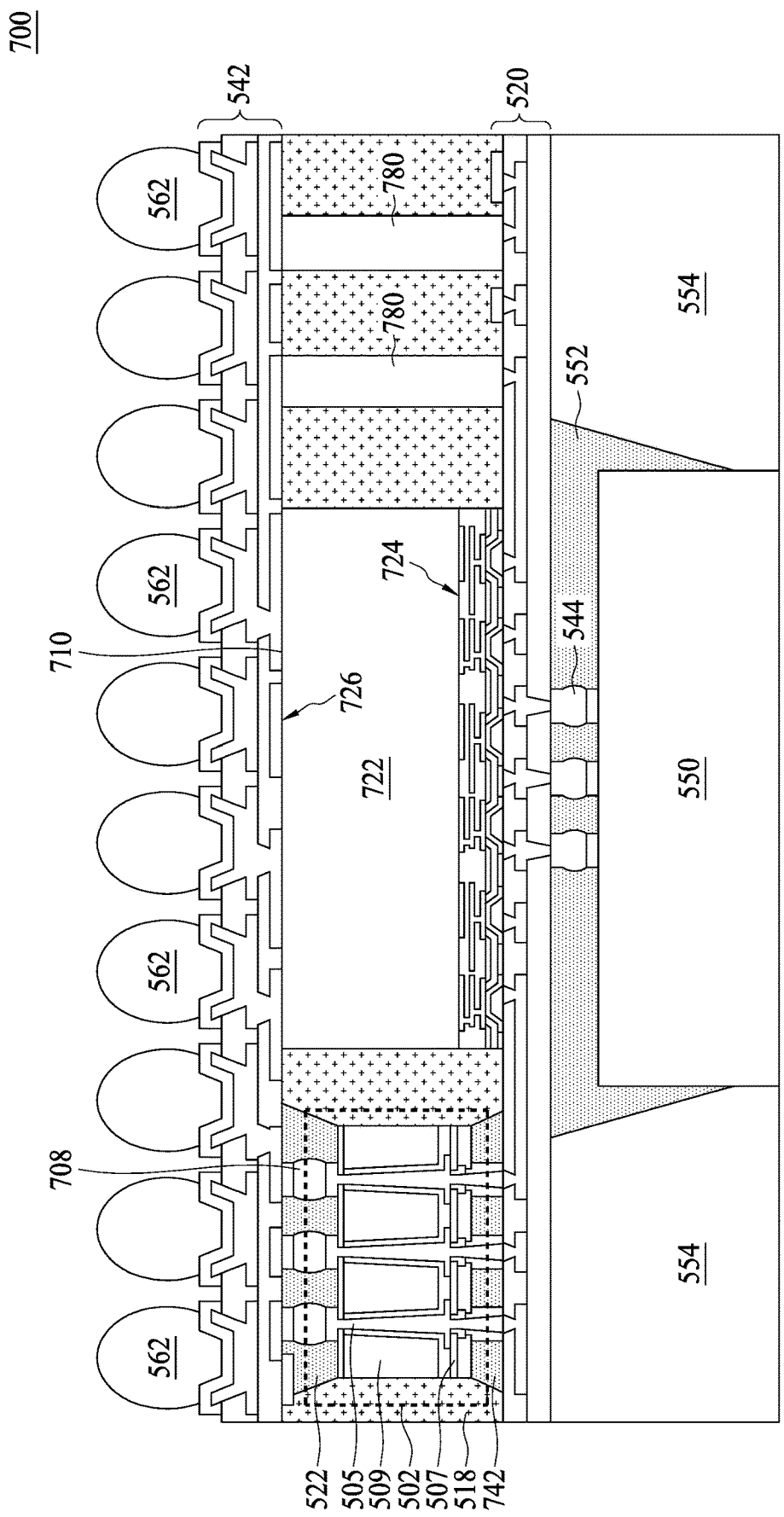
FIG. 7H is a schematic cross-sectional view of a semiconductor package device, in accordance with some embodiments.

FIG. 7H is a schematic cross-sectional view of a semiconductor package device 700, in accordance with some embodiments. Referring to FIG. 7G and FIG. 7H, the interposer die 502 in FIG. 7H has an orientation opposite to that of the interposer die 502 in FIG. 5G. The RDL 507 electrically couples the TSV 505 with the RDL 520. Further, the external connectors 508 which are previously formed between the interposer die 502 and the RDL 520 as shown in FIG. 7A are removed in FIG. 7H such that the interposer die 502 is directly coupled to the RDL 520. Moreover, the embodiment illustrated in FIG. 7H includes an interposer die 710 in place of the interposer die 703. The interposer die 710 may be similar to the interposer die 400C or 400D illustrated and described with reference to FIG. 4G. The interposer die 710 includes a substrate 722 and an RDL 724 over the substrate 722. The material and configurations of the substrate 722 and the RDL 724 may be similar to the substrate 102 and RDL 430 in FIG. 4G, respectively. In some embodiments, the substrate 722 includes a semiconductor material only, such as bulk silicon. The interposer die 710 may be different from the semiconductor die 550 in that the substrate 722 does not include any passive or active electrical components. In an embodiment, the substrate 722 has a top surface 726 contacting the RDL 542. In an embodiment, the RDL 724 provides electrical routing circuits for the semiconductor die 550 through the external connectors 544. In an embodiment, the semiconductor device 700 includes more semiconductor dies disposed adjacent to the semiconductor die 550. Under that situation, the RDL 724 provides additional electrical routing circuits to electrically couple the semiconductor dies (including the semiconductor die 550). In an embodiment, the substrate 722 electrically insulates the RDL 724 from the RDL 542. In an embodiment, the interposer die 710 is electrically coupled to the RDL 520 or 542 through the RDL 724, the interposer die 502, or the conductive pillar 780, rather than through any features in the substrate 722.

In an embodiment, an interconnect layer disposed between the RDL 520 and the RDL 542 and encapsulated by the encapsulating material 518 is comprised of at least one of the interposer die 502, the interposer die 710, and conductive pillar 780. The interposer die 502 may be different from the interposer die 710 in that the substrate 722 of the interposer die 710 does not include TSVs. In an embodiment, one of the interposer 710, the interposer die 502 and the conductive pillar 780 is absent from the interconnect layer between the RDL 520 and the RDL 542.

Figure 8A:
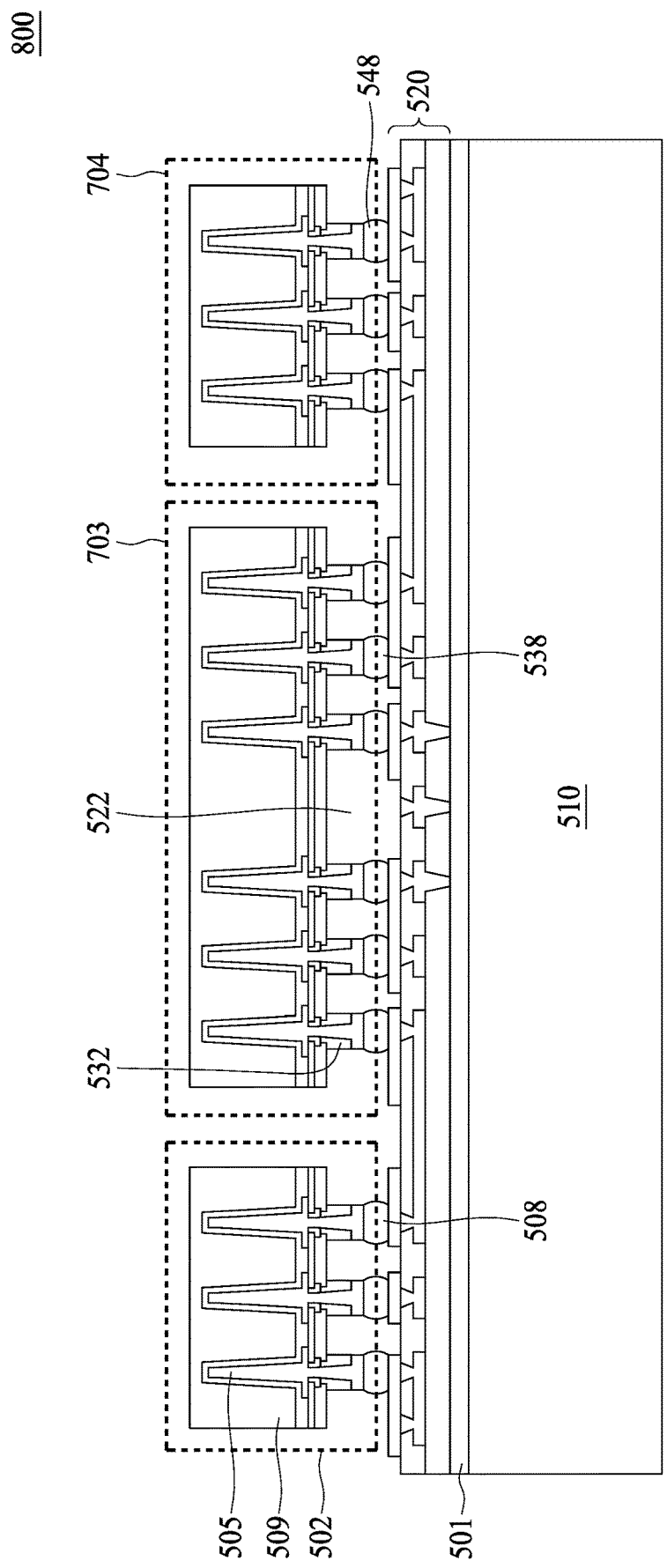
FIGS. 8A through 8F are cross-sectional views of intermediate structures for a method of manufacturing a semiconductor package device, in accordance with some embodiments.

FIGS. 8A through 8F are cross-sectional views of intermediate structures for a method of manufacturing a semiconductor package device 800, in accordance with some embodiments. Referring to FIG. 8A, the forming operations of the adhesive layer 501, the RDL 520 and the interposer dies 502, 703 and 704 over the carrier 510 are similar to the operations with reference to FIG. 7A. In the present embodiment, the interposer dies 502, 703 and 704 are bonded with the RDL 520 through respective external connectors 508, 538 and 548. In contrast to the structure in FIG. 7A, the caps 532 of the interposer dies 502, 703 and 704 face towards the RDL 520. In other words, a bottom surface of each of the TSVs 505 (similar to the bottom surface 104B in FIG. 3C) is facing away from the RDL 520.

Figure 8B:
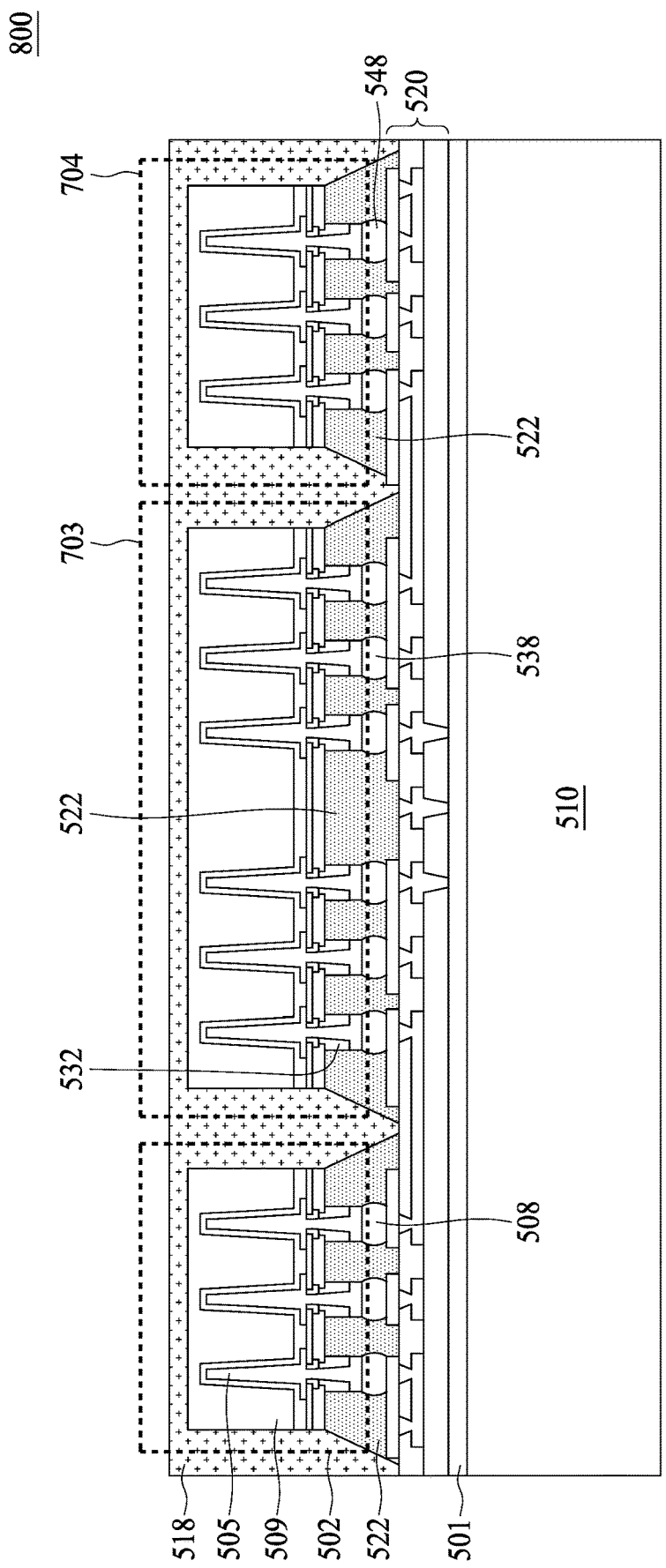
Figure 8C:
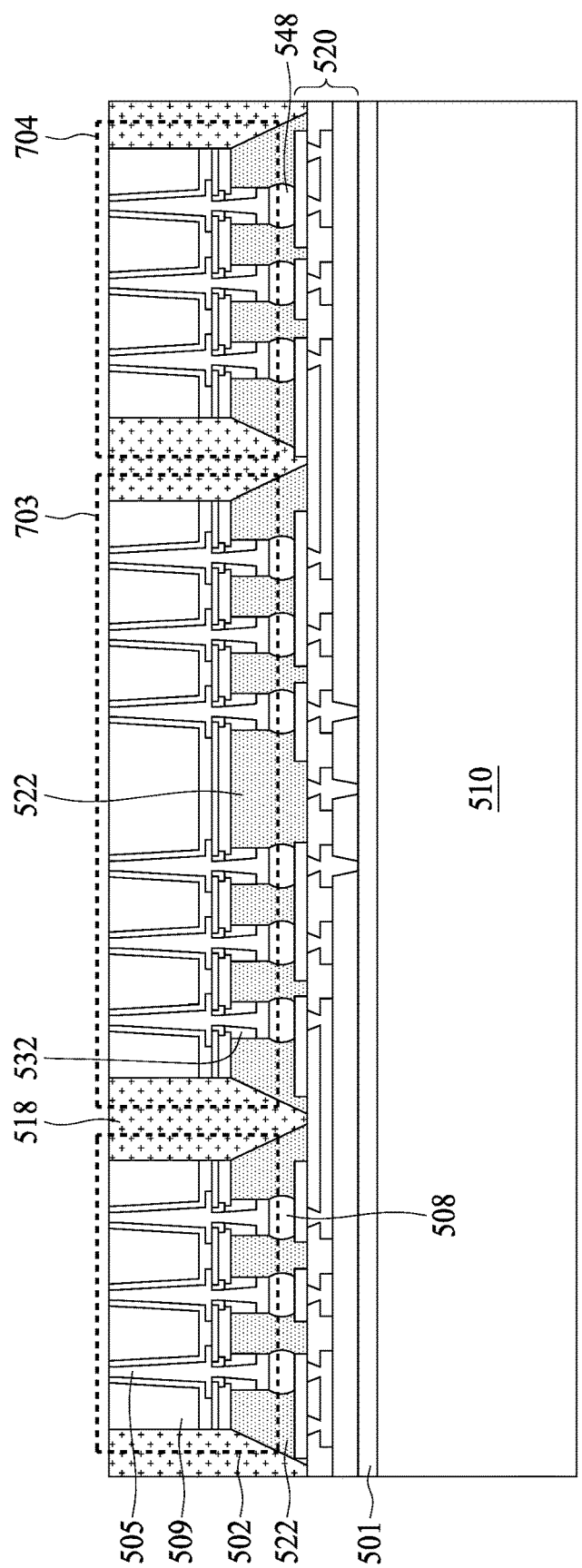

Referring to FIG. 8B, the encapsulating materials 542 and 518 encapsulate the semiconductor device 700 in a fashion similar to that illustrated with reference to FIG. 5C. Next, in FIG. 8C, a thinning operation is performed to reduce the thicknesses of the interposer dies 502, 703 and 704. Such thinning operation is similar to the operation with reference to FIG. 5D. In some embodiments, a depth of the substrate 509 is removed from the interposer dies 502, 703 and 704. In some embodiments, a bottom surface of each of the TSVs 505 is exposed. In some embodiments, the resultant thickness of the interposer die 502, 703 or 704 (or equivalently the height of the TSV 505) is carefully controlled according to different application needs. The thinning operation may be performed by grinding, CMP or other suitable methods.

Figure 8D:
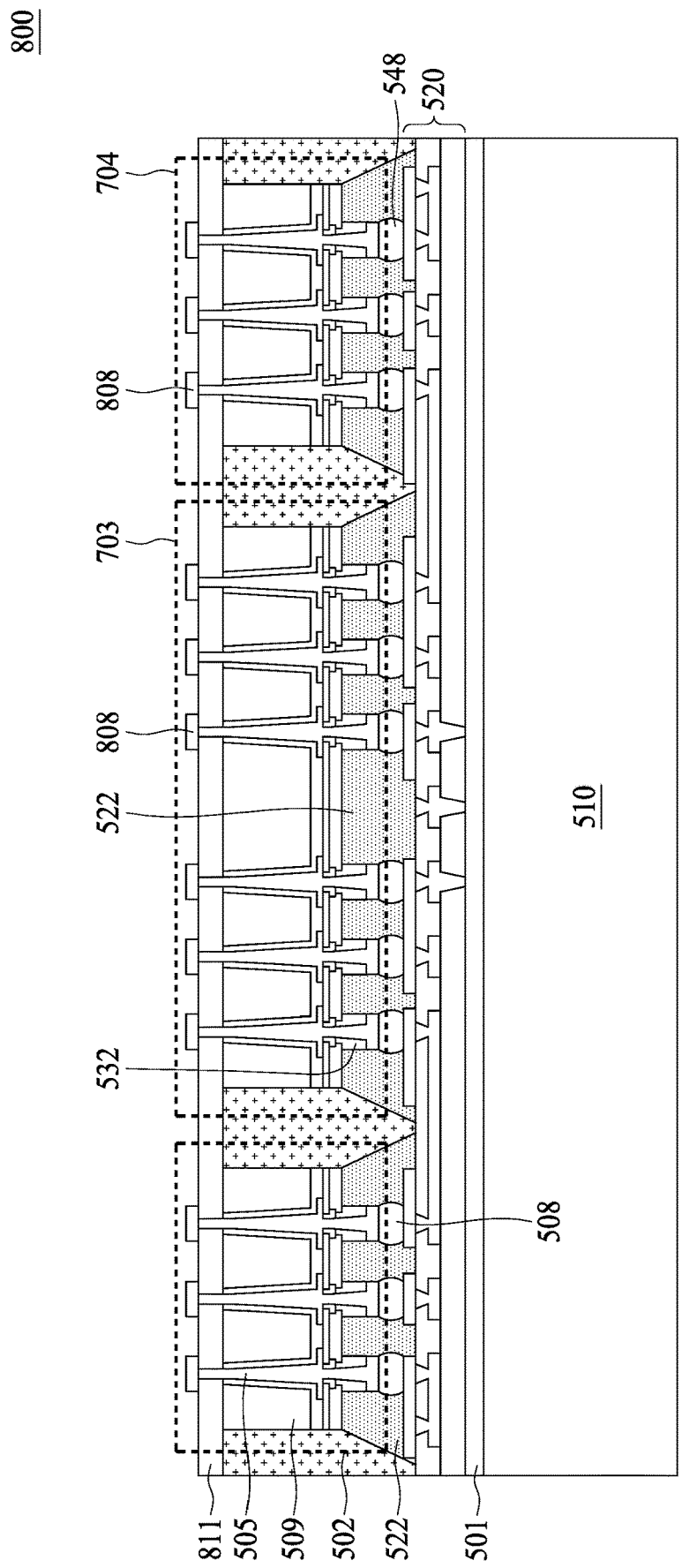

FIG. 8D shows a forming of a protection layer 811 and bond pads 808 over the thinned interposer die 502, 703 or 704. The materials, structures and manufacturing methods for the protection layer 811 and the bond pads 808 are similar to those of the protection layer 536 and RDL 542 illustrated with reference to FIGS. 5E through 5G.

Figure 8E:
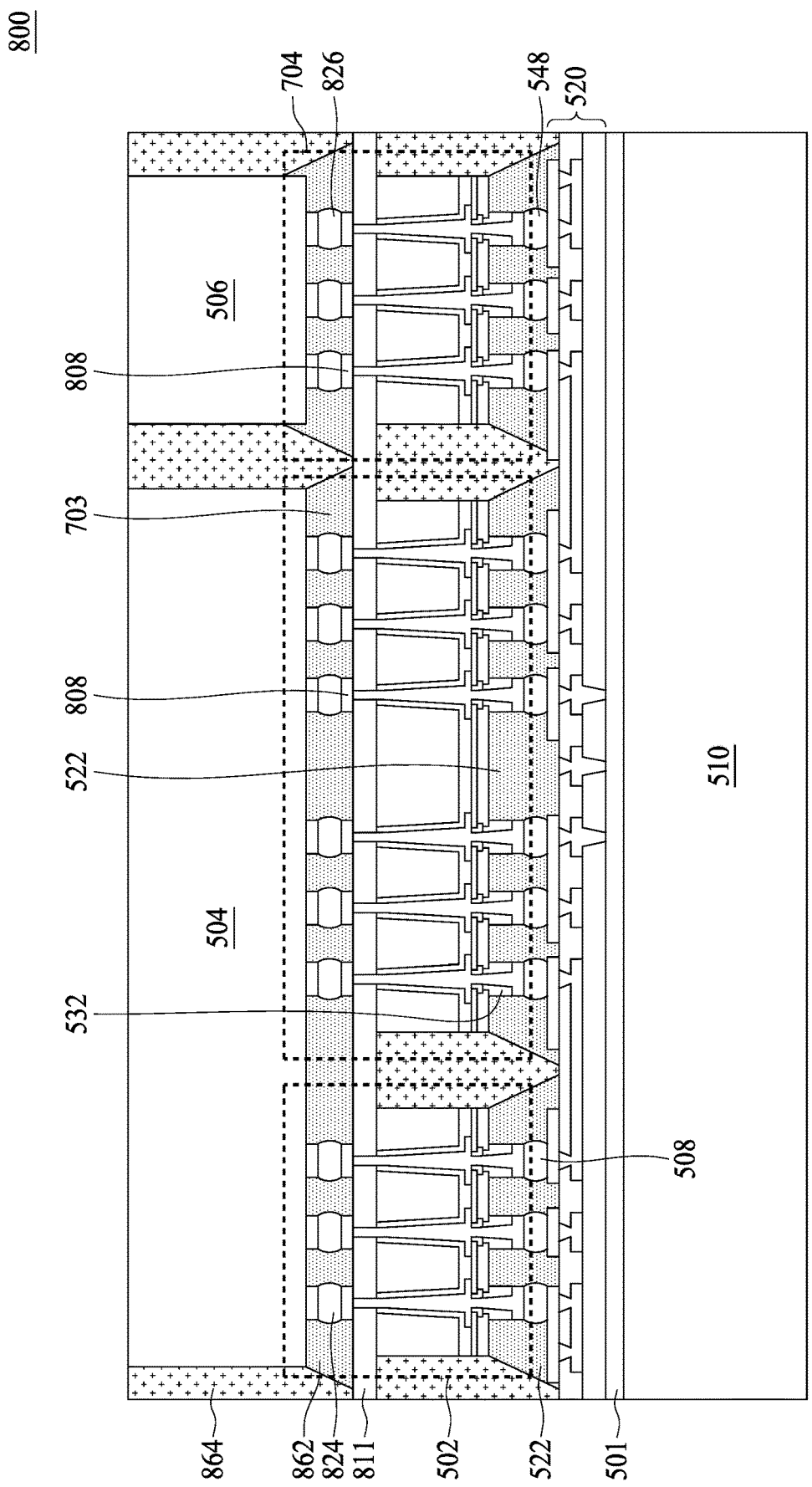
Figure 8F:
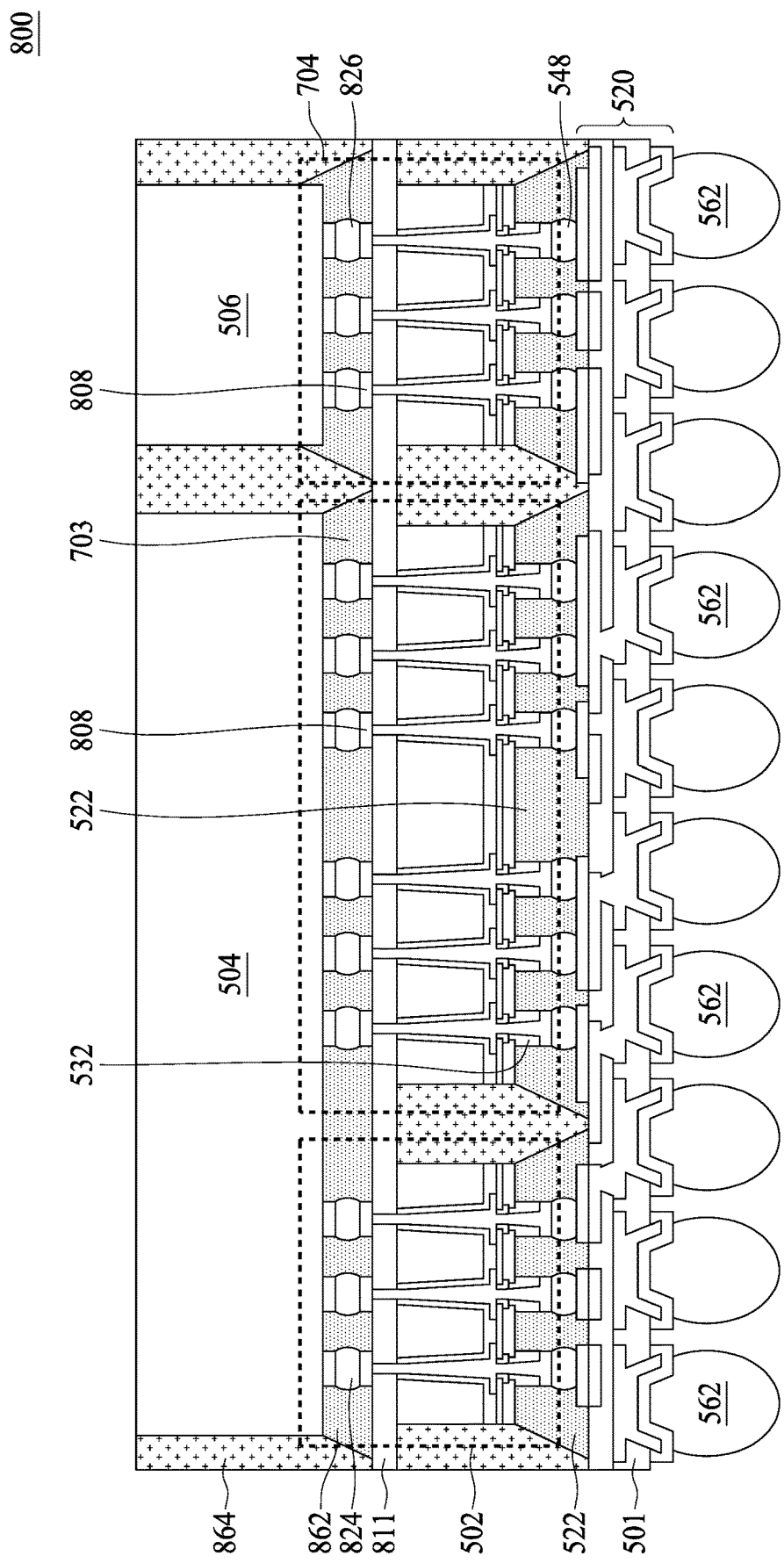

Referring to FIG. 8E, semiconductor dies 502 and 504 are bonded and electrically coupled to the respective interposer dies 502, 703 and 704 through external connectors 824 or 826. The external connectors 824 or 826 are similar to the external connectors 126 or 326 previously discussed. Encapsulating materials 862 and 864 encapsulate the semiconductor dies 5802 and 504, the external connectors 824 and 826, and the protection layer 811. Further, the carrier 510 and the adhesive layer 501 are stripped. External connectors 562 are electrically coupled to the RDL 520, as shown in FIG. 8F. In the present embodiment, the external connectors 824 and 826 are used in place of one of the RDLs 520 and 542 in FIG. 7F. The alternative selection of the external connectors or the RDL in establishing electrical connection structures allows for more design flexibility in addressing different application needs. The structures and manufacturing operations in FIGS. 8E and 8F are performed in a manner similar to those illustrated with reference to FIGS. 5H through 5K.

Figure 9A:
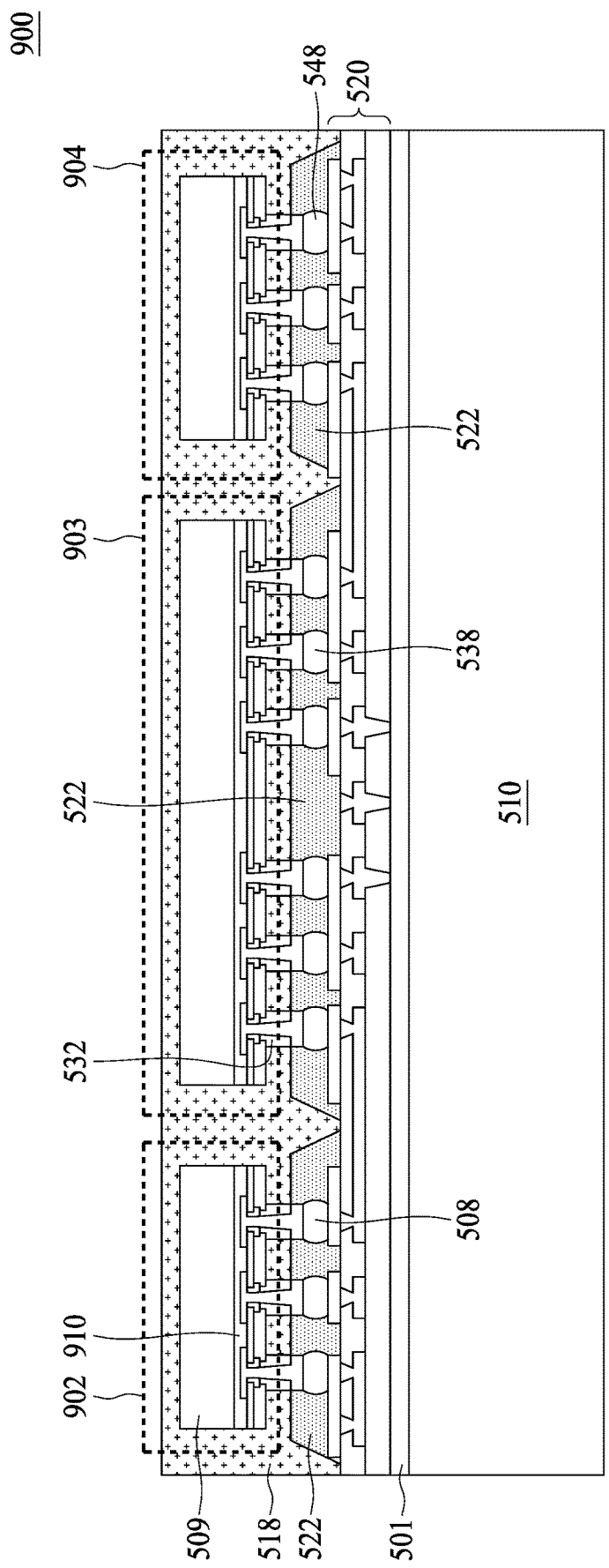
FIGS. 9A through 9C are cross-sectional views of intermediate structures for a method of manufacturing a semiconductor package device, in accordance with some embodiments.
Figure 9B:
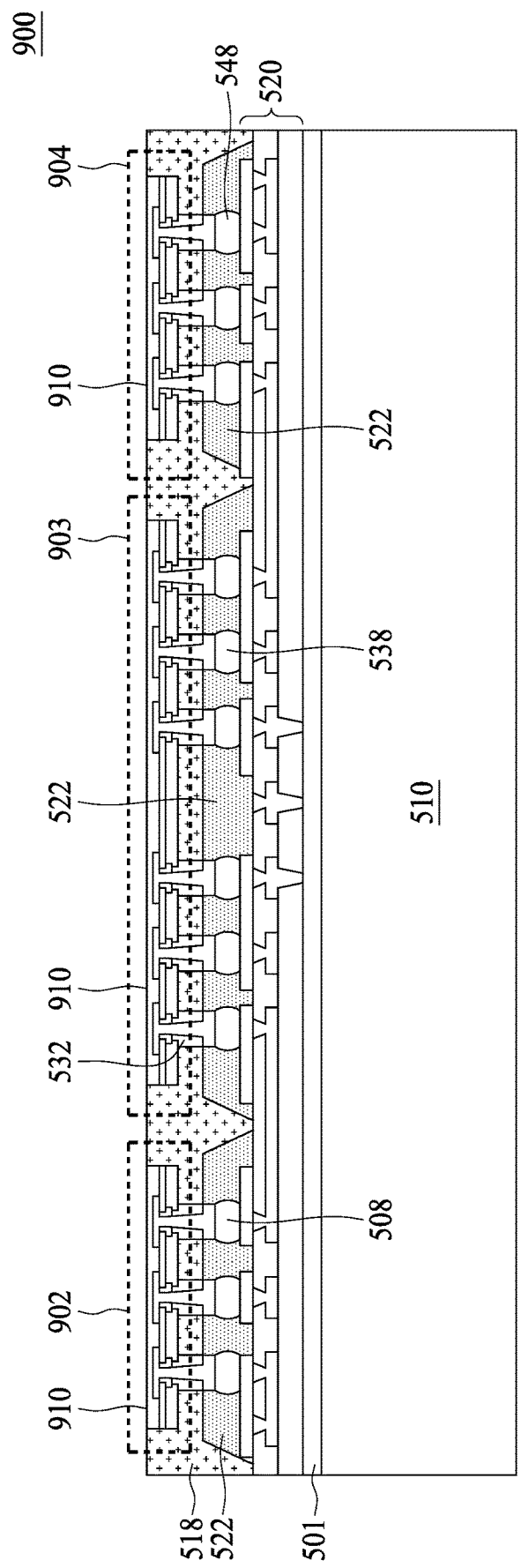
Figure 9C:
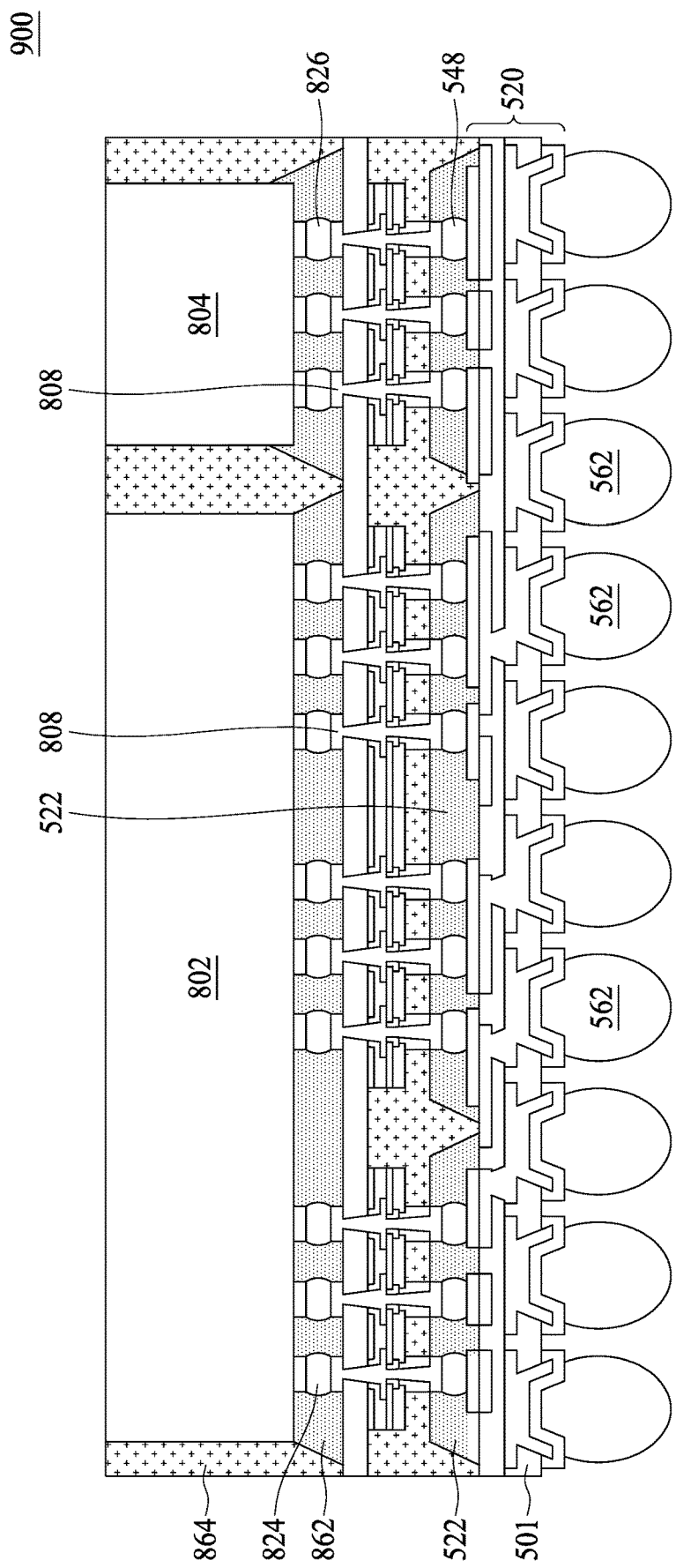

FIGS. 9A through 9C are cross-sectional views of intermediate structures for a method of manufacturing a semiconductor package device 900, in accordance with some embodiments. As compared to the semiconductor package device 800, the semiconductor package device 900 includes interposer dies 902, 903 and 904 in place of the interposer dies 502, 703 and 704, respectively, as illustrated in FIG. 9A. In some embodiments, the interposer dies 902, 903 and 904 may be either of the interposer dies 400C or 400D (shown in FIG. 4G) where the TSVs 505 in FIG. 8A are absent from the substrate 509 in FIG. 9A. An RDL 910 in each of the interposer dies 902, 903 and 904 is electrically coupled to the external connectors 508, 538 and 548, respectively, through conductive vias through the caps 532.

In FIG. 9B, a thickness of the substrate 509 of the interposer dies 902, 903 and 904 is removed or thinned by a thinning operation. In some embodiments, an entirety of the substrate 509 is removed. The RDL 910 left in the thinning operation accounts for a relatively small thickness in the resultant semiconductor package device 900. As a result, the overall device thickness and size can be reduced significantly. Next, as shown in FIG. 9C, a forming of the semiconductor dies 802 and 804, the encapsulating materials 862 and 864, and the external connectors 562 are performed by methods similar to the operations as illustrated with reference to FIGS. 8E and 8F.

Figure 10:
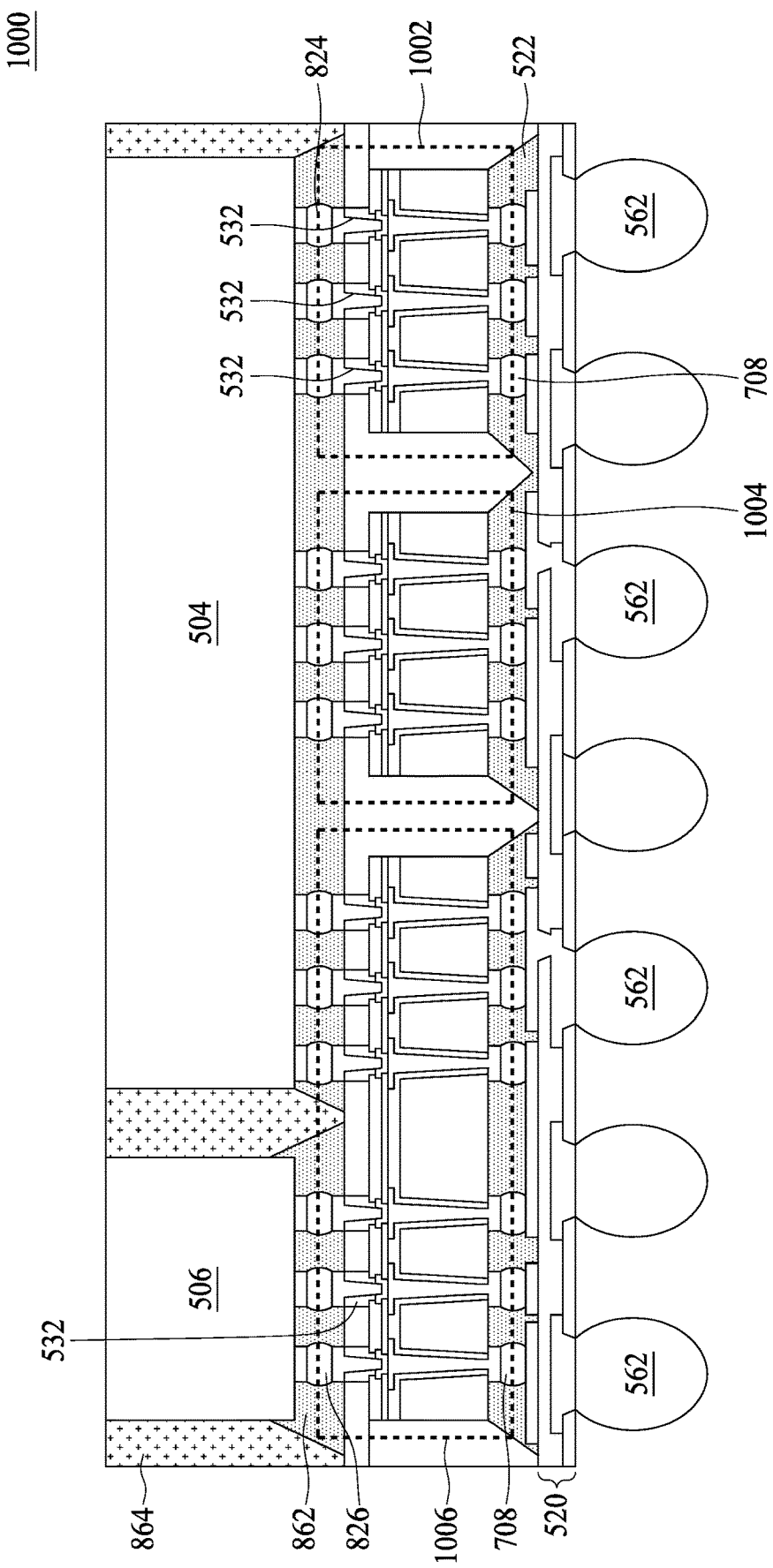
FIG. 10 is a schematic cross-sectional view of a semiconductor package device, in accordance with some embodiments.

FIG. 10 is a schematic view of a semiconductor package device 1000, in accordance with some embodiments. The semiconductor package device 1000 is similar to the semiconductor package device 800 in many aspects. In addition, comparing FIG. 10 with FIG. 8, the semiconductor package device 1000 includes interposer dies 1002, 1004 and 1006 electrically bonded to the semiconductor dies 504 and 506 through the external connectors 824 and 826. Specifically, each of the interposer dies 1002, 1004 and 1006 includes the caps 532 on a side facing the semiconductor dies 504 or 506. Except for the reverse arrangement of interposer die orientation as mentioned above, the manufacturing operations and materials of the semiconductor package device 1000 are similar to those of the semiconductor package device 800.

Figure 11:
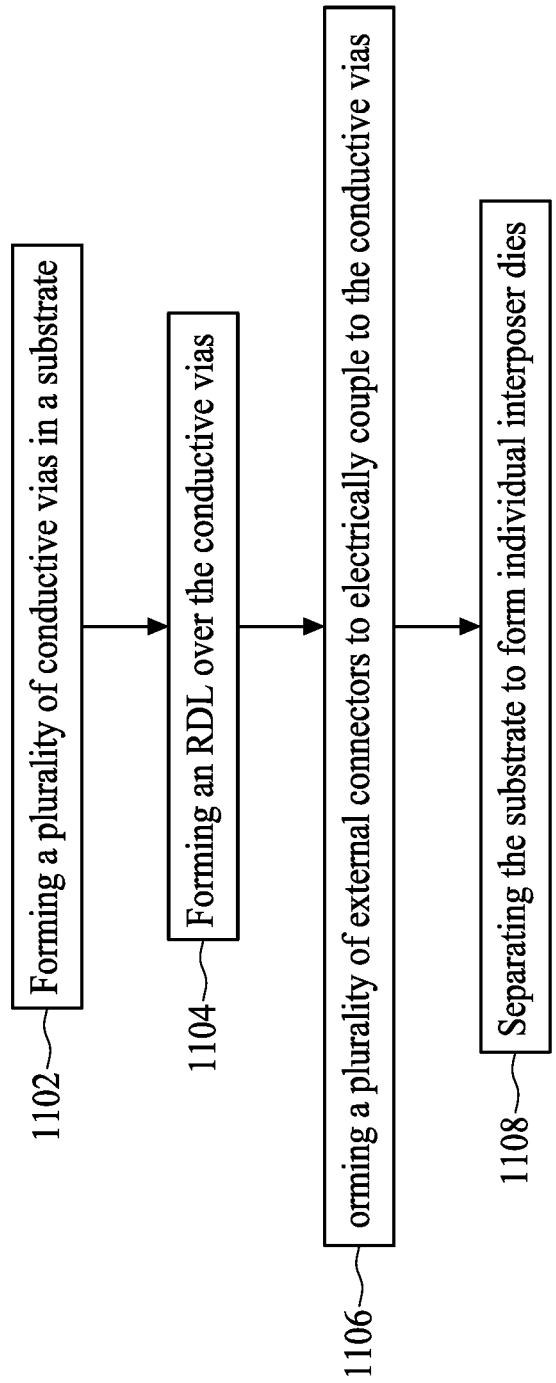
FIG. 11 is a schematic flow diagram of manufacturing an interposer die in accordance with some embodiments.

FIG. 11 is a schematic flow diagram 1100 of manufacturing an interposer die in accordance with some embodiments. In step 1102, a plurality of conductive vias are formed in a substrate. In step 1104, an RDL is formed over the conductive vias. In step 1106, a plurality of external connectors are formed to electrically couple to the conductive vias respectively. In step 1108, the substrate is separated to form individual interposer dies.

FIG. 12 is a schematic flow diagram 1200 of manufacturing a semiconductor package device, in accordance with some embodiments. In step 1202, an interposer die is formed using a first substrate. The interposer die includes a plurality of conductive vias in the first substrate. In step 1204, a first RDL is formed over a second substrate. In step 1206, a bonding operation is performed to bond a first semiconductor die and the interposer die to the first RDL. In step 1208, the second substrate, the first RDL, the first semiconductor die and the interposer die are encapsulated. In step 1210, a second RDL is formed over the first semiconductor die and the interposer die on a side opposite to the first RDL. In step 1212, a second semiconductor die is bonded with the first RDL. In step 1214, the second semiconductor die are encapsulated. In step 1216, external connectors are formed to electrically couple to the first semiconductor die and the interposer die through the second RDL.

The proposed scheme has several advantages. The pitch of the TSVs in the interposer structure is reduced, which is suitable for applications of high input/output (I/O) density. The TSV structure can be disposed with more flexibility and may not be required to be located on the surface of active SOC dies. A better SOC yield may be obtained and the resulting SOC area penalty is reduced. The proposed infrastructure is compatible with wide-I/O memory, high bandwidth memory (HBM), hybrid memory cube (HMC) and the like. The proposed TSV interposer structure is compatible with passive devices.

According an embodiment of the present disclosure, a semiconductor package device includes an interposer die having a semiconductor substrate and a plurality of through-silicon-vias (TSVs) extending through the semiconductor substrate. The semiconductor package device also includes a first semiconductor die spaced apart from the interposer die, a first redistribution layer disposed on a first side of the interposer die and electrically coupling the interposer die with the first semiconductor die, and a second redistribution layer on a second side of the interposer die opposite the first side. Each of the plurality of TSVs includes a sidewall tapering from a first end near the second redistribution layer to a second end near the first redistribution layer.

According an embodiment of the present disclosure, a semiconductor package device includes an interposer die that includes a substrate, a plurality of through silicon vias (TSVs) laterally surrounded by the substrate, and a first redistribution layer electrically coupled to the TSVs. The semiconductor package device also includes a second redistribution layer disposed over the interposer die, a plurality of conductive vias corresponding to the TSVs and electrically coupling the first redistribution layer to the second redistribution layer, a first semiconductor die spaced apart from and electrically coupled to the interposer die, and a plurality of caps disposed over the interposer die and laterally surrounding the respective conductive vias.

According an embodiment of the present disclosure, a semiconductor package device includes a first semiconductor die, a first redistribution layer over the first semiconductor die, and an interposer die over the first semiconductor die. The interposer die includes a substrate, a second redistribution layer over the substrate, and through-silicon-vias (TSVs) electrically coupled to the second redistribution layer. The semiconductor package device also includes a second semiconductor die over the first redistribution layer and spaced apart from the interposer die, a molding material laterally surrounding the interposer die and the second semiconductor die, a third redistribution layer on a side of the interposer die opposite to the first redistribution layer, a first connector electrically coupling the first semiconductor die to the interposer die, a second connector electrically coupling the third redistribution layer to the interposer die, and an encapsulating material laterally surrounding the first connector and the second connector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package device, comprising:
   an interposer die, comprising:
      a semiconductor substrate; and
      a plurality of through-silicon-vias (TSVs) extending through the semiconductor substrate;
   a first semiconductor die spaced apart from the interposer die;
   a first redistribution layer disposed on a first side of the interposer die and electrically coupling the interposer die with the first semiconductor die; and
   a second redistribution layer on a second side of the interposer die opposite the first side,
   wherein each of the plurality of TSVs comprises a sidewall tapering from a first end near the second redistribution layer to a second end near the first redistribution layer,
   wherein the interposer die further comprises a third redistribution layer electrically coupling the TSVs to the second redistribution layer.

2. The semiconductor package device of claim 1, further comprising a molding material surrounding the interposer die, wherein each of the TSVs is electrically coupled to the second redistribution layer through conductive vias, the conductive vias being laterally surrounded by the molding material.

3. The semiconductor package device of claim 2, wherein the third redistribution layer electrically couples the TSVs to the second redistribution layer through the conductive vias.

4. The semiconductor package device of claim 2, further comprising a dielectric layer surrounding the conductive vias, the dielectric layer being laterally surrounded by the molding material.

5. The semiconductor package device of claim 2, wherein the molding material separates the interposer die and the first semiconductor die.

6. The semiconductor package device of claim 1, further comprising a second semiconductor die on a side of the first redistribution layer opposite to the first semiconductor die and electrically coupled to the first semiconductor die through the first redistribution layer.

7. The semiconductor package device of claim 1, further comprising external connectors, wherein each of the plurality of TSVs is electrically coupled to the first redistribution layer through the external connectors.

8. The semiconductor package device of claim 1, further comprising a liner between the plurality of TSVs and the semiconductor substrate.

9. A semiconductor package device, comprising:
   an interposer die, comprising:
      a substrate;
      a plurality of through silicon vias (TSVs) laterally surrounded by the substrate; and
      a first redistribution layer electrically coupled to the TSVs;
   a second redistribution layer disposed over the interposer die;
   a plurality of conductive vias corresponding to the TSVs and electrically coupling the first redistribution layer to the second redistribution layer;
   a first semiconductor die spaced apart from and electrically coupled to the interposer die; and
   a plurality of caps disposed over the interposer die and laterally surrounding the respective conductive vias,
   wherein each of the caps comprises an upper surface level with an upper surface of the first semiconductor die.

10. The semiconductor package device of claim 9, further comprising first external connectors on a side of the second redistribution layer opposite to the interposer die.

11. The semiconductor package device of claim 10, further comprising an integrated passive device on a same side of the first external connectors.

12. The semiconductor package device of claim 9, further comprising a third redistribution layer on a side of the interposer die opposite to the second redistribution layer and electrically coupling the interposer die to a second semiconductor die.

13. The semiconductor package device of claim 12, further comprising a molding material encapsulating the interposer die, the caps and the first semiconductor die.

14. The semiconductor package device of claim 13, further comprising a molded underfill material disposed between the third redistribution layer and the interposer die, the molded underfill material comprising a sidewall meeting a sidewall of the interposer die.

15. The semiconductor package device of claim 14, wherein the sidewall of the molded underfill material tapers from a first end near the third redistribution layer to a second end near the interposer die.

16. The semiconductor package device of claim 14, further comprising second external connectors between the third redistribution layer and the interposer die, wherein the molded underfill material encapsulates the second external connectors and is encapsulated by the molding material.

17. The semiconductor package device of claim 9, further comprising a protection layer between the second redistribution layer and the interposer die, the conductive vias electrically coupled to the second redistribution layer through the protection layer.

18. The semiconductor package device of claim 9, wherein the caps comprise a conductive material.

19. The semiconductor package device of claim 13, wherein each of the caps comprises an upper surface level with an upper surface of the molding material.

20. A semiconductor package device, comprising:
a first semiconductor die;
a first redistribution layer over the first semiconductor die;
an interposer die over the first semiconductor die, the interposer die comprising a substrate, a second redistribution layer over the substrate, and through-silicon-vias (TSVs) electrically coupled to the second redistribution layer;
a second semiconductor die over the first redistribution layer and spaced apart from the interposer die;
a molding material laterally surrounding the interposer die and the second semiconductor die;
a third redistribution layer on a side of the interposer die opposite to the first redistribution layer;
a first connector electrically coupling the first semiconductor die to the interposer die;
a second connector electrically coupling the third redistribution layer to the interposer die; and
an encapsulating material laterally surrounding the first connector and the second connector.

\* \* \* \* \*